US012757459B2

(12) United States Patent
Ryu et al.

(10) Patent No.: US 12,757,459 B2
(45) Date of Patent: Oct. 6, 2026

(54) SEMICONDUCTOR DEVICE AND METHOD OF FABRICATING THE SAME

(71) Applicant: Samsung Electronics Co., Ltd., Suwon-si (KR)

(72) Inventors: Tae Hyun Ryu, Suwon-si (KR); Dong Hoon Hwang, Suwon-si (KR); Myung Il Kang, Suwon-si (KR); Hyo Jin Kim, Suwon-si (KR); Byung Ho Moon, Suwon-si (KR); Nam Hyun Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 341 days.

(21) Appl. No.: 18/411,313

(22) Filed: Jan. 12, 2024

(65) Prior Publication Data

US 2025/0006792 A1 Jan. 2, 2025

(30) Foreign Application Priority Data

Jun. 30, 2023 (KR) ........................ 10-2023-0084900

(51) Int. Cl.
*H10D 62/17* (2025.01)
*H10D 64/23* (2025.01)

(52) U.S. Cl.
CPC ......... *H10D 62/235* (2025.01); *H10D 64/258* (2025.01)

(58) Field of Classification Search
CPC ........................... H10D 62/235; H10D 64/258
See application file for complete search history.

(56) References Cited

U.S. PATENT DOCUMENTS

| | | | | |
|---|---|---|---|---|
| 10,157,799 | B2 * | 12/2018 | Ching | H10D 84/017 |
| 11,329,168 | B2 | 5/2022 | Yang et al. | |
| 11,527,534 | B2 * | 12/2022 | Cheng | H10D 30/6715 |
| 11,532,703 | B2 * | 12/2022 | Su | H10D 62/116 |
| 2021/0376076 | A1 * | 12/2021 | Su | H10D 62/116 |
| 2022/0102346 | A1 | 3/2022 | Lilak et al. | |
| 2022/0102520 | A1 | 3/2022 | Shiliang et al. | |
| 2022/0130957 | A1 * | 4/2022 | Kim | H10D 64/513 |
| 2022/0238717 | A1 | 7/2022 | Ju et al. | |
| 2022/0254650 | A1 * | 8/2022 | Choi | H10D 30/6735 |

(Continued)

*Primary Examiner* — Steven M Page

(74) *Attorney, Agent, or Firm* — Wolf, Greenfield & Sacks, P.C.

(57) ABSTRACT

A semiconductor device includes a first and second channel separation structures extending in a first direction and spaced apart from each other in a second direction, first gate structures spaced apart from each other in the first direction between the first and second channel separation structures and in contact with the first and second channel separation structures, first and second channel patterns including first and second sheet patterns, respectively, spaced apart from each other in a third direction and in contact with the corresponding first and second channel separation structures, first and second source/drain patterns between the first and second channel separation structures, the first source/drain patterns in contact with the first channel patterns and the first channel separation structure, the second source/drain patterns in contact with the second channel patterns and the second channel separation structure, and first gate separation structures between the first and second source/drain patterns.

20 Claims, 83 Drawing Sheets

(56) References Cited

U.S. PATENT DOCUMENTS

| | | | |
|---|---|---|---|
| 2022/0359514 A1 | 11/2022 | Huang et al. | |
| 2022/0367617 A1 | 11/2022 | Cheng et al. | |
| 2023/0019860 A1* | 1/2023 | Ko | H10D 30/43 |

* cited by examiner

SEMICONDUCTOR DEVICE AND METHOD OF FABRICATING THE SAME

CROSS-REFERENCE TO RELATED APPLICATION(S)

This application claims priority from Korean Patent Application No. 10-2023-0084900 filed on Jun. 30, 2023 in the Korean Intellectual Property Office, and all the benefits accruing therefrom under 35 U.S.C. § 119, the contents of which in its entirety are herein incorporated by reference.

BACKGROUND

The present disclosure relates to a semiconductor device and a method of fabricating the same.

As a scaling technique for increasing the density of integrated circuit devices, the concept of a multi-gate transistor has been proposed in which a silicon body in the form of a fin or nanowire is formed on a substrate and a gate is formed on the surface of the silicon body.

The multi-gate transistor takes advantage of its three-dimensional (3D) channel, allowing for easy scaling both up and down. Additionally, the multi-gate transistor offers improved control over the current without the need to increase the gate length. Furthermore, the multi-gate transistor effectively mitigates the short channel effect (SCE), which is the phenomenon where the electric potential of a channel region is affected by the drain voltage.

Meanwhile, with the decrease in the pitch size of semiconductor devices, there is a need for research on methods to reduce capacitance between contacts and secure electrical stability.

SUMMARY

Aspects of the present disclosure provide a semiconductor device capable of improving device performance and device integration.

Aspects of the present disclosure also provide a method of fabricating a semiconductor device capable of improving device performance and device integration.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a first channel separation structure extending in a first direction, a second channel separation structure spaced apart from the first channel separation structure in a second direction and extending in the first direction, a plurality of first gate structures spaced apart from each other in the first direction between the first and second channel separation structures, the first gate structures being in contact with the first and second channel separation structures and including first gate electrodes and first gate insulating films, first channel patterns including a plurality of first sheet patterns, which are spaced apart from each other in a third direction and are in contact with the first channel separation structure, second channels pattern including a plurality of second sheet patterns, which are spaced apart from each other in the third direction and are in contact with the second channel separation structure, first source/drain patterns between the first and second channel separation structures and in contact with the first channel patterns and the first channel separation structure, second source/drain patterns between the first and second channel separation structures and in contact with the second channel patterns and the second channel separation structure and first gate separation structures between the first source/drain patterns and the second source/drain patterns.

According to another aspect of the present disclosure, there is provided a semiconductor device comprising a first channel separation structure extending in a first direction, a second channel separation structure spaced apart from the first channel separation structure in a second direction and extending in the first direction, a plurality of first gate structures spaced apart from each other in the first direction between the first and second channel separation structures, the first gate structures being in contact with the first and second channel separation structures and including first gate electrodes and first gate insulating films, gate capping patterns on the gate electrodes and in contact with the first and second channel separation structures, gate spacers on sidewalls of the first gate structures, first channel patterns including a plurality of first sheet patterns, which are spaced apart from each other in a third direction and are in contact with the first channel separation structure, second channels pattern including a plurality of second sheet patterns, which are spaced apart from each other in the third direction and are in contact with the second channel separation structure, first source/drain patterns between the first and second channel separation structures and in contact with the first channel patterns, second source/drain patterns between the first and second channel separation structures and in contact with the second channel patterns and first gate separation structures between the first source/drain patterns and the second source/drain patterns, wherein an upper surface of the first channel separation structure is on the same plane as (i.e., coplanar with) an upper surface of the first gate separation structures, and an upper surface of the first channel separation structure is on the same plane as (i.e., coplanar with) an upper surface of the gate capping patterns.

According to still another aspect of the present disclosure, there is provided a semiconductor device comprising a first lower pattern extending in a first direction, a second lower pattern extending in the first direction and spaced apart from the first lower pattern in a second direction, a field insulating film between the first and second lower patterns, a first channel separation structure on the first lower pattern and extending in the first direction, part of the first channel separation structure being in the first lower pattern, a second channel separation structure on the second lower pattern and extending in the first direction, part of the second channel separation structure being in the second lower pattern, a plurality of gate structures spaced apart from each other in the first direction between the first and second channel separation structures and in contact with the first and second channel separation structures, the gate structures including gate electrodes and gate insulating films, first channel patterns between the first channel separation structure and the gate structures and including a plurality of first sheet patterns, which are spaced apart from each other in a third direction and are in contact with the first channel separation structure, second channel patterns between the second channel separation structure and the gate structures and including a plurality of second sheet patterns, which are spaced apart from each other in the third direction and are in contact with the second channel separation structure, first source/drain patterns between the first and second channel separation structures and in contact with the first channel patterns, second source/drain patterns between the first and second channel separation structures and in contact with the second channel patterns and gate separation structures between the first source/drain patterns and the second source/drain patterns that face the first source/drain patterns in the second direction, the gate separation structures being in contact with the field insulating film.

According to still another aspect of the present disclosure, there is provided a method of fabricating a semiconductor device comprising forming first and second mold fin-type patterns, which extend in a first direction and are spaced apart from each other in a second direction, the first mold fin-type pattern including a first lower pattern and a first pre-pattern structure, the second mold fin-type pattern including a second lower pattern and a second pre-pattern structure, and each of the first and second pre-pattern structures including pre-active patterns and pre-sacrificial patterns that are alternately stacked with the pre-active patterns, forming a dummy gate electrode on the first and second mold fin-type patterns, the dummy gate electrode including extension portions, which extend in the second direction, and a connection portion, which extends in the first direction, the extension portions of the dummy gate electrode intersecting the first and second mold fin-type patterns, and the connection portion of the dummy gate electrode connecting the extension portions of the dummy gate electrode between the first and second mold fin-type patterns, forming first and second pre-source/drain recesses in the first and second mold fin-type patterns, respectively, using the dummy gate electrode as a mask, forming first upper pattern structures on the first lower pattern by forming a first channel separation structure, which extends in the first direction, in the first pre-pattern structure, the first channel separation structure dividing the first pre-source/drain recess into two first source/drain recesses, forming second upper pattern structures on the second lower pattern by forming a second channel separation structure, which extends in the first direction, in the second pre-pattern structure, the second channel separation structure dividing the second pre-source/drain recess into two second source/drain recesses and each of the first upper pattern structures and second upper pattern structures including active patterns and sacrificial patterns that are alternately stacked with the active patterns, forming first source/drain patterns, which are in contact with the first upper pattern structures, in the first source/drain recesses, forming second source/drain patterns, which are in contact with the second upper pattern structures, in the second source/drain recesses, forming a gate trench, which exposes the first upper pattern structures and the second upper pattern structures, by removing the dummy gate electrode, the gate trench including gate trench extension portions, which extend in the second direction, and a gate trench connection portion, which connects the gate trench extension portions, forming first sheet patterns, which are in contact with the first source/drain patterns and the first channel separation structure, by removing exposed sacrificial patterns of the first upper pattern structures, forming second sheet patterns, which are in contact with the second source/drain patterns and the second channel separation structure, by removing exposed sacrificial patterns of the second upper pattern structures, forming a pre-gate electrode in the gate trench, the pre-gate electrode including pre-gate electrode extension portions, which intersect the first sheet patterns and the second sheet patterns, and a pre-gate electrode connection portion, which connects the pre-gate electrode extension portions and forming gate electrodes by forming gate separation structures, which separate extension portions of the pre-gate electrode that are adjacent to each other in the first direction.

According to still another aspect of the present disclosure, there is provided a method of fabricating a semiconductor device comprising forming first and second mold fin-type patterns, which extend in a first direction and are spaced apart from each other in a second direction, the first mold fin-type pattern including a first lower pattern and a first pre-pattern structure, the second mold fin-type pattern including a second lower pattern and a second pre-pattern structure, and each of the first and second pre-pattern structures including pre-active patterns and pre-sacrificial patterns that are alternately stacked with the pre-active patterns, forming a plurality of dummy gate electrodes, which intersect the first and second mold fin-type patterns and extend in the second direction, on the first and second mold fin-type patterns, forming gate separation structures, which connect dummy gate electrodes that are adjacent to each other in the first direction, between the first and second mold fin-type patterns, forming first and second pre-source/drain recesses in the first and second mold fin-type patterns, respectively, using the dummy gate electrodes as a mask, forming first upper pattern structures on the first lower pattern by forming a first channel separation structure, which extends in the first direction, in the first pre-pattern structure, the first channel separation structure dividing the first pre-source/drain recess into two first source/drain recesses, forming second upper pattern structures on the second lower pattern by forming a second channel separation structure, which extends in the first direction, in the second pre-pattern structure, the second channel separation structure dividing the second pre-source/drain recess into two second source/drain recesses and each of the first upper pattern structures and second upper pattern structures including active patterns and sacrificial patterns that are alternately stacked with the active patterns, forming first source/drain patterns, which are in contact with the first upper pattern structures, in the first source/drain recesses, forming second source/drain patterns, which are in contact with the second upper pattern structures, in the second source/drain recesses, forming a gate trench, which exposes the first upper pattern structures and the second upper pattern structures, by removing the dummy gate electrodes, forming first sheet patterns, which are in contact with the first source/drain patterns and the first channel separation structure, by removing exposed sacrificial patterns of the first upper pattern structures, forming second sheet patterns, which are in contact with the second source/drain patterns and the second channel separation structure, by removing exposed sacrificial patterns of the second upper pattern structures and forming gate electrodes, which intersect the first sheet patterns and the second sheet patterns, in the gate trench.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, wherein like reference numerals (when used) indicate corresponding elements throughout the several views, and in which.

DETAILED DESCRIPTION

It should be understood that ordinal terms, such as "first," "second," "third," etc., used herein to describe various elements, components, regions, layers, and/or sections are employed for the purpose of distinguishing one element, component, region, layer, or section from another and are not intended to convey a particular order or relation of one element, component, region, layer, or section to another. Therefore, a first element, component, region, layer, or section described below could also be referred to as a second element, component, region, layer, or section, without deviating from the essence and scope of the present disclosure.

Transistors including nanowires or nanosheets are depicted as examples of semiconductor devices according to some embodiments of the present disclosure, but the present disclosure is not limited thereto. The technological principles described herein are also applicable to two-dimensional (2D) material-based field-effect transistors (FETs) and their heterostructures.

Moreover, the semiconductor devices according to some embodiments of the present disclosure may encompass fin-type FETs (FinFETs), tunneling FETs, and three-dimensional (3D) transistors including channel regions featuring fin-shaped patterns. Additionally, the semiconductor devices according to some embodiments of the present disclosure may include other types of transistors, such as bipolar junction transistors, lateral double-diffused metal-oxide semiconductor (LDMOS) transistors, among others.

A semiconductor device according to some embodiments of the present disclosure will hereinafter be described with reference to FIGS. 1 through 12.

Figure 1:
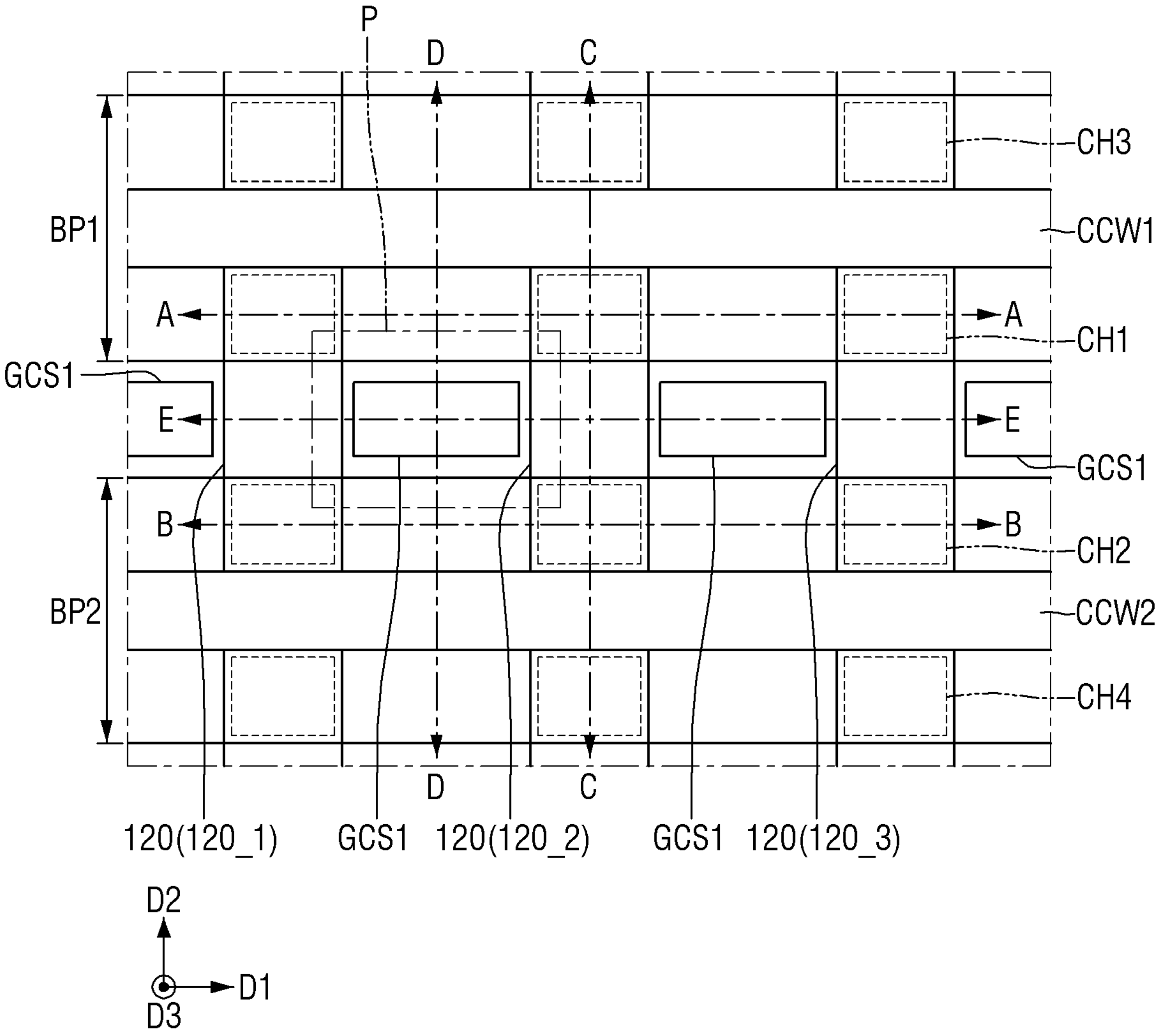
FIG. 1 is a layout (i.e., plan) view of a semiconductor device according to some embodiments of the present disclosure.

FIG. 1 is a layout (i.e., plan) view of a semiconductor device according to some embodiments of the present disclosure. FIGS. 2, 3, 4, 5, and 6 are cross-sectional views taken along lines A-A, B-B, C-C, D-D, and E-E, respectively, of FIG. 1. FIG. 7 is a perspective view conceptually depicting the shape of a first sheet pattern of FIG. 2. FIGS. 8 through 12 are plan views of region P of the semiconductor device shown in FIG. 1.

Figure 5:
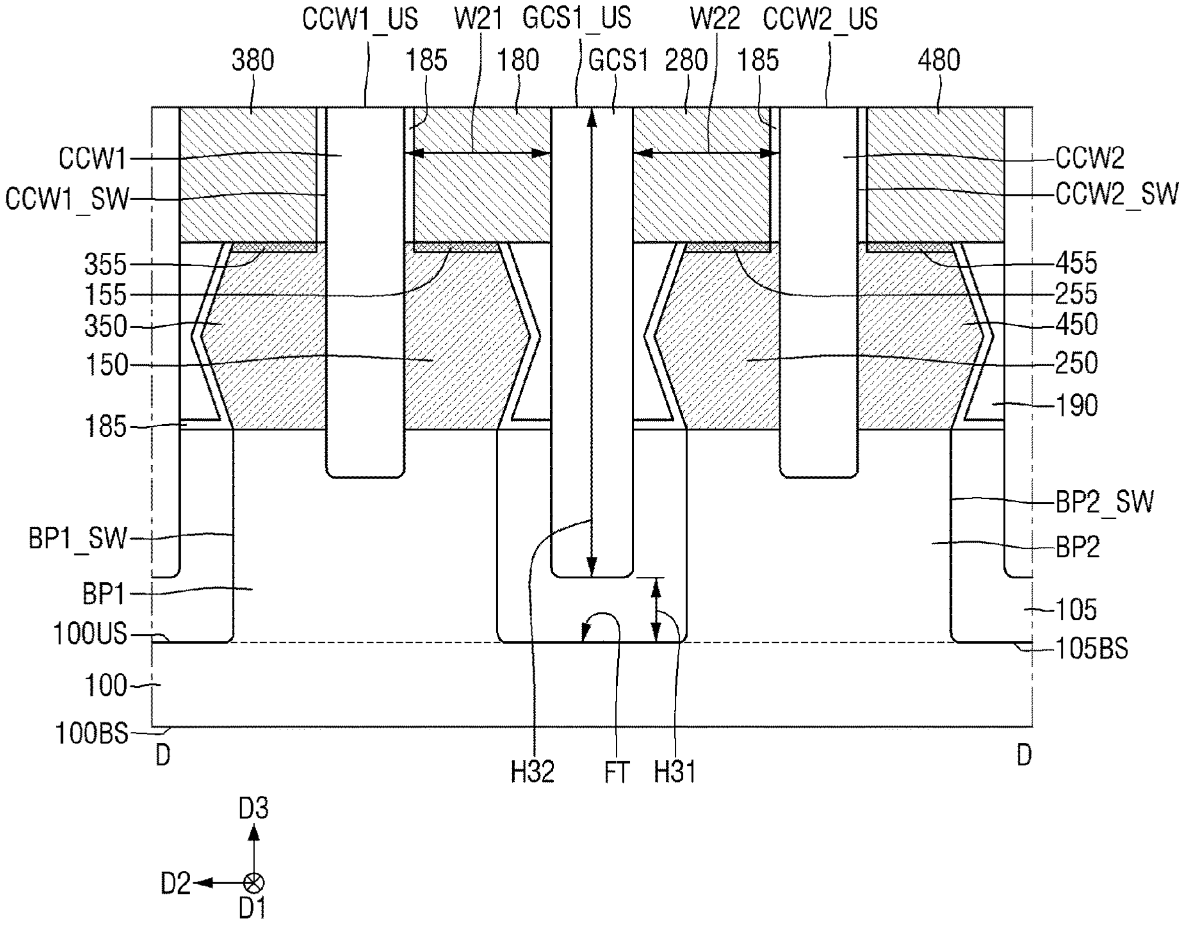

FIG. 1 depicts the semiconductor device according to some embodiments of the present disclosure, with the exception of first source/drain contacts 180 (FIG. 2), second source/drain contacts 280 (FIG. 3), third source/drain contacts 380 (FIG. 5), and fourth source/drain contacts 480 (FIG. 5). FIGS. 8 through 12 may be plan views taken at a level where the first source/drain contacts 180, the second source/drain contacts 280, the third source/drain contacts 380, and the fourth source/drain contacts 480 are located.

Referring to FIGS. 1 through 12, the semiconductor device according to some embodiments of the present disclosure may include a first lower pattern BP1, a second lower pattern BP2, a first channel pattern CH1, a second channel pattern CH2, a third channel pattern CH3, a fourth channel pattern CH4, a first channel separation structure CCW1, a second channel separation structure CCW2, a plurality of first gate electrodes 120, first source/drain patterns 150, second source/drain patterns 250, third source/drain patterns 350, fourth source/drain patterns 450, and first gate separation structures GCS1.

A first substrate 100 may have first (upper) and second (bottom) surfaces 100US and 100BS, respectively, which are opposite to each other in a third direction D3 perpendicular to the upper surface 100US of the substrate 100. The first gate electrodes 120, the first source/drain patterns 150, the second source/drain patterns 250, the third source/drain patterns 350, the fourth source/drain patterns 450, the first channel patterns CH1, the second channel patterns CH2, the third channel patterns CH3, and the fourth channel patterns CH4 may be disposed on the first surface 100US of the first substrate 100, and the first surface 100US of the first substrate 100 may be the upper surface of the first substrate 100. The second surface 100BS of the first substrate 100, which is opposite to the first surface 100US of the first substrate 100, may be the bottom surface of the first substrate 100.

The first substrate 100 may be formed of or include a semiconductor material. The first substrate 100 may be a silicon (Si) substrate) or a silicon-on-insulator (SOI) substrate. Alternatively, the first substrate 100 may include silicon germanium (SiGe), SiGe-on-insulator (SGOI), indium antimonide, lead tellurium compounds, indium arsenic, indium phosphide, gallium arsenic, or gallium antimonide, but the present disclosure is not limited thereto.

The first lower pattern BP1 may protrude (i.e., extend) from the first substrate 100 in the third direction D3. More particularly, the first lower pattern BP1 may extend upwardly (i.e., in the third direction D3) from the first surface 100US of the first substrate 100. The first lower pattern BP1 may extend in a first direction D1 parallel to the upper surface 100US of the substrate 100.

The second lower pattern BP2 may protrude from the first substrate 100 in the third direction D3. More particularly, the second lower pattern BP2 may extend upwardly (in the third direction D3) from the first surface 100US of the first substrate 100. The second lower pattern BP2 may extend in the first direction D1. The second lower pattern BP2 may be spaced apart from the first lower pattern BP1 in a second direction D2 parallel to the upper surface 100US of the substrate and intersecting the first direction D1.

For example, the third direction D3 may correspond to the vertical direction of the first substrate 100. The first and second directions D1 and D2 may correspond to the horizontal direction and are perpendicular to the third direction D3.

The first and second lower patterns BP1 and BP2 may be separated by a fin trench FT, which extends in the first direction D1. For example, the first surface 100US of the first substrate 100 may correspond to the bottom surface of the fin trench FT. The first lower pattern BP1 may have sidewalls BP1_SW, which extend in the first direction D1, and the second lower pattern BP2 may have sidewalls BP2_SW, which extend in the first direction D1. The sidewalls BP1_SW of the first lower pattern BP1 and the sidewalls BP2_SW of the second lower pattern BP2 may be defined by the fin trench FT.

For example, the first lower pattern BP1 may be positioned in a p-type metal-oxide semiconductor (PMOS) region, and the second lower pattern BP2 may be positioned in an n-type metal-oxide semiconductor (NMOS) region.

Each of the first and second lower patterns BP1 and BP2 may be formed by partially etching the first substrate 100 or may include an epitaxial layer grown from the first substrate 100. The first and second lower patterns BP1 and BP2 may include an element semiconductor material, such as Si or germanium (Ge). The first and second lower patterns BP1 and BP2 may also include a compound semiconductor, such as a group IV-IV compound semiconductor or a group III-V compound semiconductor.

The group IV-IV compound semiconductor may be a binary or ternary compound containing at least two of carbon (C), Si, Ge, and tin (Sn), or a compound formed by doping the binary or ternary compound with a group IV element.

The group III-V compound semiconductor may be a binary, ternary, or quaternary compound formed by combining at least one group III element, such as aluminum Al, gallium (Ga), and indium (In), with a group V element, such as phosphorus (P), arsenic (As), or antimony (Sb).

A field insulating film 105 may be disposed on the first substrate 100. For example, the field insulating film 105 may be disposed on the first surface 100US of the first substrate 100. The field insulating film 105 may at least partially fill the fin trench FT, which separates the first and second lower patterns BP1 and BP2. The term "fill" (or "filling," "filled," or like terms), as may be used herein, is intended to refer broadly to either completely filling a defined space (e.g., fin trench FT) or partially filling the defined space; that is, the defined space need not be entirely filled but may, for example, be partially filled or have voids or other spaces throughout. The field insulating film 105 is not disposed on an upper surface BP1_US of the first lower pattern BP1 and an upper surface BP2_US of the second lower pattern BP2.

The field insulating film 105 may have an upper surface 105US and a bottom surface 105BS, which are opposite to each other in the third direction D3. The bottom surface 105BS of the field insulating film 105 may face the first substrate 100.

For example, the field insulating film 105 may generally cover the sidewalls BP1_SW of the first lower pattern BP1 and the sidewalls BP2_SW of the second lower pattern BP2. The term "cover" (or "covering, or other like terms), as may be used herein, is intended to broadly refer to a material, layer or structure being on or over another material, layer or structure, but does not require the material, layer or structure to entirely cover the other material, layer or structure. Thus, for example, a material or layer having openings or holes therein may still be considered to cover another material or layer. In another example, not explicitly shown, the field insulating film 105 may cover parts of the sidewalls BP1_SW of the first lower pattern BP1 and parts of the sidewalls BP2_SW of the second lower pattern BP2. In this example, parts of the first and second lower patterns BP1 and BP2 may protrude beyond (i.e., extend upwardly from) the upper surface 105US of the field insulating film 105 in the third direction D3.

The upper surface 105US of the field insulating film 105 is illustrated as being flat (i.e., planar), but the present disclosure is not limited thereto. The field insulating film 105 may include, for example, an oxide film, a nitride film, an oxynitride film, or a combination thereof. The field insulating film 105 is illustrated as being a single film, but the present disclosure is not limited thereto.

A plurality of first channel patterns CH1 may be disposed on the first lower pattern BP1. The first channel patterns CH1 may overlap with the first lower pattern BP1 in the third direction D3. The term "overlap" (or "overlapping," or like terms), as used herein, is intended to broadly refer to a first element that intersects with at least a portion of a second element in the vertical direction (i.e., third direction D3), but does not require that the first and second elements be completely aligned with one another in a horizontal plane (i.e., in the first direction D1 and/or second direction D2). The first channel patterns CH1 may be aligned with one another in the first direction D1.

A plurality of second channel patterns CH2 may be disposed on the second lower pattern BP2. The second channel patterns CH2 may overlap with the second lower pattern BP2 in the third direction D3. The second channel patterns CH2 may be aligned with one another in the first direction D1.

A plurality of third channel patterns CH3 may be disposed on the first lower pattern BP1. The third channel patterns CH3 may overlap with the first lower pattern BP1 in the third direction D3. The third channel patterns CH3 may be aligned with one another in the first direction D1. The third channel patterns CH3 may be disposed to correspond to the first channel patterns CH1. The third channel patterns CH3 and their corresponding first channel patterns CH1 may be spaced apart from each other in the second direction D2.

A plurality of fourth channel patterns CH4 may be disposed on the second lower pattern BP2. The fourth channel patterns CH4 may overlap with the second lower pattern BP2 in the third direction D3. The fourth channel patterns CH4 may be aligned with one another in the first direction D1. The fourth channel patterns CH4 may be disposed to correspond to the second channel patterns CH2. The fourth channel patterns CH4 and their corresponding second channel patterns CH2 may be spaced apart from each other in the second direction D2.

For example, the first channel patterns CH1 and the third channel patterns CH3 may be included in PMOS channel regions, and the second channel patterns CH2 and the fourth channel patterns CH4 may be included in NMOS channel regions.

Each of the first channel patterns CH1, second channel patterns CH2, third channel patterns CH3, and fourth channel patterns CH4 may include a plurality of sheet patterns that are spaced apart from one another in the third direction D3. Each of the first channel patterns CH1, second channel patterns CH2, third channel patterns CH3, and fourth channel patterns CH4 is illustrated as including three sheet patterns, but the present disclosure is not limited thereto.

Each of the first channel patterns CH1 may include a plurality of first sheet patterns NS1. The first sheet patterns NS1 may be disposed on the upper surface BP1_US of the first lower pattern BP1. The first sheet patterns NS1 may be arranged on the first lower pattern BP1 in the third direction D3. The first sheet patterns NS1 may be spaced apart from one another in the third direction D3. Each of the first sheet patterns NS1 may have an upper surface NS1_US and a bottom surface NS1_BS, which are opposite to each other in the third direction D3.

Each of the second channel patterns CH2 may include a plurality of second sheet patterns NS2. The second sheet patterns NS2 may be disposed on the upper surface BP2_US of the second lower pattern BP2. The second sheet patterns NS2 may be arranged on the second lower pattern BP2 in the third direction D3. The second sheet patterns NS2 may be spaced apart from one another in the third direction D3. Each of the second sheet patterns NS2 may have an upper surface NS2_US and a bottom surface NS2_BS, which are opposite to each other in the third direction D3.

Each of the third channel patterns CH3 may include a plurality of third sheet patterns NS3. The third sheet patterns NS3 may be disposed on the upper surface BP1_US of the first lower pattern BP1. The third sheet patterns NS3 may be spaced apart from one another in the third direction D3. Each of the fourth channel patterns CH4 may include a plurality of fourth sheet patterns NS4. A plurality of fourth sheet patterns NS4 may be disposed on the upper surface BP2_US of the second lower pattern BP2. Each of the fourth sheet patterns NS4 may be spaced apart from one another in the third direction D3.

Each of the first sheet patterns NS1 may have first sidewalls NS1_SW1, which are opposite to each other in the first direction D1, and second sidewalls NS1_SW2, which are opposite to each other in the second direction D2. The upper surface NS1_US and the bottom surface NS1_BS of each of the first sheet patterns NS1 may be connected by the first sidewalls NS1_SW1 and the second sidewalls NS1_SW2 of the corresponding first sheet pattern NS1. The first sidewalls NS1_SW1 of each of the first sheet patterns NS1 may be connected to and in contact with their corresponding first source/drain patterns 150. The above description of the first sheet patterns NS1 may be directly applicable to the second sheet patterns NS2, the third sheet patterns NS3, and the fourth sheet patterns NS4.

Sheet patterns (NS1, NS2, NS3, and NS4) may include one of an element semiconductor material (e.g., Si or Ge), a group IV-IV compound semiconductor, and a group III-V compound semiconductor. The first sheet patterns NS1 and the third sheet patterns NS3 may include the same material as the first lower pattern BP1 or a different material from the first lower pattern BP1. The second sheet patterns NS2 and the fourth sheet patterns NS4 may include the same material as the second lower pattern BP2 or a different material from the second lower pattern BP2.

The first and second lower patterns BP1 and BP2 may be silicon (Si) lower patterns containing Si. The sheet patterns (NS1, NS2, NS3, and NS4) may be Si sheet patterns containing Si.

The channel patterns (CH1, CH2, CH3, and CH4) will hereinafter be described, with a particular focus on the first channel patterns CH1 and the second channel patterns CH2 as illustrative examples.

The first channel separation structure CCW1 may be disposed on the first lower pattern BP1. The first channel separation structure CCW1 may extend in the first direction D1. The first channel separation structure CCW1 may include sidewalls CCW1_SW, which extend in the first direction D1.

The first channel separation structure CCW1 separates the first channel patterns CH1 and the third channel patterns CH3. The first channel separation structure CCW1 may not separate the first lower pattern BP1. Part of the first channel separation structure CCW1 may be disposed partially in the first lower pattern BP1. The first lower pattern BP1 may cover parts of the sidewalls CCW1_SW of the first channel separation structure CCW1.

The first channel separation structure CCW1 may be in contact with the first lower pattern BP1. The first channel patterns CH1 and the third channel patterns CH3 may be in contact with the first channel separation structure CCW1 (e.g., the sidewalls CCW1_SW of the first channel separation structure CCW1). A plurality of first sheet patterns NS1 and a plurality of third sheet patterns NS3 may be in contact with the first channel separation structure CCW1. The first sheet patterns NS1 and the third sheet patterns NS3 may extend from the sidewalls CCW1_SW of the first channel separation structure CCW1 in the second direction D2. For example, one of the second sidewalls NS1_SW2 of each of the first sheet patterns NS1 may be in contact with one of the sidewalls CCW1_SW of the first channel separation structure CCW1, and one of the second sidewalls of each of the third sheet patterns NS3 may be in contact with the other sidewall CCW1_SW of the first channel separation structure CCW1.

Similarly, the second channel separation structure CCW2 may be disposed on the second lower pattern BP2. The second channel separation structure CCW2 may extend in the first direction D1. The second channel separation structure CCW2 may include sidewalls CCW2_SW, which extend in the first direction D1. The second channel separation structure CCW2 may be spaced apart from the first channel separation structure CCW1 in the second direction D2. The sidewalls CCW2_SW of the second channel separation structure CCW2 may face the sidewalls CCW1_SW of the first channel separation structure CCW1.

The second channel separation structure CCW2 separates the second channel patterns CH2 and the fourth channel patterns CH4. The second channel separation structure CCW2 may not separate the second lower pattern BP2. Part of the second channel separation structure CCW2 may be disposed in the second lower pattern BP2. The second lower pattern BP2 may cover parts of the sidewalls CCW2_SW of the second channel separation structure CCW2.

The second channel separation structure CCW2 may be in contact with the second lower pattern BP2. The second channel patterns CH2 and the fourth channel patterns CH4 may be in contact with the second channel separation structure CCW2. A plurality of second sheet patterns NS2 and a plurality of fourth sheet patterns NS4 may be in contact with the second channel separation structure CCW2. The second sheet patterns NS2 and the fourth sheet patterns NS4 may protrude from the sidewalls CCW2_SW of the second channel separation structure CCW2 in the second direction D2. For example, one of the second sidewalls NS2_SW2 of each of the second sheet patterns NS2 may be in contact with one of the sidewalls CCW2_SW of the second channel separation structure CCW2, and one of the second sidewalls of each of the fourth sheet patterns NS4 may be in contact with the other sidewall CCW2_SW of the second channel separation structure CCW2.

The first channel patterns CH1 and the second channel patterns CH2 may be disposed between the first and second channel separation structures CCW1 and CCW2, which are adjacent to each other in the second direction D2.

The first and second channel separation structures CCW1 and CCW2 may include an insulating material. The first and second channel separation structures CCW1 and CCW2 may include at least one of, silicon nitride (SiN), silicon oxynitride (SiON), silicon oxide ($SiO_2$), silicon oxycarbonitride (SiOCN), silicon boron nitride (SiBN), silicon oxyboronitride (SiOBN), silicon oxycarbide (SiOC), aluminum oxide (AlO), and a combination thereof, but the present disclosure is not limited thereto. The first and second channel separation structures CCW1 and CCW2 are illustrated as being single films, but the present disclosure is not limited thereto. Since the first and second channel separation structures CCW1 and CCW2 are formed at the same time, the first and second channel separation structures CCW1 and CCW2 may include the same material.

A height H11 from the bottom surface 105BS of the field insulating film 105 to the upper surface BP1_US of the first lower pattern BP1 is greater than a height H21 from the bottom surface 105BS of the field insulating film 105 to a lowermost part of the first channel separation structure CCW1. The upper surface 105US of the field insulating film 105 may be higher than the lowermost part of the first channel separation structure CCW1 with respect to the first surface 100US of the first substrate 100.

A plurality of first gate structures GS1 may be disposed on the first surface 100US of the first substrate 100. The first gate structures GS1 may extend in the second direction D2. The first gate structures GS1 may be adjacent to one another in the first direction D1.

The first gate structures GS1 may be disposed between the first and second channel separation structures CCW1 and CCW2, which are adjacent to each other in the second direction D2. The first gate structures GS1 may be in contact with the first and second channel separation structures CCW1 and CCW2.

The first gate structures GS1 may be disposed on the first and second lower patterns BP1 and BP2. The first gate structures GS1 may intersect the first and second lower patterns BP1 and BP2. The first gate structures GS1 may overlap with parts of the first and second lower patterns BP1 and BP2 in the third direction D3.

The first gate structures GS1 may be in contact with the upper surface 105US of the field insulating film 105. The first gate structures GS1 may be in contact with the upper surface BP1_US and BP2_US of the first and second lower patterns BP1 and BP2.

The first gate structures GS1 may include the first gate electrodes 120 and first gate insulating films 130. The first gate insulating films 130 of the first gate structures GS1 may be in contact with the upper surface 105US of the field insulating film 105 and the upper surface BP1_US and BP2_US of the first and second lower patterns BP1 and BP2, respectively. The first gate insulating films 130 of the first gate structures GS1 may be in contact with the sidewalls CCW1_SW of the first channel separation structure CCW1 and the sidewalls CCW2_SW of the second channel separation structure CCW2.

The first channel patterns CH1 may be disposed between the first gate structure GS1 and the first channel separation structure CCW1. The first sheet patterns NS1 may be disposed between the first gate structures GS1 and the first channel separation structure CCW1. As the first sheet patterns NS1 are in contact with the first channel separation structure CCW1, the first gate structures GS1 may not surround the first sheet patterns NS1 in a cross-sectional view.

The second channel patterns CH2 may be disposed between the first gate structure GS1 and the second channel separation structure CCW2. The second sheet patterns NS2 may be disposed between the first gate structures GS1 and the second channel separation structure CCW2. As the second sheet patterns NS2 are in contact with the second channel separation structure CCW2, the first gate structures GS1 may not surround the second sheet patterns NS2 in a cross-sectional view.

Each of the first gate structures GS1 may include first inner gate structures INT_GS1. The first inner gate structures INT_GS1 may be disposed between the first lower pattern BP1 and their corresponding first sheet patterns NS1 and between the corresponding first sheet patterns NS1, which are adjacent to one another in the third direction D3. The first inner gate structures INT_GS1 may be disposed between the second lower pattern BP2 and their corresponding second sheet patterns NS2 and between the corresponding second sheet patterns NS2, which are adjacent to one another in the third direction D3.

The first inner gate structures INT_GS1 are in contact with the upper surface BP1_US of the first lower pattern BP1 and the upper surface NS1_US and the bottom surface NS1_BS of the corresponding first sheet patterns NS1. The first inner gate structures INT_GS1 may be in contact with the upper surface BP2_US of the second lower pattern BP2 and the upper surface NS2_US and the bottom surface NS2_BS of the corresponding second sheet patterns NS2.

A plurality of first gate electrodes 120 may be disposed between the first and second channel separation structures CCW1 and CCW2, respectively. As first gate insulating films 130 are disposed between the first gate electrodes 120 and the first channel separation structure CCW1 and between the first gate electrodes 120 and the second channel separation structure CCW2, the first gate electrodes 120 may not be in contact with the first and second channel separation structures CCW1 and CCW2. The term "contact," as may be used herein, is intended to broadly refer to electrical and/or physical contact between two or more layers, structures or other elements.

The first gate electrodes 120 may be disposed on the first and second lower patterns BP1 and BP2. The first gate electrodes 120 may overlap with parts of the first and second lower patterns BP1 and BP2 in the third direction D3.

For example, the first gate electrodes 120 may include first, second, and third connection gate electrodes 120_1, 120_2, and 120_3, which are arranged in the first direction D1. The second connection gate electrode 120_2 may be disposed between the first and third connection gate electrodes 120_1 and 120_3.

Figure 2:
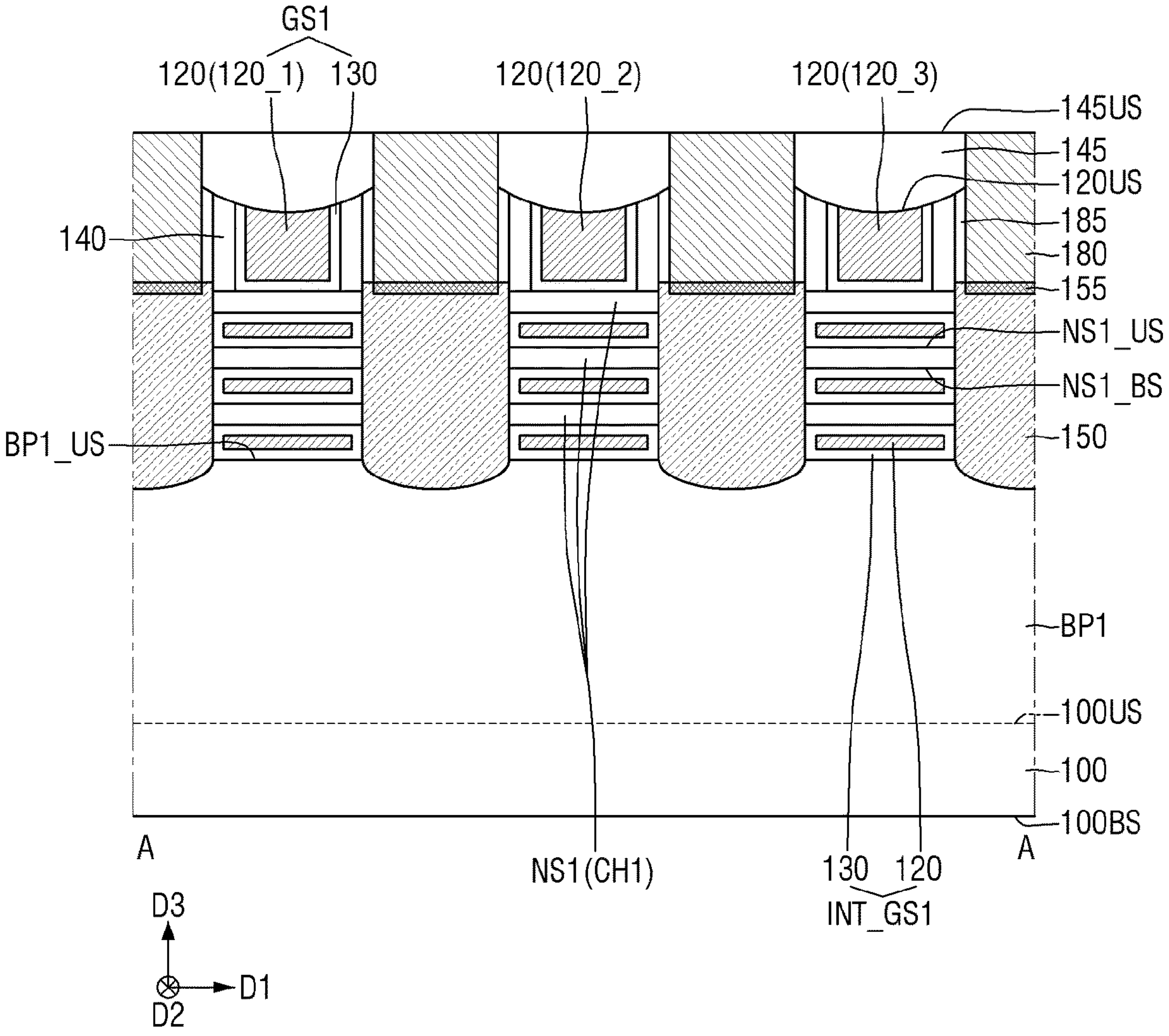
FIGS. 2, 3, 4, 5, and 6 are cross-sectional views taken along lines A-A, B-B, C-C, D-D, and E-E, respectively, of FIG. 1.
Figure 3:
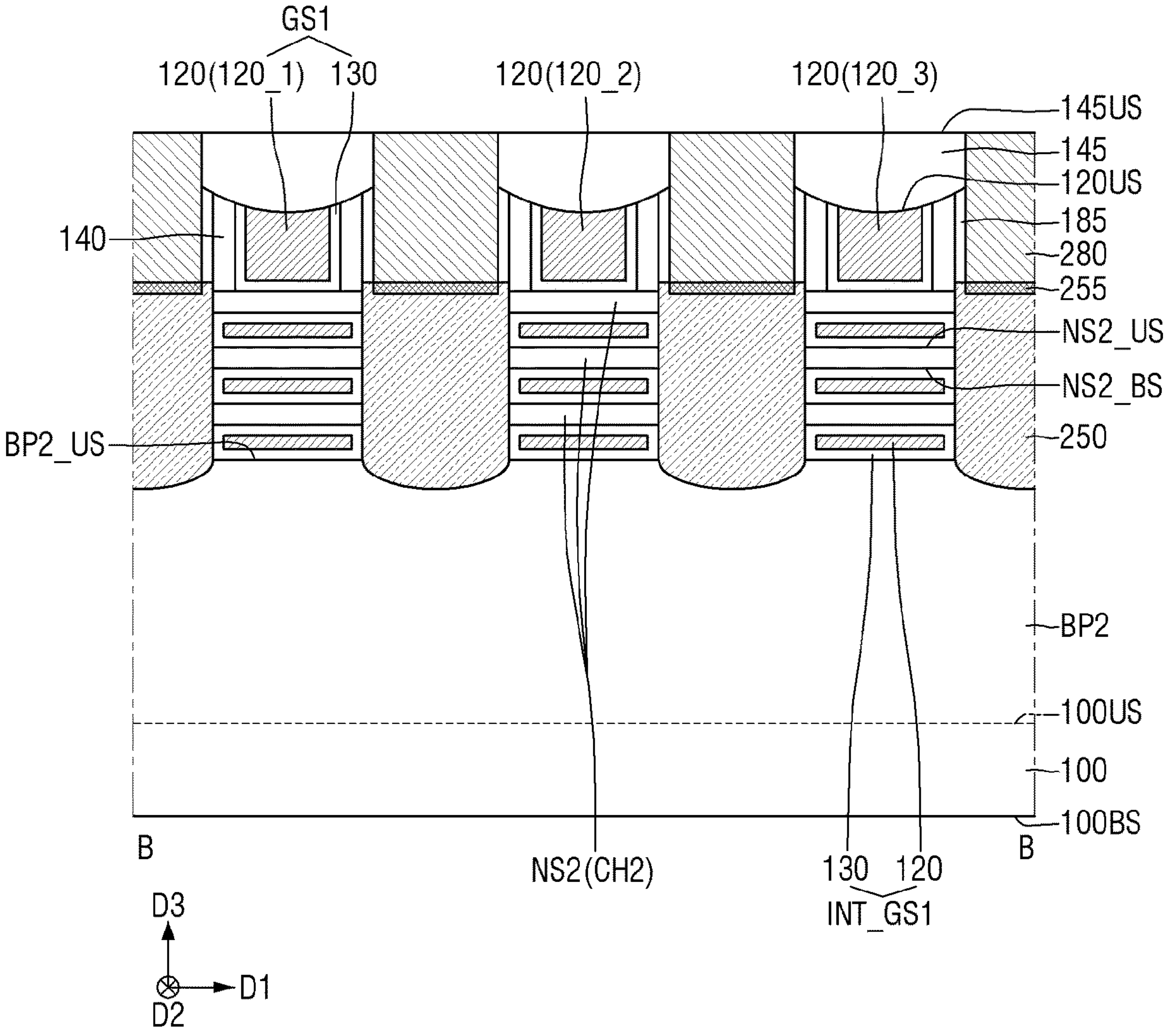

Upper surface 120US of the first gate electrodes 120 are illustrated in FIGS. 2 and 3 as being concave surface, but the present disclosure is not limited thereto. Alternatively, the upper surface 120US of the first gate electrodes 120 may be flat.

The first gate electrodes 120 may include at least one of a metal, a metal alloy, a conductive metal nitride, a metal silicide, a doped semiconductor material, a conductive metal oxide, and a conductive metal oxynitride. The first gate electrodes 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium Nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present disclosure is not limited thereto. Here, the conductive metal oxide and the conductive metal oxynitride may encompass oxidized forms of the above-mentioned materials, but the present disclosure is not limited thereto.

The first gate insulating films 130 may extend along the upper surface 105US of the field insulating film 105 and the upper surface BP1_US and BP2_US of the first and second lower patterns BP1 and BP2. The first gate insulating films 130 may extend along parts of the sidewalls CCW1_SW of the first channel separation structure CCW1 and parts of the sidewalls CCW2_SW of the second channel separation structure CCW2. In a cross-sectional view, the first gate insulating films 130 may be disposed along parts of the perimeters (i.e., periphery) of the first sheet patterns NS1. The first gate insulating films 130 may be disposed along parts of the perimeters of the second sheet patterns NS2. The first gate electrodes 120 are disposed on the first gate insulating films 130. The first gate insulating films 130 are disposed between the first gate electrodes 120 and the first sheet patterns NS1 and between the first gate electrodes 120 and the second sheet patterns NS2. The first gate insulating films 130 included in the second inner gate structures INS_GS1 may be in contact with the first source/drain patterns 150 and the second source/drain patterns 250.

The first gate insulating films 130 may include silicon oxide, silicon oxynitride, silicon nitride, or a high-k material with a greater dielectric constant than silicon oxide. The high-k material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate insulating films 130 are illustrated as being single films, but the present disclosure is not limited thereto. Alternatively, the first gate insulating films 130 may include stacks of multiple films. The first gate insulating films 130 may include interfacial layers, which are disposed between the first channel patterns CH1 and the first gate electrodes 120 and between the second channel patterns CH2 and the first gate electrodes 120, and high-k (i.e., high-dielectric constant) insulating films. For example, the interfacial films may not be formed along the profile of the upper surface 105US of the field insulating film 105.

The semiconductor device according to some embodiments of the present disclosure may include a negative capacitance (NC) field-effect transistor (FET) using a negative capacitor. For example, each of the first gate insulating films 130 may include a ferroelectric material film having ferroelectric properties and a paraelectric material film having paraelectric properties.

The ferroelectric material film may have a negative capacitance, and the paraelectric material film may have a positive capacitance. For example, if two or more capacitors are connected in series and have positive capacitance, the total capacitance of the two or more capacitors may be lower than the capacitance of each of the two or more capacitors individually. On the contrary, if at least one of the two or more capacitors has negative capacitance, the total capacitance of the two or more capacitors may have a positive value and may be greater than the absolute value of the capacitance of each of the two or more capacitors.

If the ferroelectric material film having a negative capacitance and the paraelectric material film having a positive capacitance are connected in series, the total capacitance of the ferroelectric material film and the paraelectric material film may increase. Accordingly, a transistor having the ferroelectric material film can have a sub-threshold swing (SS) of less than 60 mV/decade at room temperature.

The ferroelectric material film may have ferroelectric properties. The ferroelectric material film may include at least one of, for example, hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material film may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material film.

If the ferroelectric material film includes hafnium oxide, the dopant of the ferroelectric material film may include at least one of, for example, Gd, Si, Zr, Al, and Y.

If the dopant of the ferroelectric material film is Al, the ferroelectric material film may include about 3 atomic percent (at %) to about 8 at % of Al. Here, the ratio of the dopant in the ferroelectric material film may refer to the ratio of the sum of the amounts of Hf and Al to the amount of Al in the ferroelectric material film.

If the dopant of the ferroelectric material film is Si, the ferroelectric material film may include about 2 at % to about 10 at % of Si. If the dopant of the ferroelectric material film is Y, the ferroelectric material film may include about 2 at % to about 10 at % of Y. If the dopant of the ferroelectric material film is Gd, the ferroelectric material film may include about 1 at % to about 7 at % of Gd. If the dopant of the ferroelectric material film is Zr, the ferroelectric material film may include about 50 at % to about 80 at % of Zr.

The paraelectric material film may include paraelectric properties. The paraelectric material film may include at least one of, for example, silicon oxide and a high-k metal oxide. The high-k metal oxide may include at least one of, for example, hafnium oxide, zirconium oxide, and aluminum oxide, but the present disclosure is not limited thereto.

The ferroelectric material film and the paraelectric material film may include the same material. The ferroelectric material film may have ferroelectric properties, but the paraelectric material film may not have ferroelectric properties. For example, if the ferroelectric material film and the paraelectric material film include hafnium oxide, the hafnium oxide included in the ferroelectric material film may have a different crystalline structure from the hafnium oxide included in the paraelectric material film.

The ferroelectric material film may be thick enough to exhibit ferroelectric properties. The ferroelectric material film may have a thickness of, for example, about 0.5 nm to about 10 nm, but the present disclosure is not limited thereto. A critical thickness that can exhibit ferroelectric properties may vary depending on the type of ferroelectric material, and thus, the thickness of the ferroelectric material film may vary depending on the type of ferroelectric material included in the ferroelectric material film.

For example, each of the first gate insulating films 130 may include one ferroelectric material film. In another example, each of the first gate insulating films 130 may include a plurality of ferroelectric material films that are spaced apart from one another. Each of the first gate insulating films 130 may have a structure in which a plurality of ferroelectric material films and a plurality of paraelectric material films are alternately stacked.

First gate spacers 140 may be disposed on the sidewalls of the first gate structures GS1. For example, the first gate spacers 140 may include first portions that extend in the second direction D2. The first gate spacers 140 may include second portions that extend in the first direction D1, depending on the locations of the first gate separation structures GCS1. The first portions of the first gate spacers 140 may be directly connected to the second portions of the first gate spacers 140. The first portions of the first gate spacers 140 may be disposed on the sidewalls of the first gate structures GS1 that extend in the second direction D2.

The first gate spacers 140 may not be disposed between the first lower pattern BP1 and their corresponding first sheet patterns NS1 and between the corresponding first sheet patterns NS1, which are adjacent to one another in the third direction D3. The first gate spacers 140 may not be disposed between the second lower pattern BP2 and their corresponding second sheet patterns NS2 and between the corresponding second sheet patterns NS2, which are adjacent to one another in the third direction D3.

The details regarding the shape of the first gate spacers 140 will be further described in the description section pertaining to the first gate separation structures GCS1.

The first gate spacers 140 may include at least one of, for example, SiN, SiON, $SiO_2$, SiOCN, SiBN, SiOBN, SiOC, and a combination thereof. The first gate spacers 140 are illustrated as being single films, but the present disclosure is not limited thereto.

First gate capping patterns 145 may be disposed on the first gate structures GS1. The first gate capping patterns 145 may be disposed on the upper surface 120US of the first gate electrodes 120.

The first gate capping patterns 145 may be disposed on the upper surface of the first gate spacers 140. The first gate capping patterns 145 may cover the upper surface of the first gate spacers 140. Although not explicitly depicted, in some embodiments the first gate capping patterns 145 may be disposed between the first gate spacers 140. In this case, an upper surface 145US of the first gate capping patterns 145 may be disposed on the same plane as (i.e., coplanar with) the upper surface of the first gate spacers 140.

The first gate capping patterns 145 may be disposed between the first and second channel separation structures CCW1 and CCW2. The first gate capping patterns 145 may be in contact with the sidewalls CCW1_SW of the first channel separation structure CCW1 and the sidewalls CCW2_SW of the second channel separation structure CCW2.

The height from the bottom surface 105BS of the field insulating film 105 to the upper surface 145US of the first gate capping patterns 145 may be the same as a height "H21+H22" from the bottom surface 105BS of the field insulating film 105 to an upper surface CCW1_US of the first channel separation structure CCW1. For example, the upper surface 145US of the first gate capping patterns 145 may be disposed on the same plane as the upper surface CCW1_US of the first channel separation structure CCW1. For example, the upper surface 145US of the first gate capping patterns 145 may be disposed on the same plane as the upper surface CCW2_US of the second channel separation structure CCW2.

The first gate capping patterns 145 may include at least one of, SiN, SiON, SiCN, SiOCN, and a combination thereof.

Although not explicitly depicted, in some embodiments the first gate capping patterns 145 may not be disposed on the first gate structures GS1. In this case, the height from the bottom surface 105BS of the field insulating film 105 to the upper surface of the first gate structures GS1 may be the same as the height from the bottom surface 105BS of the field insulating film 105 to the upper surface CCW1_US of the first channel separation structure CCW1, i.e., H21+H22. The upper surface of the first gate structures GS1 may include the upper surface 120US of the first gate electrodes 120.

The first source/drain patterns 150 may be disposed on the first lower pattern BP1. The first source/drain patterns 150 may be disposed on the side surface (i.e., sidewalls) of the first gate electrodes 120. The first source/drain patterns 150 may be connected to the first channel patterns CH1. The first source/drain patterns 150 may be in contact with the first channel patterns CH1. The first source/drain patterns 150 may be in contact with the first sheet patterns NS1. For example, the first source/drain patterns 150 may be in contact with the first inner gate structures INT_GS1.

The second source/drain patterns 250 may be disposed on the second lower pattern BP2. The second source/drain patterns 250 may be disposed on the side surface of the first gate electrodes 120. The second source/drain patterns 250 may be connected to the second channel patterns CH2. The second source/drain patterns 250 may be in contact with the second channel patterns CH2. The second source/drain patterns 250 may be in contact with the second sheet patterns NS2. For example, the second source/drain patterns 250 may be in contact with the first inner gate structures INT_GS1.

The third source/drain patterns 350 may be disposed on the first lower pattern BP1. The first channel separation structure CCW1 may be disposed between the first source/drain patterns 150 and the third source/drain patterns 350. Although not specifically illustrated, the third source/drain patterns 350 may be connected to the third channel patterns CH3. The third source/drain patterns 350 may be in contact with the third channel patterns CH3.

The fourth source/drain patterns 450 may be disposed on the second lower pattern BP2. The second channel separation structure CCW2 may be disposed between the second source/drain patterns 250 and the fourth source/drain patterns 450. Although not specifically illustrated, the fourth source/drain patterns 450 may be connected to the fourth channel patterns CH4. The fourth source/drain patterns 450 may be in contact with the fourth channel patterns CH4.

The first source/drain patterns 150 and the second source/drain patterns 250 may be disposed between the first and second channel separation structures CCW1 and CCW2. The first source/drain patterns 150 and the second source/drain patterns 250 may be spaced apart from one another in the second direction D2.

The first source/drain patterns 150 may be in contact with the first channel separation structure CCW1. For example, the first source/drain patterns 150 may be in contact with the sidewalls CCW1_SW of the first channel separation structure CCW1. The second source/drain patterns 250 may be in contact with the second channel separation structure CCW2. For example, the second source/drain patterns 250 may be in contact with the sidewalls CCW2_SW of the second channel separation structure CCW2.

The first source/drain patterns 150 may be in contact with the first sheet patterns NS1 and the first lower pattern BP1. The second source/drain patterns 250 may be in contact with the second sheet patterns NS2 and the second lower pattern BP2.

The third source/drain patterns 350 may be in contact with the first channel separation structure CCW1. The fourth source/drain patterns 450 may be in contact with the second channel separation structure CCW2.

The first source/drain patterns 150, the second source/drain patterns 250, the third source/drain patterns 350, and the fourth source/drain patterns 450 may be disposed on the first surface 100US of the first substrate 100. The first source/drain patterns 150 may be included in the sources/drains of transistors using the first sheet patterns NS1 as channel regions. The second source/drain patterns 250 may be included in the sources/drains of transistors using the second sheet patterns NS2 as channel regions. The third source/drain patterns 350 may be included in the sources/drains of transistors using the third sheet patterns NS3 as channel regions. The fourth source/drain patterns 450 may be included in the sources/drains of transistors using the fourth sheet patterns NS4 as channel regions.

The first source/drain patterns 150, the second source/drain patterns 250, the third source/drain patterns 350, and the fourth source/drain patterns 450 may include epitaxial patterns. The first source/drain patterns 150, the second source/drain patterns 250, the third source/drain patterns 350, and the fourth source/drain patterns 450 may include a semiconductor material.

The first source/drain patterns 150 and the third source/drain patterns 350 may include a p-type dopant. The p-type dopant may include at least one of boron (B) and gallium (Ga), but the present disclosure is not limited thereto. The second source/drain patterns 250 and the fourth source/drain patterns 450 may include an n-type dopant. The n-type dopant may include at least one of P, As, Sb, and bismuth (Bi), but the present disclosure is not limited thereto.

Source/drain etch stopper films 185 may extend along the outer sidewalls of the first gate spacers 140, the sidewalls of the first source/drain patterns 150, the sidewalls of the second source/drain patterns 250, the sidewalls of the third source/drain patterns 350, and the sidewalls of the fourth source/drain patterns 450. The source/drain etch stopper films 185 may extend along the upper surface 105US of the field insulating film 105.

Parts of the source/drain etch stopper films 185 may extend along the sidewalls CCW1_SW of the first channel separation structure CCW1 and the sidewalls CCW2_SW of the second channel separation structure CCW2. The source/drain etch stopper films 185 on the sidewalls CCW1_SW of the first channel separation structure CCW1 and the sidewalls CCW2_SW of the second channel separation structure CCW2 may potentially be remaining portions that are not removed during the formation of the first source/drain contacts 180, the second source/drain contacts 280, the third source/drain contacts 380, and the fourth source/drain contacts 480.

The source/drain etch stopper films 185 may not extend along the sidewalls of the first gate capping patterns 145. Although not explicitly depicted, in some embodiments the source/drain etch stopper films 185 may extend along the sidewalls of the first gate capping patterns 145.

The source/drain etch stopper films 185 may include at least one of, for example, SiN, SiON, SiOCN, SiBN, SiOBN, SiOC, and a combination thereof.

Upper interlayer insulating films 190 may be disposed on the first surface 100US of the first substrate 100. The upper interlayer insulating films 190 may be disposed on the source/drain etch stopper films 185. The upper interlayer insulating films 190 may be disposed on the first source/drain patterns 150, the second source/drain patterns 250, the third source/drain patterns 350, and the fourth source/drain patterns 450.

The upper interlayer insulating films 190 may include at least one of, for example, silicon oxide, silicon nitride, silicon oxynitride, and a low-k (low-dielectric constant) material. The low-k material may have a dielectric constant less than 3.9, which is the dielectric constant of silicon oxide.

The first gate separation structures GCS1 may be disposed on the first surface 100US of the first substrate 100. The first gate separation structures GCS1 may be disposed on the field insulating film 105. Parts of the first gate separation structures GCS1 may be disposed in the upper interlayer insulating film 190.

The first gate separation structures GCS1 may be in contact with the field insulating film 105. Parts of the first gate separation structures GCS1 may be recessed into the field insulating film 105.

The first gate separation structures GCS1 may be disposed between the first and second channel separation structures CCW1 and CCW2. The first gate separation structure CGS1 may be disposed between the first source/drain patterns 150 and the second source/drain patterns 250. For example, the first gate separation structures GCS1 may be disposed between the first source/drain patterns 150 and the second source/drain patterns 250 that face the first source/drain patterns 150 in the second direction D2. For example, the first gate separation structures GCS1 may not be in contact with the first source/drain patterns 150 and the second source/drain patterns 250.

The first gate separation structures GCS1 may be disposed between first gate structures GS1 that are adjacent to one another in the first direction D1. The first gate separation structures GCS1 separate the first gate structures GS1. For example, the first gate separation structures GCS1 may separate the first gate structures GS1 that are adjacent to one another in the first direction D1.

The first gate separation structures GCS1 may be in contact with the first gate structures GS1. For example, the first gate separation structures GCS1 may be in contact with the first gate electrodes 120 and the first gate insulating films 130.

Figure 6:
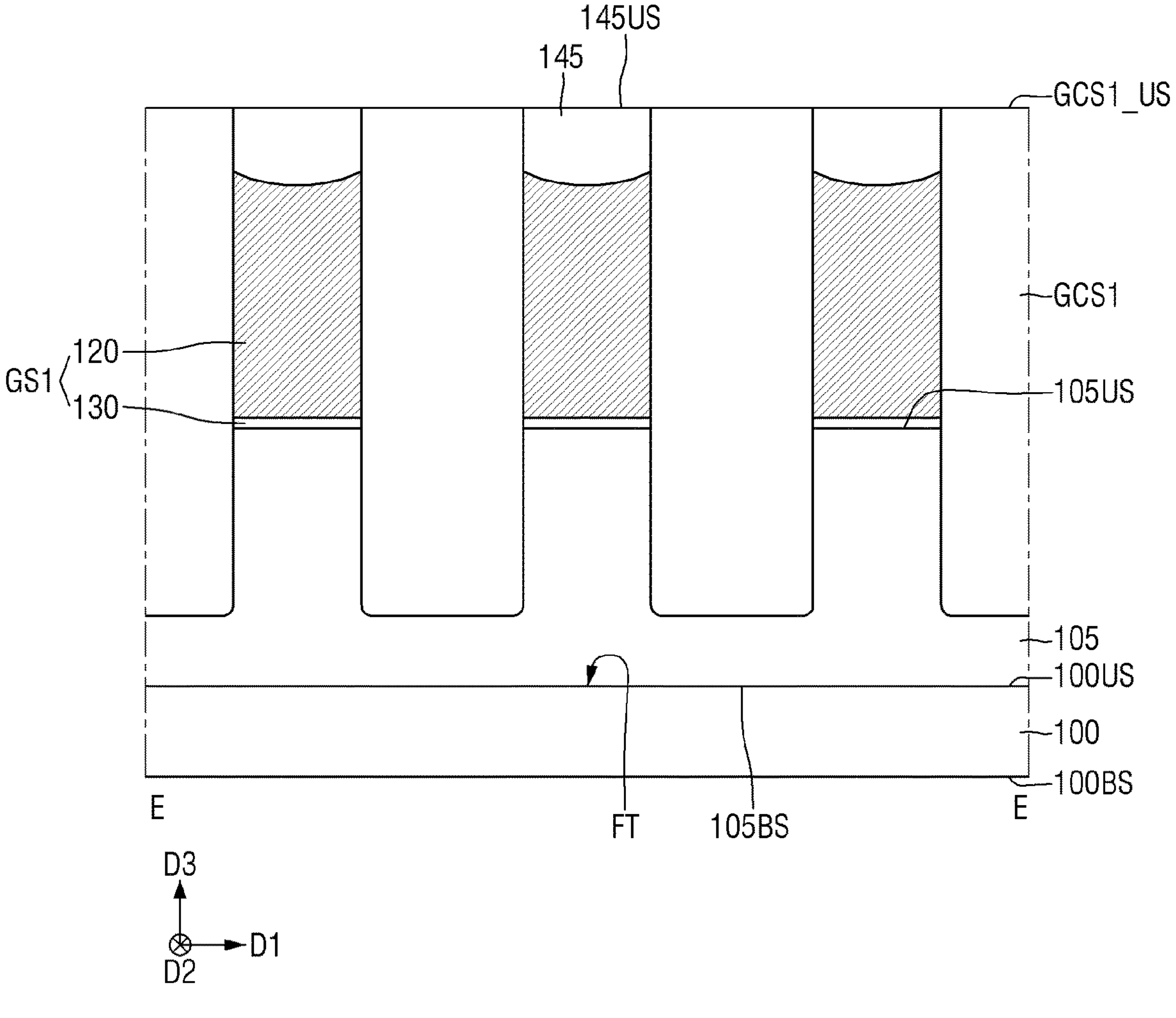
Figure 7:
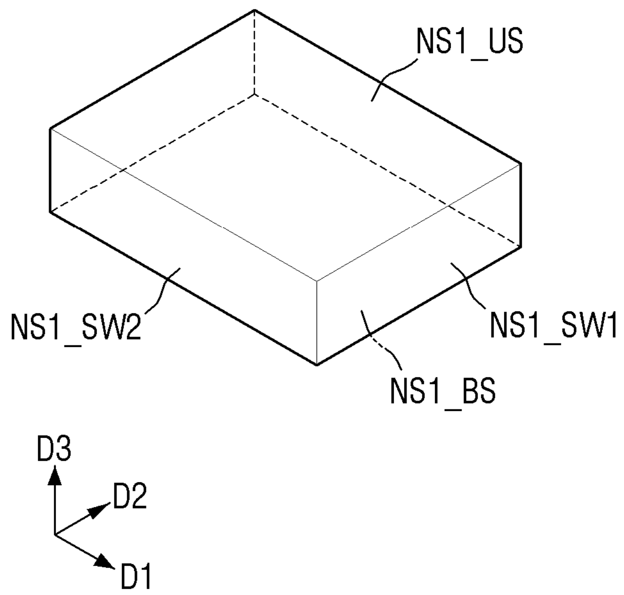
FIG. 7 is diagram for explaining the shape of a first sheet pattern of FIG. 2.

Referring to FIG. 6, each of the first gate separation structure GCS1 may include sidewalls that are opposite to each other in the first direction D1. The first gate insulating films 130 may not extend along the sidewalls of the first gate separation structures GCS1. The first gate insulating films 130 may not extend along the boundaries between the first gate separation structures GCS1 and the first gate electrodes 120.

Figure 9:
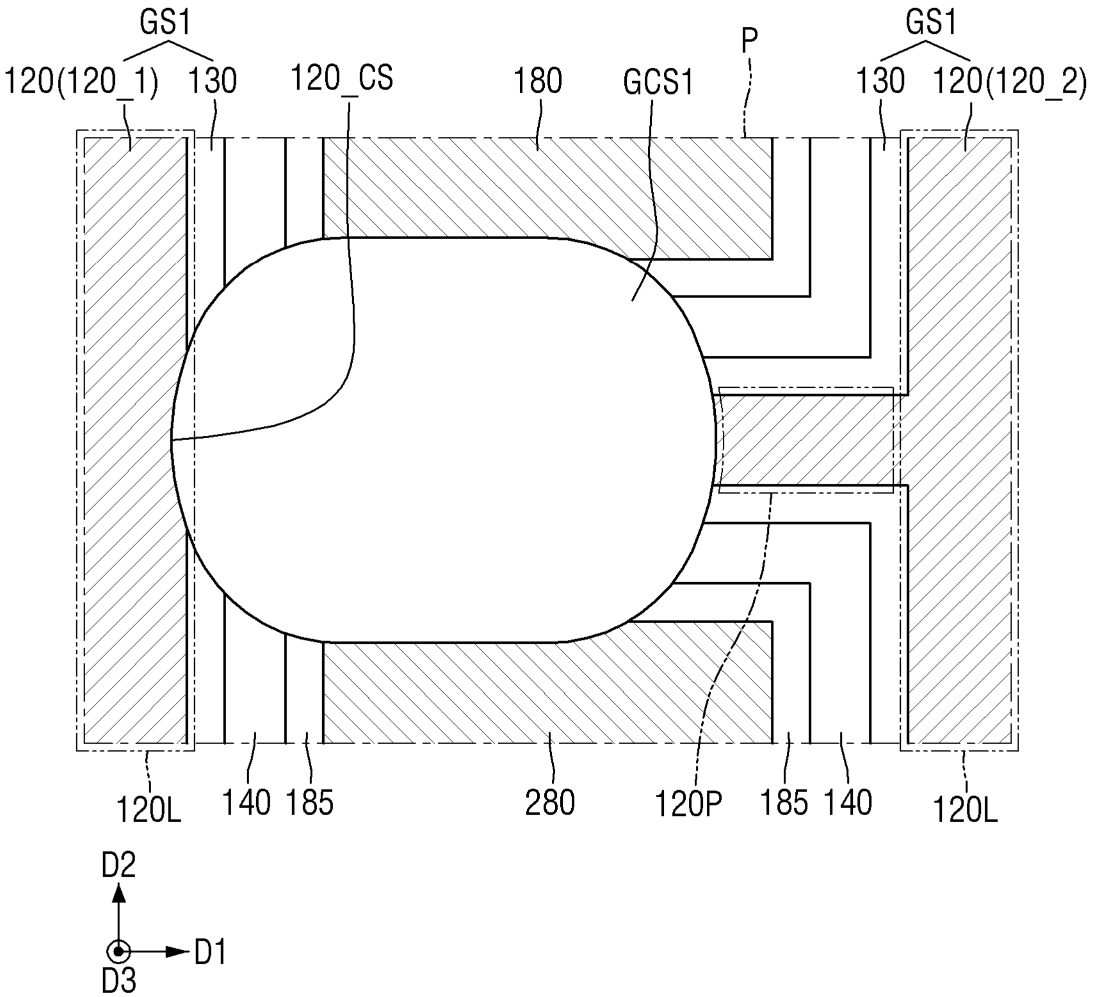
Figure 10:
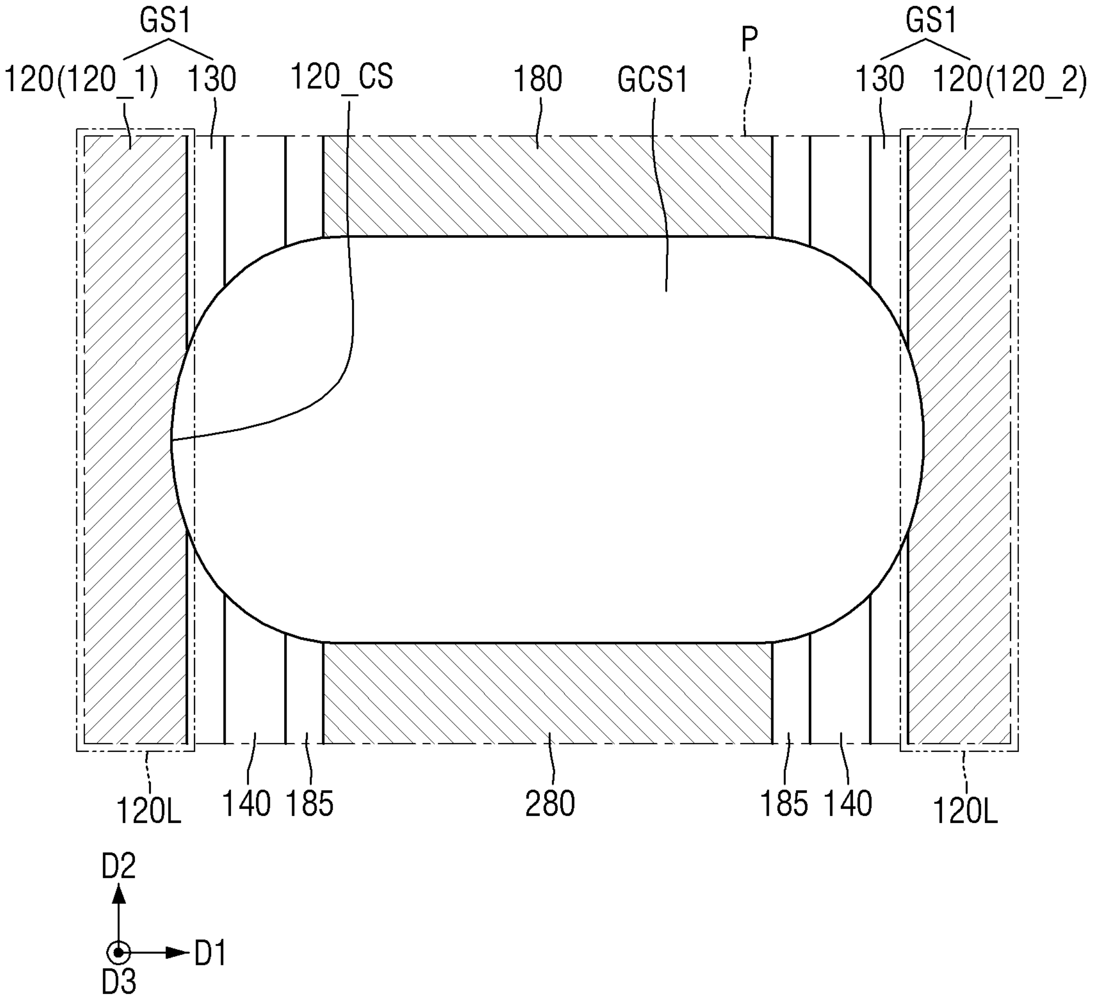
Figure 11:
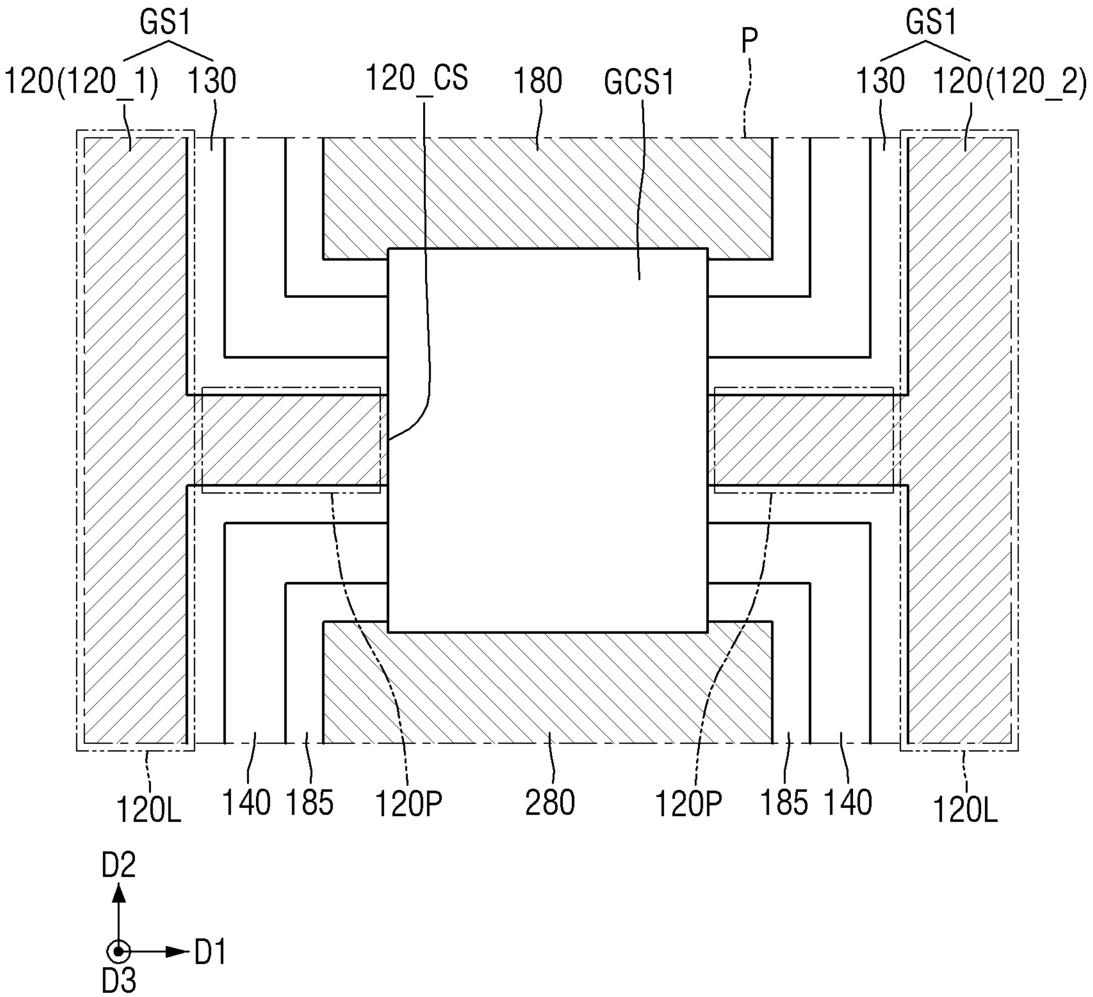

Referring to FIGS. 8 through 12, the first gate electrodes 120 may include contact surface 120_CS, which are in contact with the first gate separation structures GCS1. Referring to FIGS. 8 through 10 and 12, the contact surface 120_CS of the first gate electrodes 120 may include a concave surface in a plan view. Referring to FIG. 11, the contact surface 120_CS of the first gate electrodes 120 may appear as straight lines in a plan view.

Figure 12:
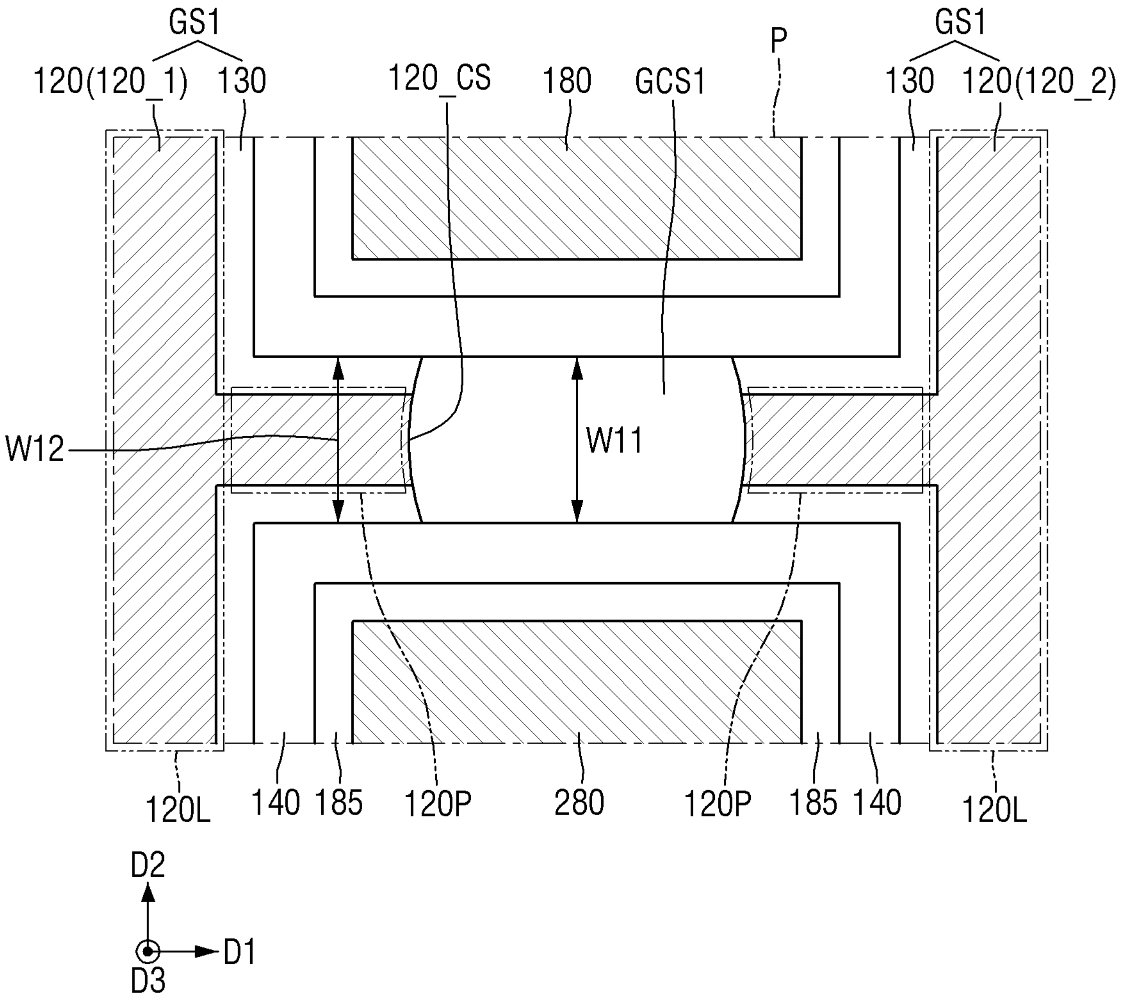

Although not specifically illustrated, the contact surface 120_CS of the first gate electrodes 120 of FIGS. 9, 10, and 12 may appear as straight lines in a plan view.

The planar configuration between the first and second connection gate electrodes 120_1 and 120_2 and their corresponding first gate separation structure GCS1 will hereinafter be described with reference to FIGS. 8 through 12. The content described in FIGS. 8 through 12 may also be applicable to the planar configuration between the second and third connection gate electrodes 120_2 and 120_3, respectively, and their corresponding first gate separation structure GCS1.

Referring to FIGS. 8 through 12, the first gate spacers 140 may extend along the sidewalls of the first connection gate electrode 120_1 and the sidewalls of the second connection gate electrode 120_2.

Referring to FIGS. 8 through 11, the first gate spacers 140 on the sidewalls of the first connection gate electrode 120_1 may be separated from the first gate spacers 140 on the sidewalls of the second connection gate electrode 120_2 by the first gate separation structure GCS1.

Referring to FIG. 12, an embodiment is shown in which the first gate spacers 140 on the sidewalls of the first connection gate electrode 120_1 are not separated from the first gate spacers 140 on the sidewalls of the second connection gate electrode 120_2 by the first gate separation structure GCS1.

Referring to FIGS. 8 through 12, each of the first and second connection gate electrodes 120_1 and 120_2 may include a first gate electrode line portion 120L, which extends in the second direction D2.

Figure 8:
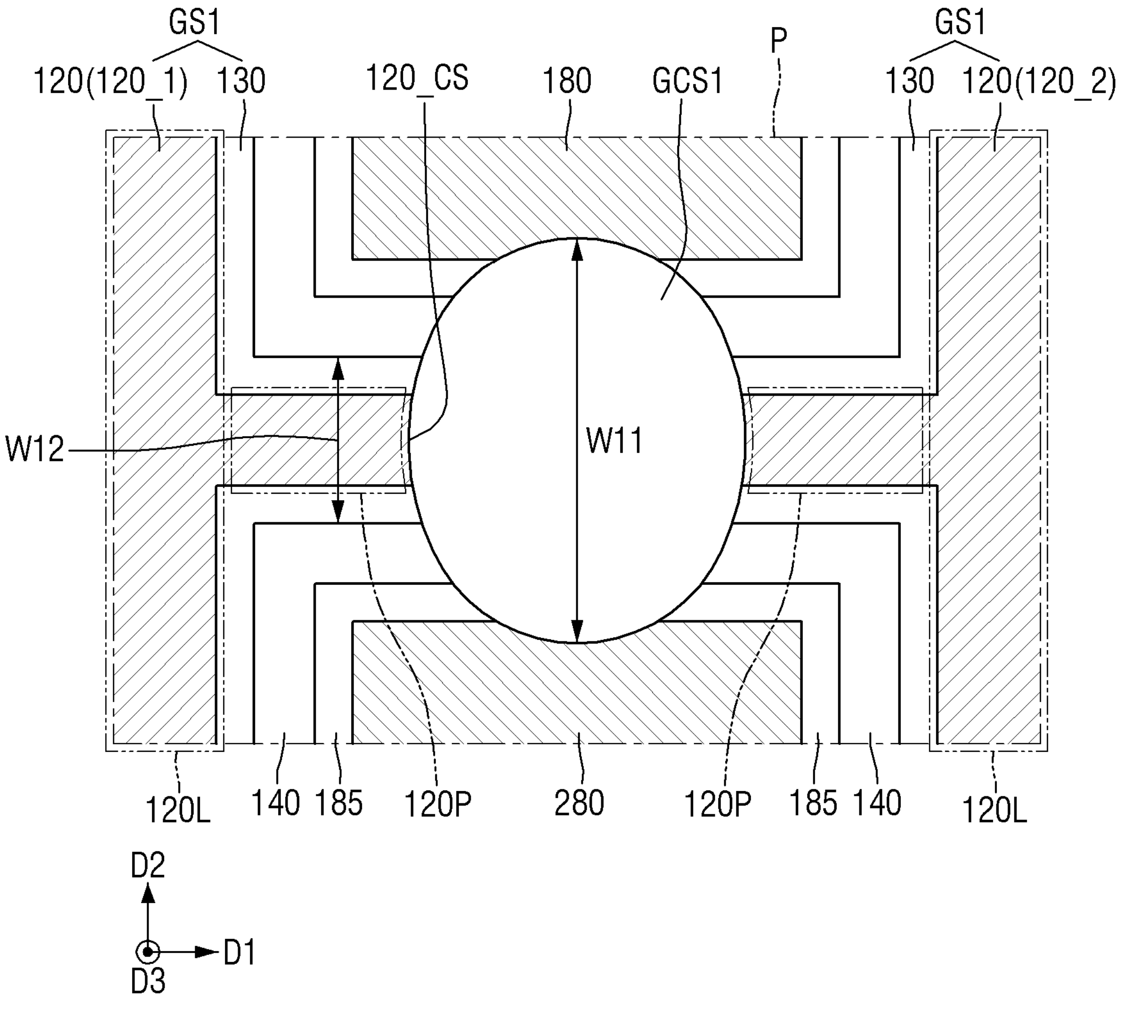
FIGS. 8 through 12 are plan views of part P of FIG. 1.

Referring to FIGS. 8, 11, and 12, each of the first and second gate electrodes 120_1 and 120_2 may further include a first gate electrode protrusion portion 120P, which extends from the first gate electrode line portion 120L in the first direction D1. The first gate electrode protruding portions 120P of the first and second connection gate electrodes 120_1 and 120_2 may be in contact with the first gate separation structure GCS1.

Referring to FIGS. 8 and 11, a width W12 of the first gate electrode protrusion portions 120P of the first gate electrode structures GS1 in the second direction D2 may be less than a width W11 of the first gate separation structure GCS1 in the second direction D2.

Referring to FIG. 12, in some embodiments the width W12 of the first gate electrode protrusion portions 120P of the first gate electrode structures GS1 in the second direction D2 may be the same as the width W11 of the first gate separation structure GCS1 in the second direction D2. Although not explicitly depicted, if the first gate separation structure GCS1 removes parts of the first gate spacers 140, the width W12 of first gate electrode structures GS1 including first gate electrode protrusion portions 120P in the second direction D2 may be less than the width W11 of the first gate separation structure GCS1 in the second direction D2.

Referring to FIG. 9, the second connection gate electrode 120_2 may include a first gate electrode line portion 120L and a first gate electrode protrusion portion 120P, which extends from the first gate electrode line portion 120L in the first direction D1. The first connection gate electrode 120_1 may include a first gate electrode line portion 120L, but no first gate electrode protrusion portion 120P. The first gate electrode protrusion portion 120P of the second connection gate electrode 120_2 and the first gate electrode line portion 120L of the first connection gate electrode 120_1 may be in contact with the first gate separation structure GCS1.

Referring to FIG. 10, each of the first and second connection gate electrodes 120_1 and 120_2 may not include a first gate electrode protrusion portion 120P.

Figure 4:
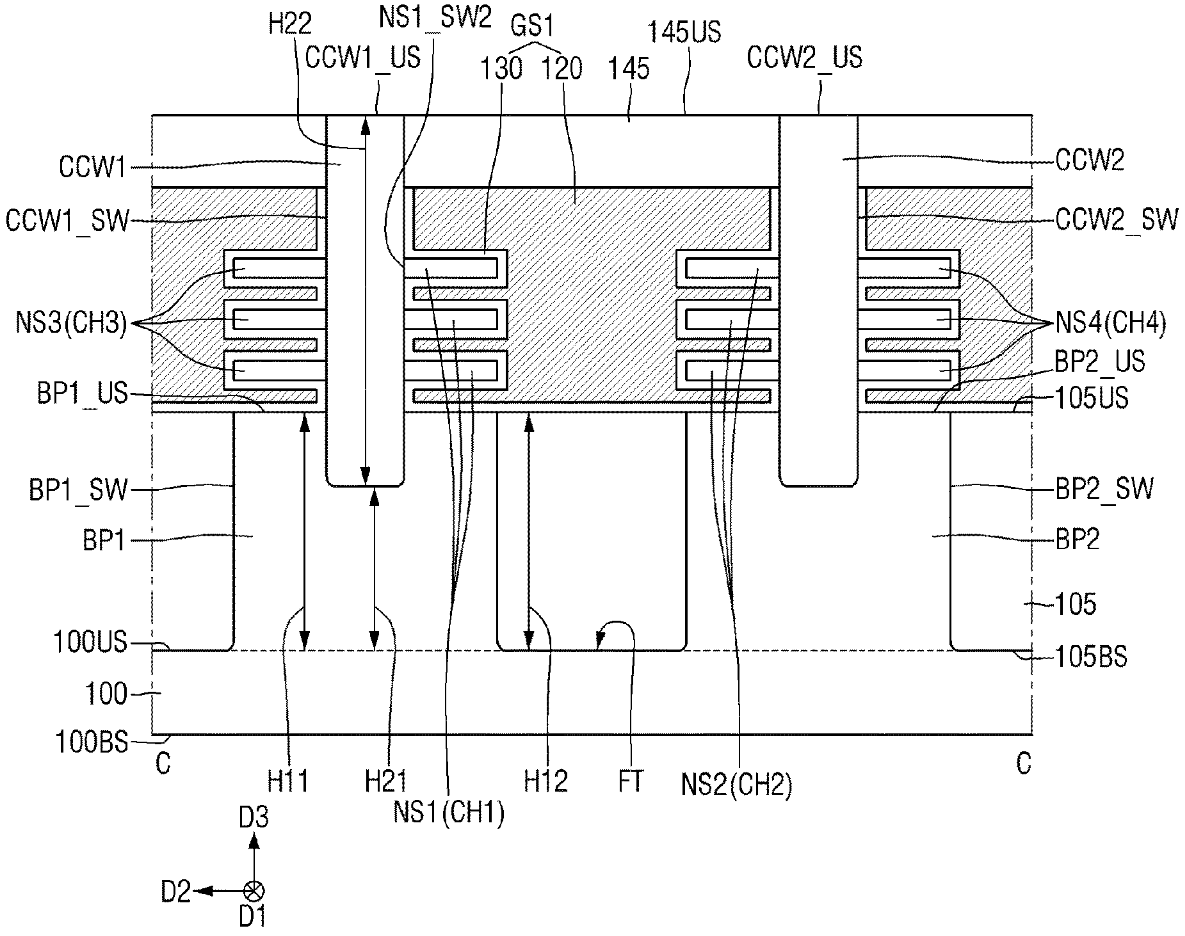

As shown, for example, in FIGS. 4 and 5, the height "H21+H22" from the bottom surface 105BS of the field insulating film 105 to the upper surface CCW1_US of the first channel separation structure CCW1 may be the same as a height "H31+H32" from the bottom surface 105BS of the field insulating film 105 to upper surface GCS1_US of the first gate separation structures GCS1. For example, the upper surface GCS1_US of the first gate separation structures GCS1 may be disposed on the same plane as the upper surface CCW1_US of the first channel separation structure CCW1.

A height H22 of the first channel separation structure CCW1, in the third direction D3, may be different from a height H32, in the third direction D3, of the first gate separation structures GCS1.

For example, the height H22 of the first channel separation structure CCW1 in the third direction D3 may be less than the height H32 of the first gate separation structures GCS1 in the third direction D3. A height H31 from the bottom surface 105BS of the field insulating film 105 to a lowermost part of the first gate separation structures GCS1 may be less than the height H21 from the bottom surface 105BS of the field insulating film 105 to the lowermost part of the first channel separation structure CCW1. The height H11 from the bottom surface 105BS of the field insulating film 105 to the upper surface BP1_US of the first lower pattern BP1 may be greater than the height H31 from the bottom surface 105BS of the field insulating film 105 to the lowermost part of the first gate separation structures GCS1. A height H12 from the bottom surface 105BS to the upper surface 105US of the field insulating film 105 may be greater than the height H31 from the bottom surface 105BS of the field insulating film 105 to the lowermost part of the first gate separation structures GCS1.

For example, a distance W21 between the first gate separation structures GCS1 and the first channel separation structure CCW1 in the second direction D2 may be the same as a distance W22 between the first gate separation structures GCS1 and the second channel separation structure CCW2 in the second direction D2. The distance W21 between the first gate separation structures GCS1 and the first channel separation structure CCW1 in the second direction D2 may be measured from the upper surface GCS1_US of the first gate separation structures GCS1 and the upper surface CCW1_US of the first channel separation structure CCW1.

The first gate separation structures GCS1 may include an insulating material. The first gate separation structures GCS1 may include at least one of, SiN, SiON, $SiO_2$, SiOCN, SiBN, SiOBN, SiOC, AlO, and a combination thereof. The first gate separation structure GCS1 is illustrated as being a single film, but the present disclosure is not limited thereto.

The first source/drain contacts 180 may be disposed on the first source/drain patterns 150. The first source/drain contacts 180 are electrically connected to the first source/drain patterns 150. The first source/drain contacts 180 are disposed between the first channel separation structure CCW1 and the first gate separation structures GCS1. The first source/drain contacts 180 may be disposed on the upper interlayer insulating film 190. Parts of the source/drain etch stopper films 185 may be disposed between the first source/drain contacts 180 and the first channel separation structure CCW1.

The second source/drain contacts 280 may be disposed on the second source/drain patterns 250. The second source/drain contacts 280 are electrically connected to the second source/drain patterns 250. The second source/drain contacts 280 are disposed between the second channel separation structure CCW2 and the first gate separation structures GCS1. The second source/drain contacts 280 may be disposed on the upper interlayer insulating film 190. Parts of the source/drain tch stopper films 185 may be disposed between the second source/drain contacts 280 and the second channel separation structure CCW2.

The third source/drain contacts 380 may be disposed on the third source/drain patterns 350. The third source/drain contacts 380 are electrically connected to the third source/drain patterns 350. The fourth source/drain contacts 480 may be disposed on the fourth source/drain patterns 450. The fourth source/drain contacts 480 are electrically connected to the fourth source/drain patterns 450.

First contact silicide films 155 may be disposed between the first source/drain contacts 180 and the first source/drain patterns 150. Second contact silicide films 255 may be disposed between the second source/drain contacts 280 and the second source/drain patterns 250. Third contact silicide films 355 may be disposed between the third source/drain contacts 380 and the third source/drain patterns 350. Fourth contact silicide films 455 may be disposed between the fourth source/drain contacts 480 and the fourth source/drain patterns 450.

Although not specifically illustrated, gate contacts on the first gate electrodes 120 may be disposed in the first gate capping patterns 145.

The first source/drain contacts 180, the second source/drain contacts 280, the third source/drain contacts 380, and the fourth source/drain contacts 480 are illustrated as having a single conductive film structure, but the present disclosure is not limited thereto. Alternatively, each of the first source/drain contacts 180, the second source/drain contacts 280, the third source/drain contacts 380, and the fourth source/drain contacts 480 may have a multilayer conductive film structure consisting of a barrier film and a plug film. The first source/drain contacts 180, the second source/drain contacts 280, the third source/drain contacts 380, and the fourth source/drain contacts 480 may include at least one of, for example, a metal, a conductive metal nitride, a conductive metal carbide, a conductive metal oxide, a conductive metal carbonitride, and a two-dimensional (2D) material. The first contact silicide films 155, the second contact silicide films 255, the third contact silicide films 355, and the fourth contact silicide films 455 may include a metal silicide material.

The 2D material may include a 2D allotrope or a 2D compound, for example, graphene, boron nitride (BN), molybdenum sulfide, molybdenum selenide, tungsten sulfide, tungsten selenide, and tantalum sulfide, but the present disclosure is not limited thereto. That is, various other 2D materials are also applicable to the semiconductor device according to some embodiments of the present disclosure.

FIGS. 13 through 16 are cross-sectional or plan views of a semiconductor device according to some embodiments of the present disclosure. For convenience, the embodiment of FIGS. 13 through 16 will hereinafter be described, highlighting the differences with the embodiment of FIGS. 1 through 12.

Figure 13:
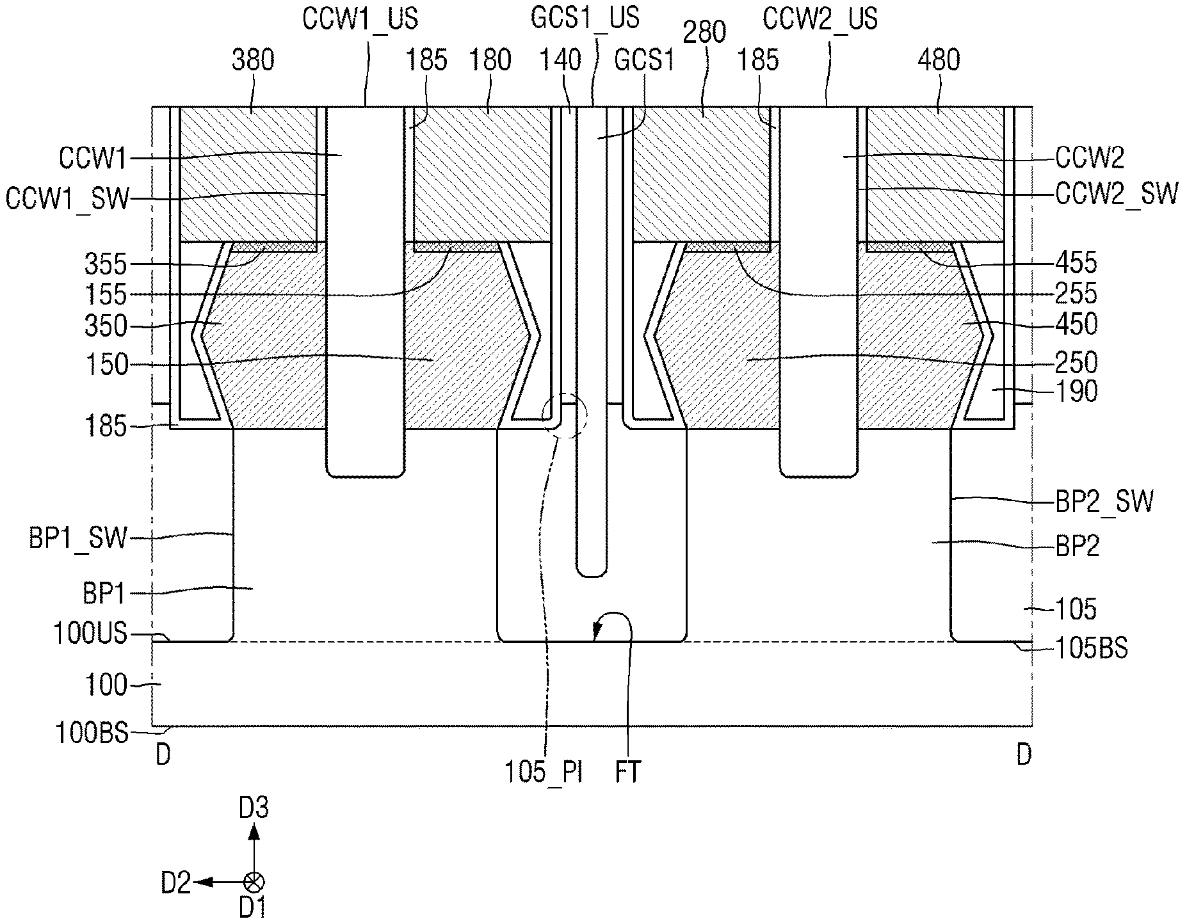
FIGS. 13 through 16 are cross-sectional or plan views of a semiconductor device according to some embodiments of the present disclosure.
Figure 14:
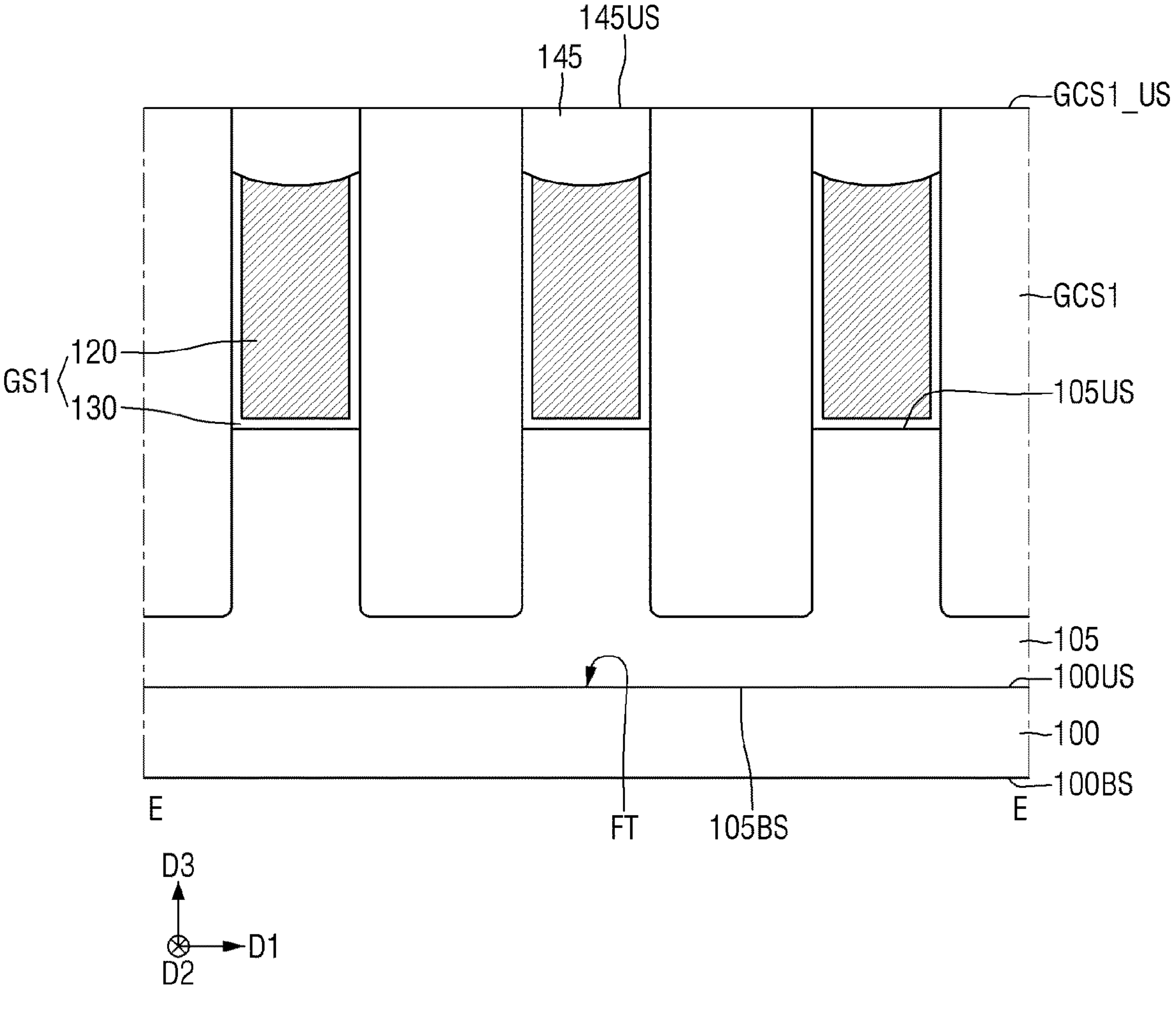
Figure 15:
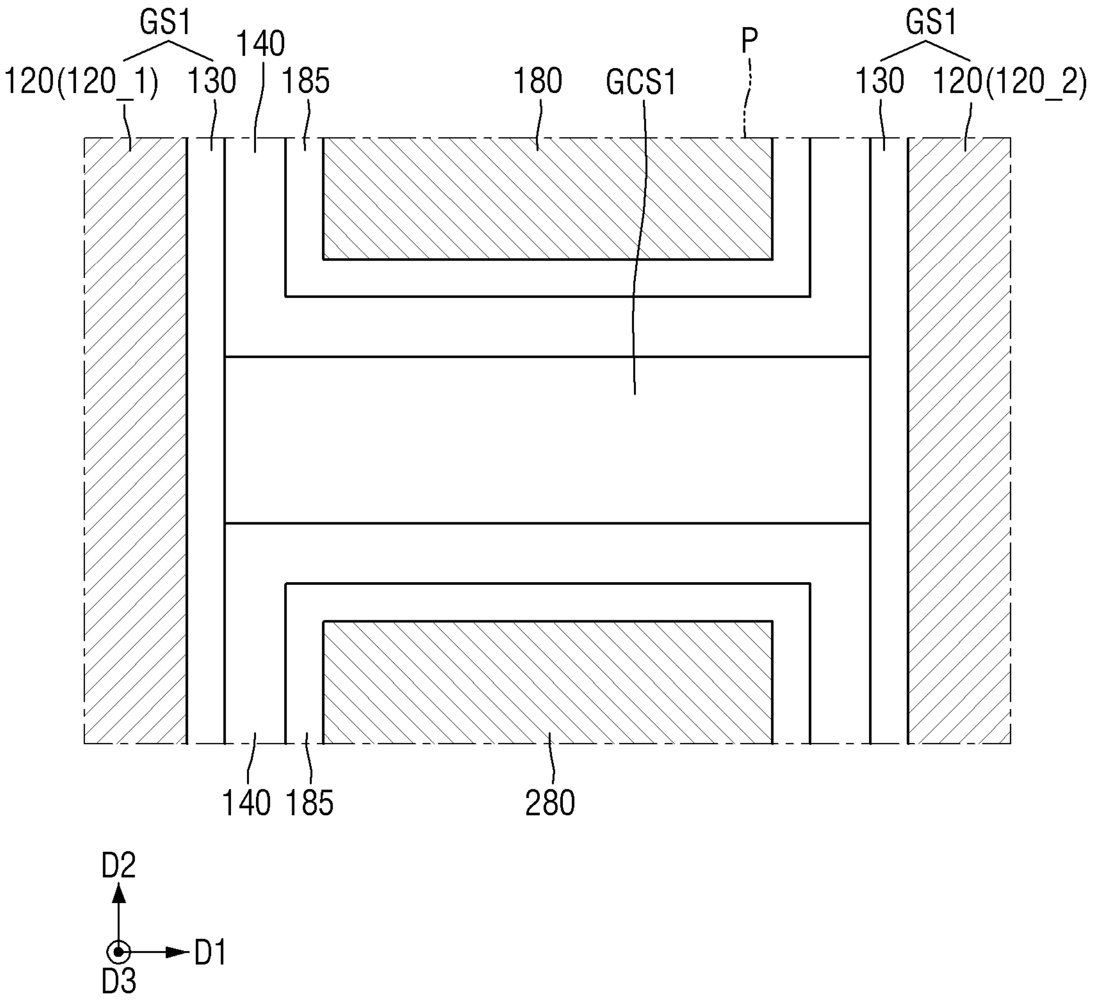
Figure 16:
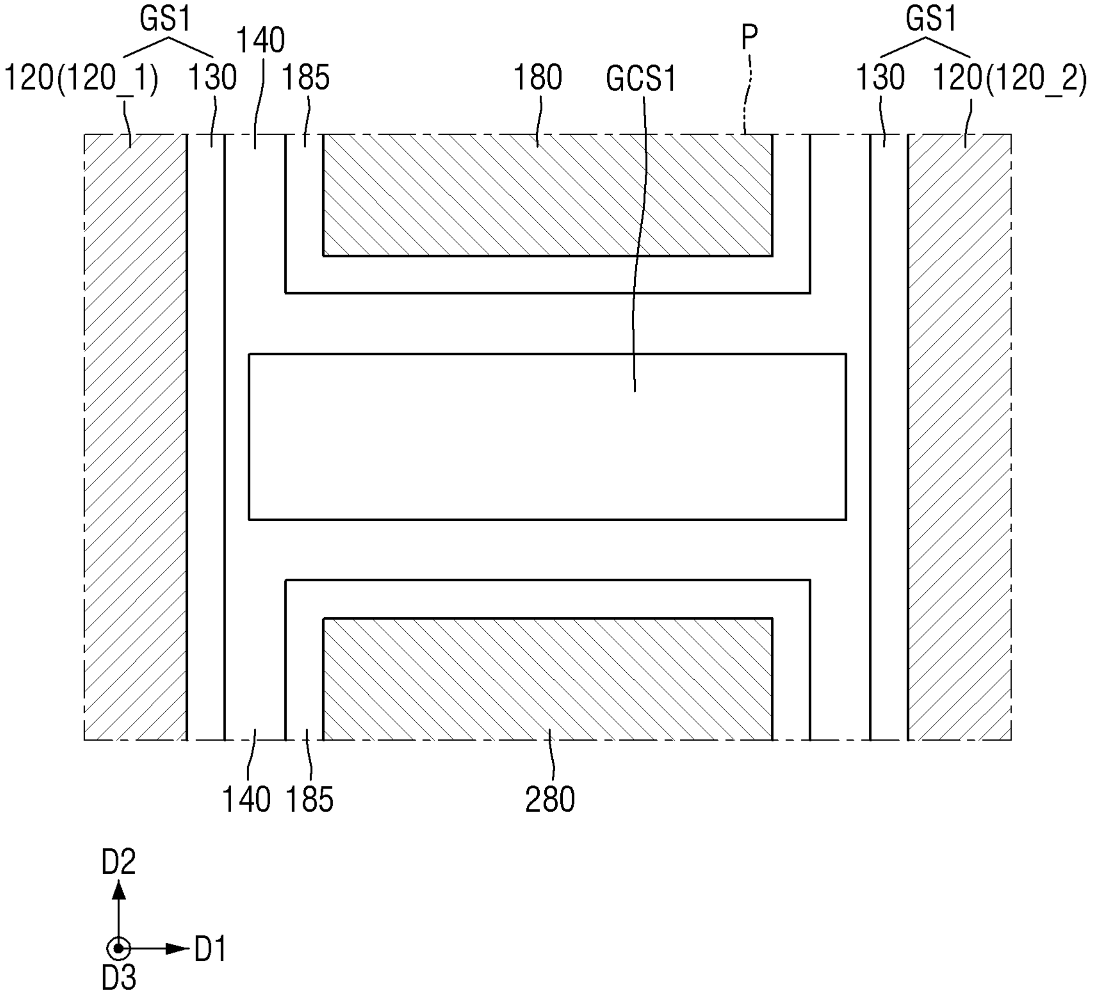

Specifically, FIGS. 13 and 14 are cross-sectional views taken along lines D-D and E-E, respectively, of the device shown in FIG. 1. FIGS. 15 and 16 are plan views of region P of the device shown in FIG. 1.

Referring to FIGS. 13 through 16, first gate electrodes 120 may not be in contact with first gate separation structures GCS1.

Each of the first gate separation structures GCS1 may have first sidewalls that are opposite to each other in a first direction D1, and first gate insulating films 130 may extend along the first sidewalls of their corresponding first gate separation structures GCS1. The first gate insulating films 130 may extend along boundaries between the first gate separation structures GCS1 and the first gate electrodes 120.

Each of first and second connection gate electrodes 120_1 and 120_2 may include only a first gate electrode line portion (e.g., 120L in FIG. 11), which extends in a second direction D2. Each of the first and second connection gate electrodes 120_1 and 120_2 may not include a first gate electrode protrusion portion (e.g., "120P" of FIG. 11), which protrudes from the first gate electrode line portion 120L in the first direction D1. The sidewalls of the first gate separation structures GCS1 that face first gate structures GS1 may appear as straight lines in a plan view.

Referring to FIG. 15, the first gate structures GS1 may be in contact with a first gate separation structure GCS1. For example, the first gate insulating films 130 may be in contact with the first gate separation structure GCS1.

Referring to FIG. 16, parts of first gate spacers 140 may be disposed between the first gate structure GS1 and the first and second connection gate structures 120_1 and 120_2. The first and second connection gate structures 120_1 and 120_2 may not be in contact with the first gate separation structure GCS1. The first gate spacers 140 may include first portions and second portions. The first portions of the first gate spacers 140 overlap with the first gate separation structure GCS1 in the first direction D1. The second portions of the first gate spacers 140 do not overlap with the first gate separation structure GCS1 in the first direction D1. The thickness of the second portions of the first gate spacers 140 in the first direction D1 may be greater than the thickness of the first portions of the first gate spacers 140 in the first direction D1.

Referring to FIG. 13, a field insulating film 105 may include protrusion portions 105_PI. The protrusion portions 105_PI of the field insulating film 105 may extend in the third direction D3, perpendicular to and away from a first substrate 100. The protrusion portions 105_PI of the field insulating film 105 may be formed during the formation of pre-source/drain recesses ("150R_P" and "250R_P" of FIG. 73). The first gate spacers 140, which extend in the first direction D1 along the first gate separation structures GCS1, may be disposed on the protrusion portions 105_PI of the field insulating film 105. Source/drain etch stopper films 185 may cover the sidewalls of the protrusion portions 105_PI of the field insulating film 105.

Figure 17:
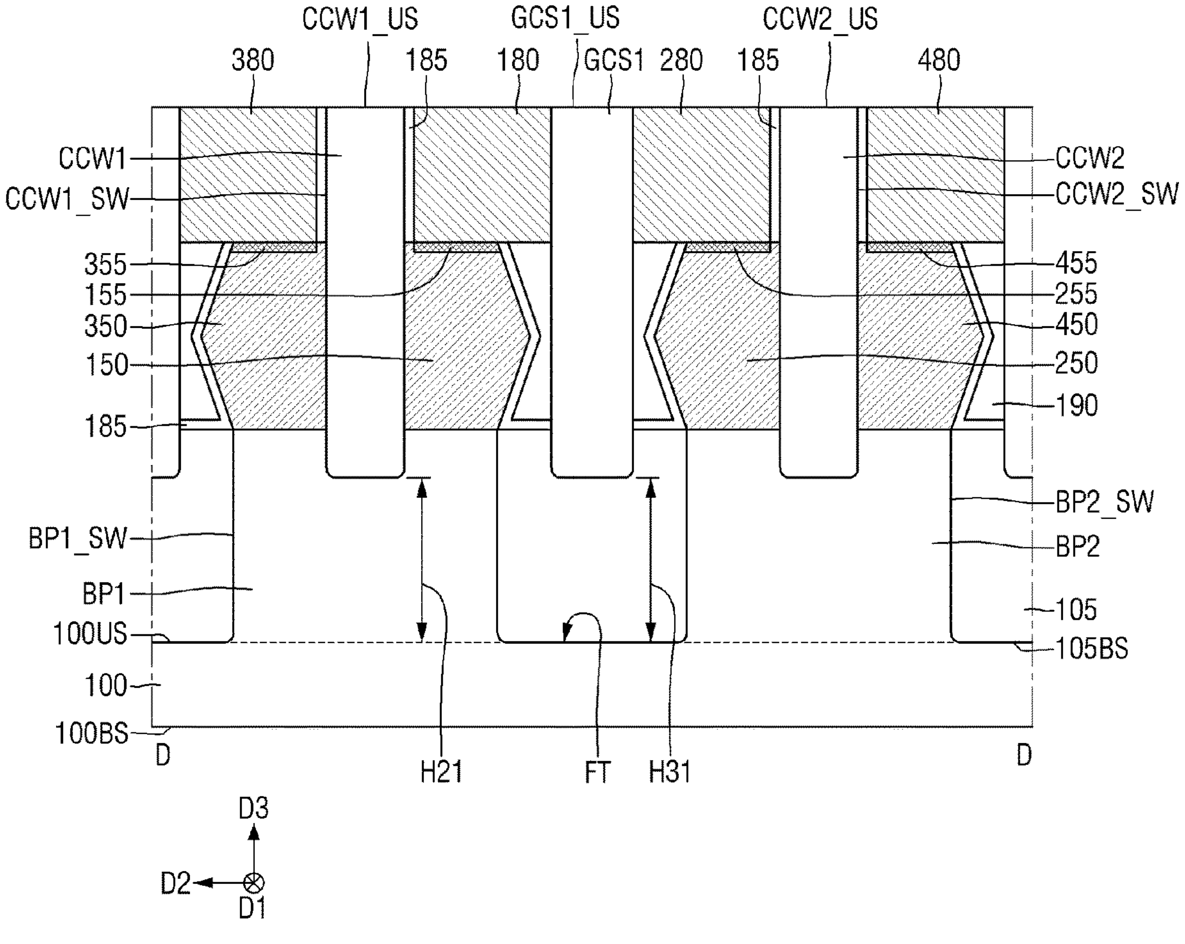
FIGS. 17 and 18 are cross-sectional views of semiconductor devices according to some embodiments of the present disclosure.
Figure 18:
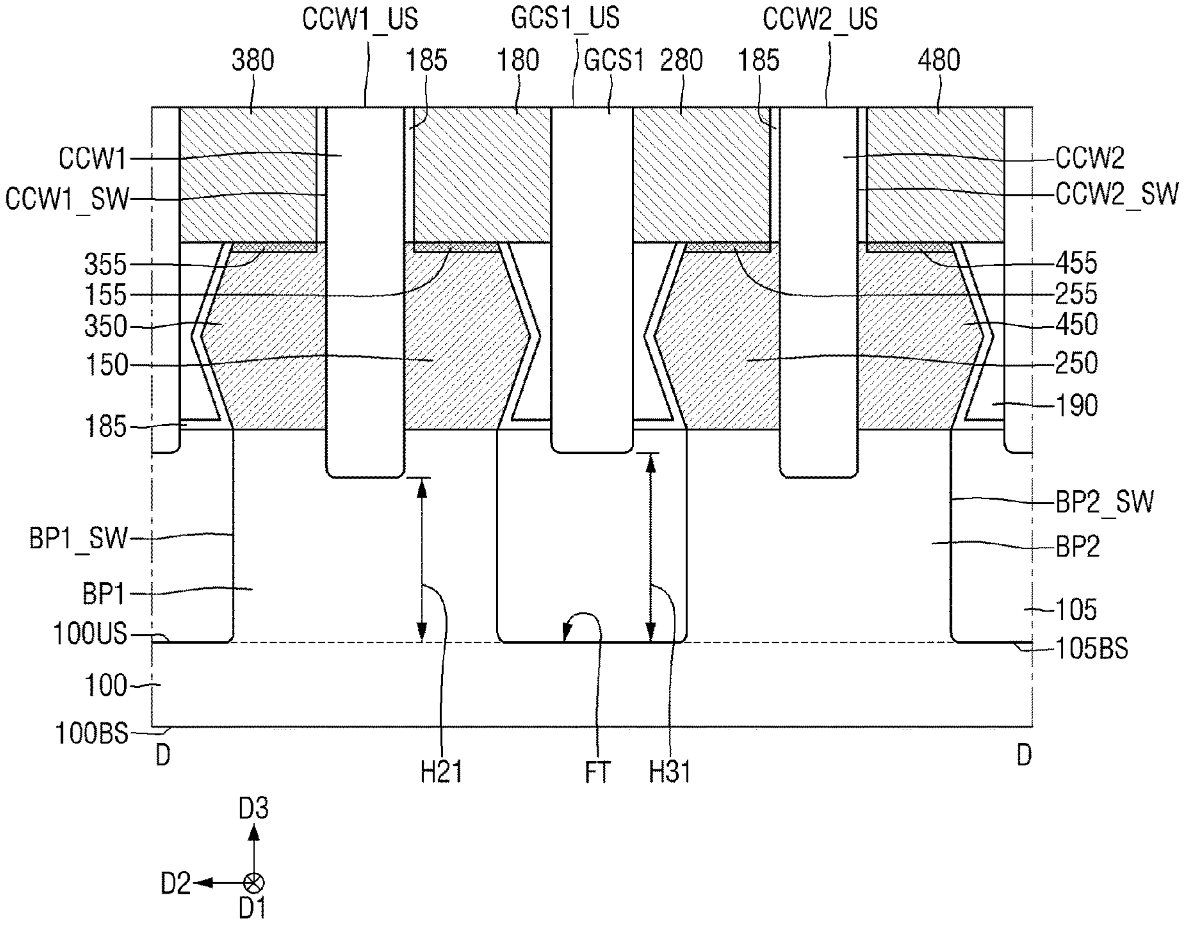

FIGS. 17 and 18 are cross-sectional views of semiconductor devices according to some embodiments of the present disclosure. For convenience, the embodiments of FIGS. 17 and 18 will hereinafter be described, highlighting the differences with the embodiment of FIGS. 1 through 12.

Referring to FIG. 17, the height of a first channel separation structure CCW1 may be the same as the height of a first gate separation structure GCS1.

A height H31 from a bottom surface 105BS of a field insulating film 105 to a lowermost part of the first gate separation structure GCS1 may be the same as a height H21 from the bottom surface 105BS of the field insulating film 105 to a lowermost part of the first channel separation structure CCW1.

Referring to FIG. 18, the height of a first channel separation structure CCW1 may be greater than the height of a first gate separation structure GCS1.

A height H31 from a bottom surface 105BS of a field insulating film 105 to a lowermost part of the first gate separation structure GCS1 may be greater than a height H21 from the bottom surface 105BS of the field insulating film 105 to a lowermost part of the first channel separation structure CCW1.

Figure 19:
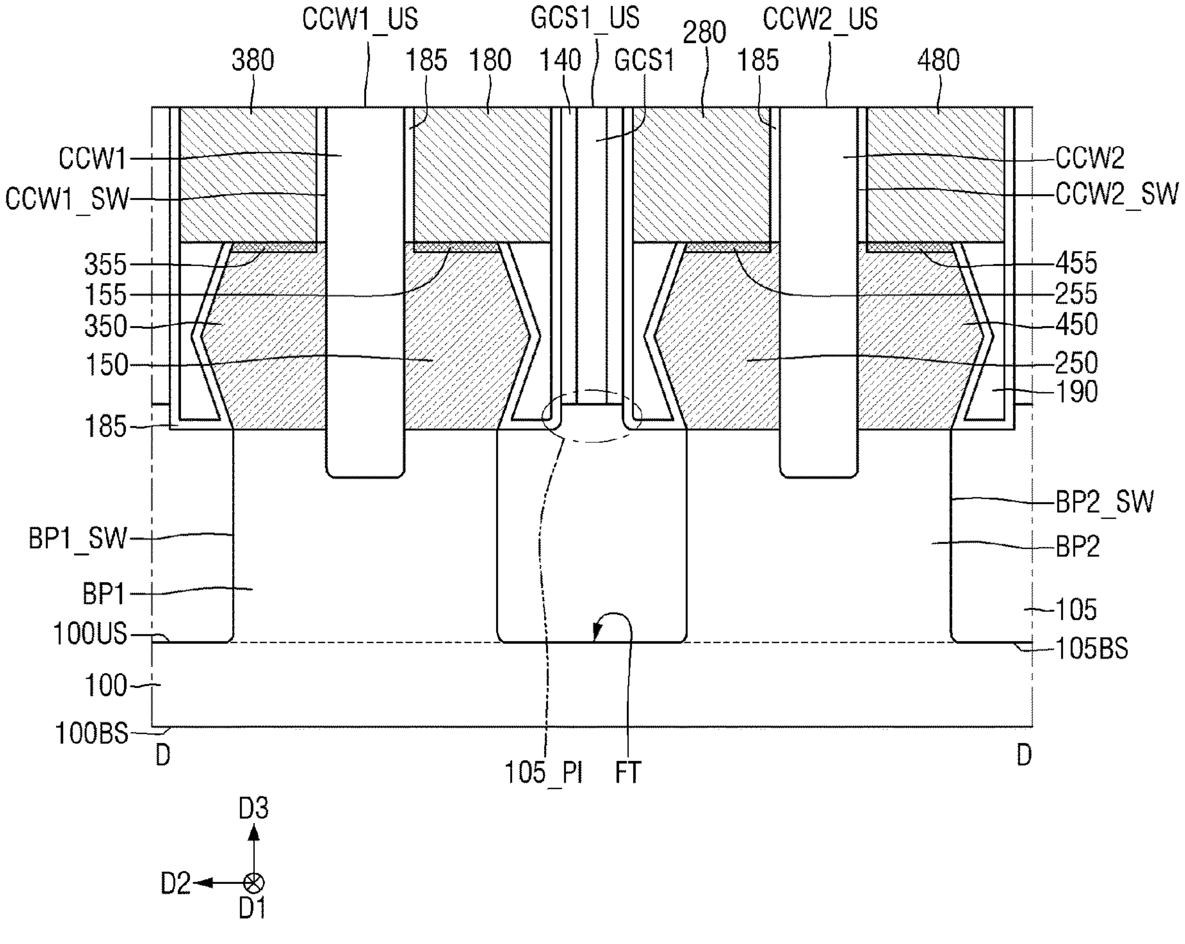
FIG. 19 is a cross-sectional view of a semiconductor device according to some embodiments of the present disclosure.

FIG. 19 is a cross-sectional view of a semiconductor device according to some embodiments of the present disclosure. For convenience, the embodiment of FIG. 19 will hereinafter be described, highlighting the differences with the embodiment of FIGS. 13 through 16.

Referring to FIG. 19, a first gate separation structure GCS1 may be disposed on protrusion portions 105_PI of a field insulating film 105.

The first gate separation structure GCS1 may not be recessed into the field insulating film 105. First gate spacers 140, which extend in a first direction D1 along the first gate separation structure GCS1, may be disposed on the protrusion portions 105_PI of the field insulating film 105.

Figure 20:
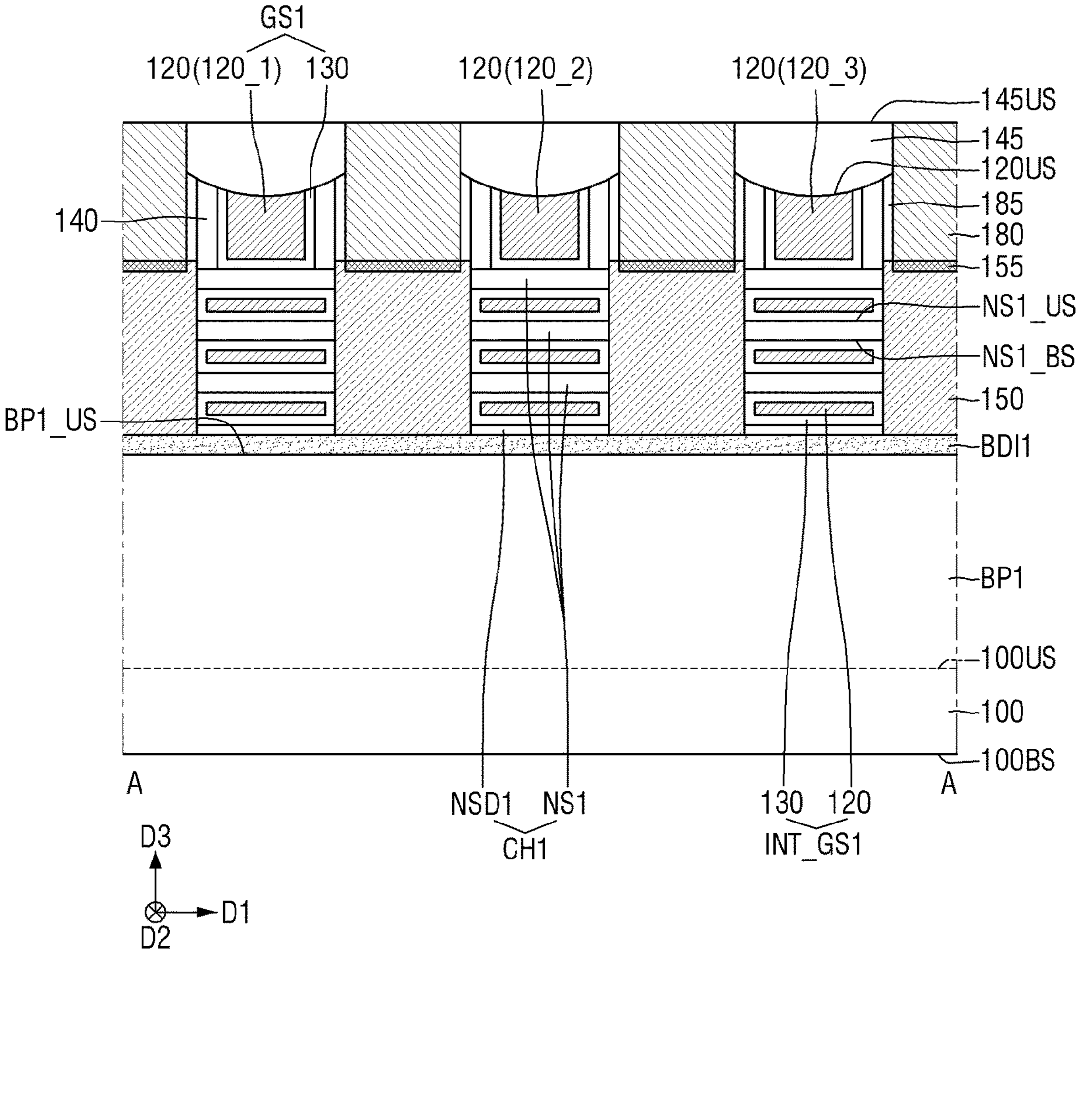
FIGS. 20 through 22 are cross-sectional views of a semiconductor device according to some embodiments of the present disclosure.
Figure 21:
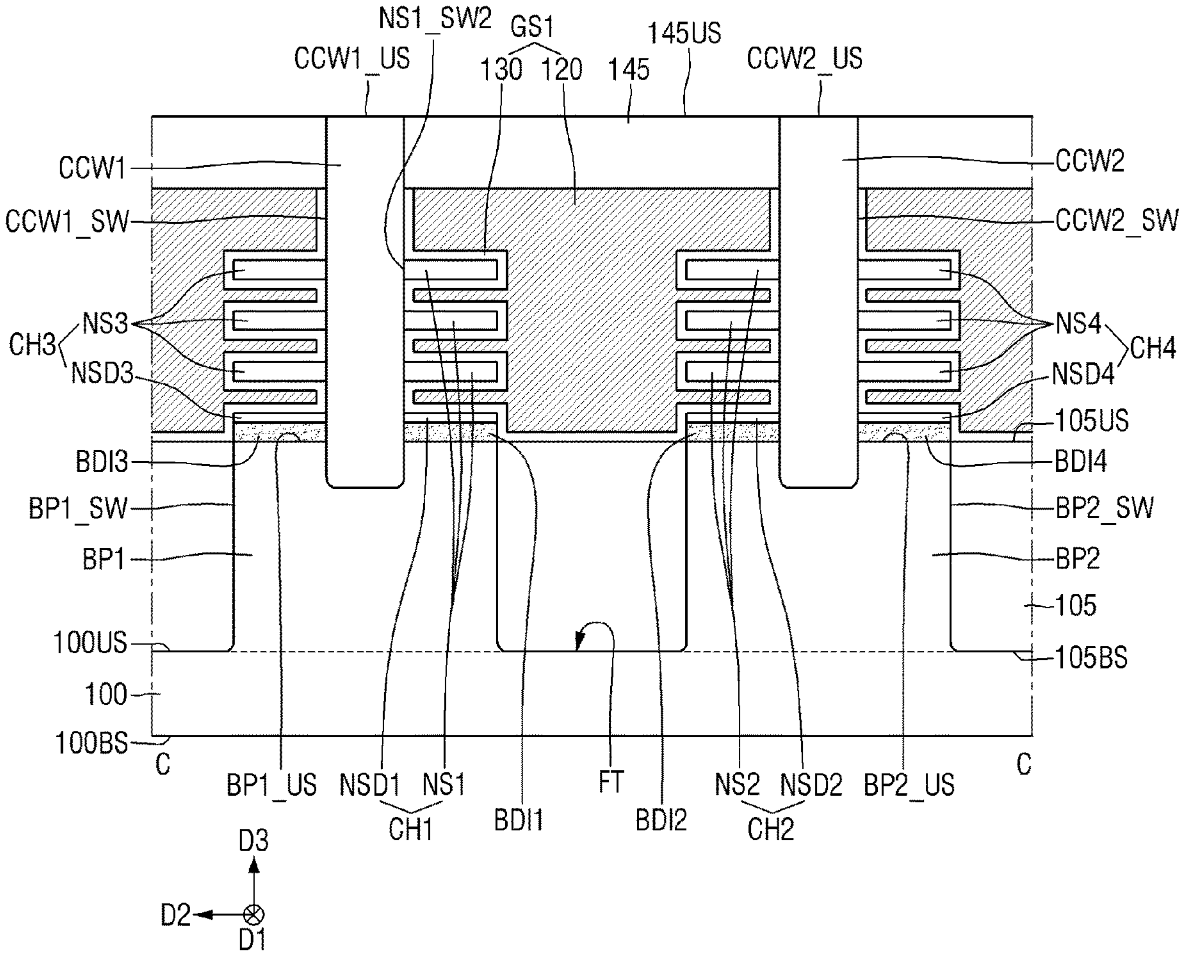
Figure 22:
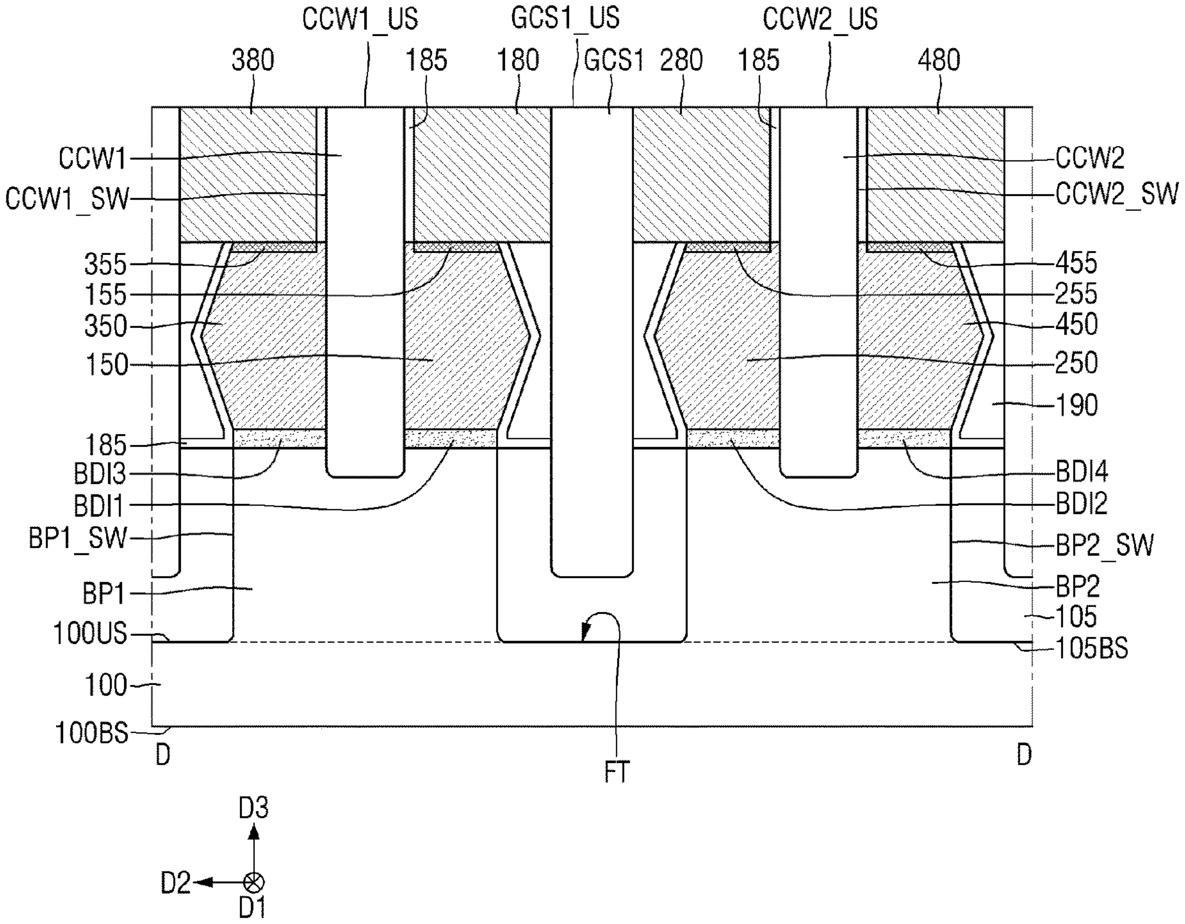

FIGS. 20 through 22 are cross-sectional views of a semiconductor device according to some embodiments of the present disclosure. For convenience, the embodiment of FIGS. 20 through 22 will hereinafter be described, highlighting the differences with the embodiment of FIGS. 1 through 12.

Referring to FIGS. 20 through 22, the semiconductor device according to some embodiments of the present disclosure may further include first, second, third, and fourth lower insulating patterns BDI1, BDI2, BDI3, and BDI4.

The first lower insulating pattern BDI1 may be disposed between a first lower pattern BP1 and a first channel pattern CH1 in the third direction D3. The first lower insulating pattern BDI1 may be in contact with an upper surface BP1_US of the first lower pattern BP1. The first lower insulating pattern BDI1 may extend in the first direction D1 along the upper surface BP1_US of the first lower pattern BP1.

The second lower insulating pattern BDI2 may be disposed between a second lower pattern BP2 and a second channel pattern CH2 in the third direction D3. The second lower insulating pattern BDI2 may be in contact with an upper surface BP2_US of the second lower pattern BP2. The second lower insulating pattern BDI2 may extend in the first direction D1 along the upper surface BP2_US of the second lower pattern BP2.

The third lower insulating pattern BDI3 may be disposed between the first lower pattern BP1 and a third channel pattern CH3 in the third direction D3. The third lower insulating pattern BDI3 may be in contact with the upper surface BP1_US of the first lower pattern BP1. The third lower insulating pattern BDI3 may extend in the first direction D1 along the upper surface BP1_US of the first lower pattern BP1.

The fourth lower insulating pattern BDI4 may be disposed between the second lower pattern BP2 and a fourth channel pattern CH4 in the third direction D3. The fourth lower insulating pattern BDI4 may be in contact with the upper surface BP2_US of the second lower pattern BP2. The fourth lower insulating pattern BDI4 may extend in the first direction D1 along the upper surface BP2_US of the second lower pattern BP2.

The first lower insulating pattern BDI1 may be spaced apart from the third lower insulating pattern BDI3 in a second direction D2. A first channel separation structure CCW1 may separate the first and third lower insulating patterns BDI1 and BDI3.

The second lower insulating pattern BDI2 may be spaced apart from the fourth lower insulating pattern BDI4 in the second direction D2. A second channel separation structure CCW2 may separate the second and fourth lower insulating patterns BDI2 and BDI4.

The first, second, third, and fourth lower insulating patterns BDI1, BDI2, BDI3, and BDI4 may not extend along an upper surface 105US of a field insulating film 105. The first, second, third, and fourth lower insulating patterns BDI1, BDI2, BDI3, and BDI4 may not cover the upper surface 105US of the field insulating film 105.

The first, second, third, and fourth lower insulating patterns BDI1, BDI2, BDI3, and BDI4 may include at least one of, for example, SiN, SiON, SiCN, and SiOCN. Alternatively, the first, second, third, and fourth lower insulating patterns BDI1, BDI2, BDI3, and BDI4 may include $SiO_2$.

The first channel pattern CH1 may further include first sheet patterns NS1 and a first dummy sheet pattern NSD1, which is disposed between the first lower insulating pattern BDI1 and the first sheet patterns NS1 in the third direction D3. The first dummy sheet pattern NSD1 may be in contact with the first lower insulating pattern BDI1.

The second channel pattern CH2 may further include second sheet patterns NS2 and a second dummy sheet pattern NSD2, which is disposed between the second lower insulating pattern BDI2 and the second sheet patterns NS2 in the third direction D3. The second dummy sheet pattern NSD2 may be in contact with the second lower insulating pattern BDI2.

The third channel pattern CH3 may further include third sheet patterns NS3 and a third dummy sheet pattern NSD3, which is disposed between the third lower insulating pattern BDI3 and the third sheet patterns NS3 in the third direction D3. The third dummy sheet pattern NSD3 may be in contact with the third lower insulating pattern BDI3.

The fourth channel pattern CH4 may further include fourth sheet patterns NS4 and a fourth dummy sheet pattern NSD4, which is disposed between the fourth lower insulating pattern BDI4 and the fourth sheet patterns NS4 in the third direction D3. The fourth dummy sheet pattern NSD4 may be in contact with the fourth lower insulating pattern BDI4.

The thickness of the first, second, third, and fourth dummy sheet patterns NSD1, NSD2, NSD3, and NSD4 in the third direction D3 may be less than the thickness of the first sheet patterns NS1, the second sheet patterns NS2, the third sheet patterns NS3, and the fourth sheet patterns NS4 in the third direction D3. The first, second, third, and fourth dummy sheet patterns NSD1, NSD2, NSD3, and NSD4 may include the same material as the first sheet patterns NS1, the second sheet patterns NS2, the third sheet patterns NS3, and the fourth sheet patterns NS4, although embodiments are not limited thereto.

The first lower insulating pattern BDI1 may have an upper and a bottom surface that are opposite to each other in the third direction D3. The bottom surface of the first lower insulating pattern BDI1 may be in contact with the upper surface BP1_US of the first lower pattern BP1. The upper surface of the first lower insulating pattern BDI1 may be higher than the upper surface 105US of the field insulating film 105 with respect to a bottom surface 105BS of the field insulating film 105. The upper surface of the first lower insulating pattern BDI1 may protrude beyond an upper surface 105US of the field insulating film 105. As the first dummy sheet pattern NSD1 is in contact with the upper surface of the first lower insulating pattern BDI1, first gate insulating films 130 may not be in contact with the upper surface of the first lower insulating pattern BDI1.

First source/drain patterns 150 may be in contact with the first dummy sheet pattern NSD1 and the first sheet patterns NS1. The first source/drain patterns 150 may be in contact with the first lower insulating pattern BDI1. The first source/drain patterns 150 may not be in contact with the first lower pattern BP1.

Second source/drain patterns 250 may be in contact with the second dummy sheet pattern NSD2 and the second sheet patterns NS2. The second source/drain patterns 250 may be in contact with the second lower insulating pattern BDI2. The second source/drain patterns 250 may not be in contact with the second lower pattern BP2.

Third source/drain patterns 350 may be in contact with the third dummy sheet pattern NSD3 and the third sheet patterns NS3. The third source/drain patterns 350 may be in contact with the third lower insulating pattern BDI3. The third source/drain patterns 350 may not be in contact with the first lower pattern BP1.

Fourth source/drain patterns 450 may be in contact with the fourth dummy sheet pattern NSD4 and the fourth sheet patterns NS4. The fourth source/drain patterns 450 may be in contact with the fourth lower insulating pattern BDI4. The fourth source/drain patterns 450 may not be in contact with the second lower pattern BP2.

Figure 23:
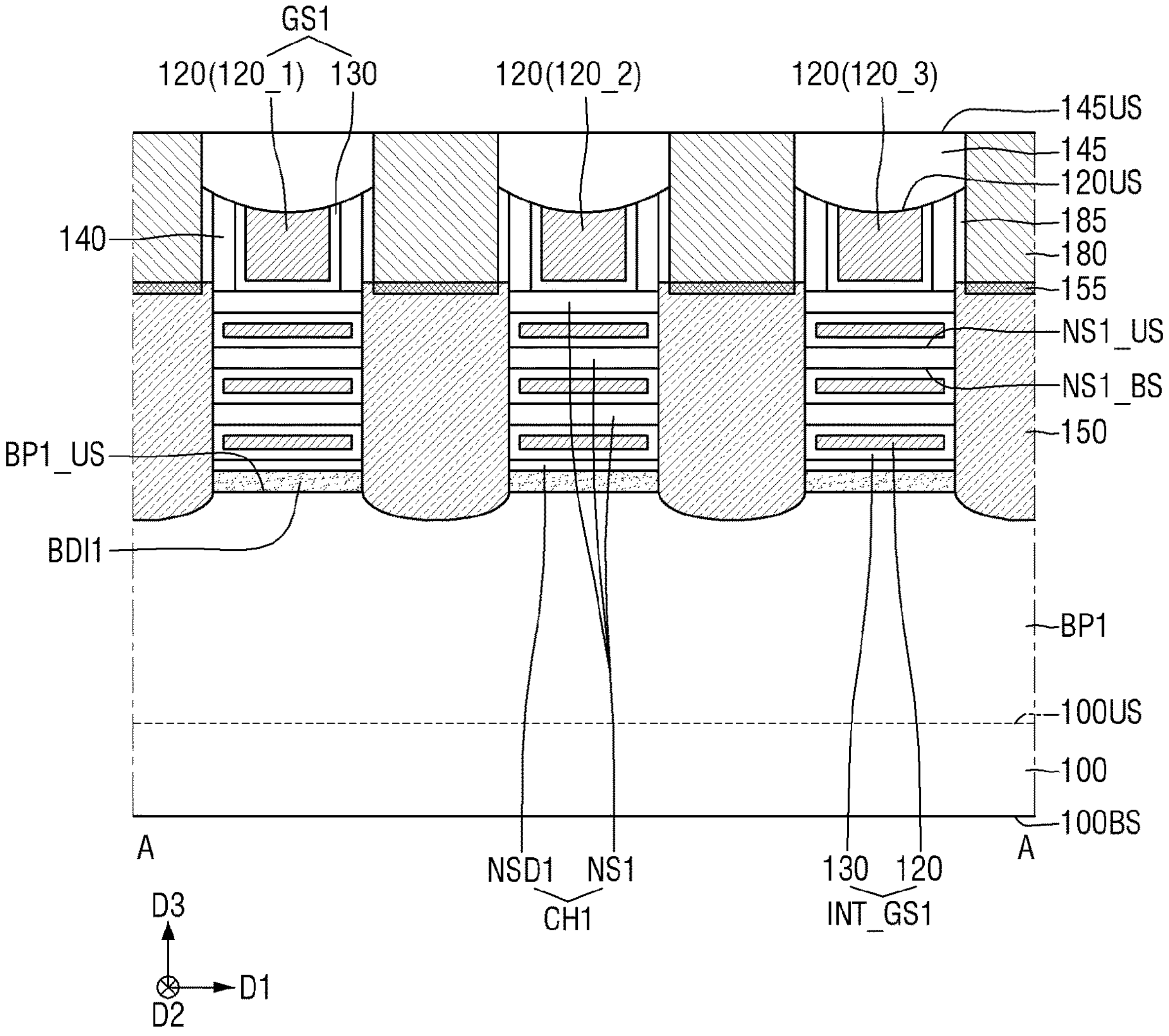
FIG. 23 is a cross-sectional view of a semiconductor device according to some embodiments of the present disclosure.
Figure 24:
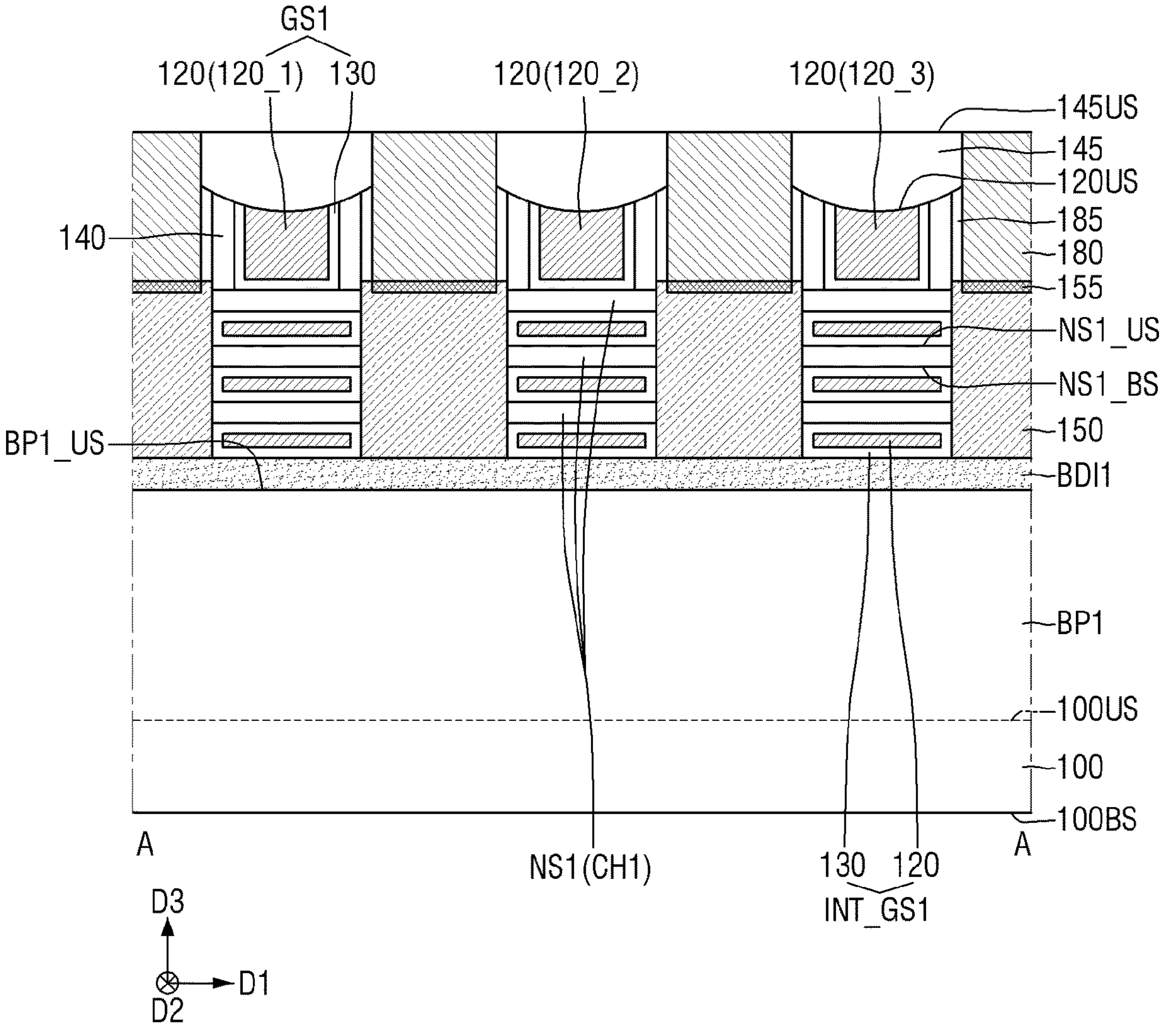
FIGS. 24 and 25 are cross-sectional views of a semiconductor device according to some embodiments of the present disclosure.
Figure 25:
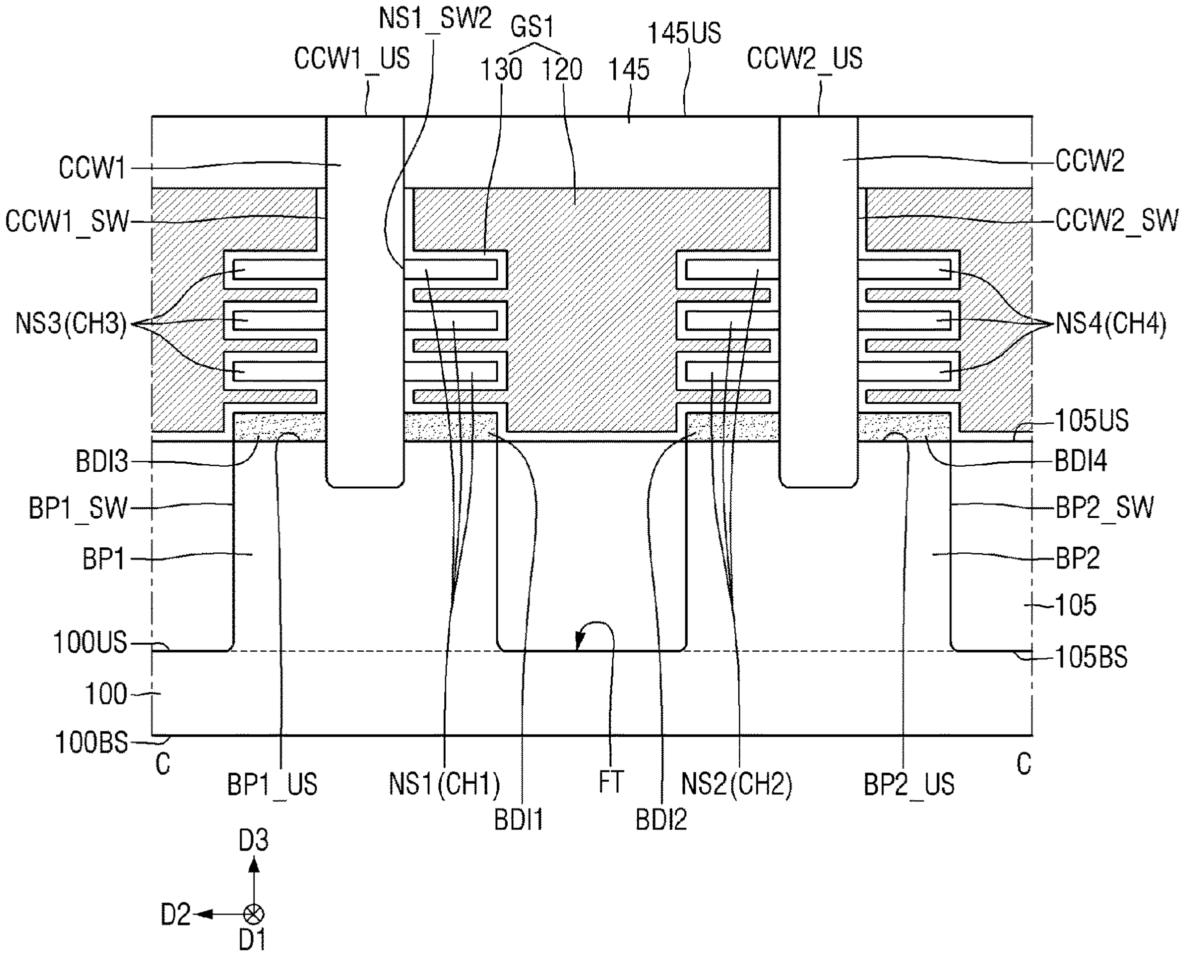
Figure 26:
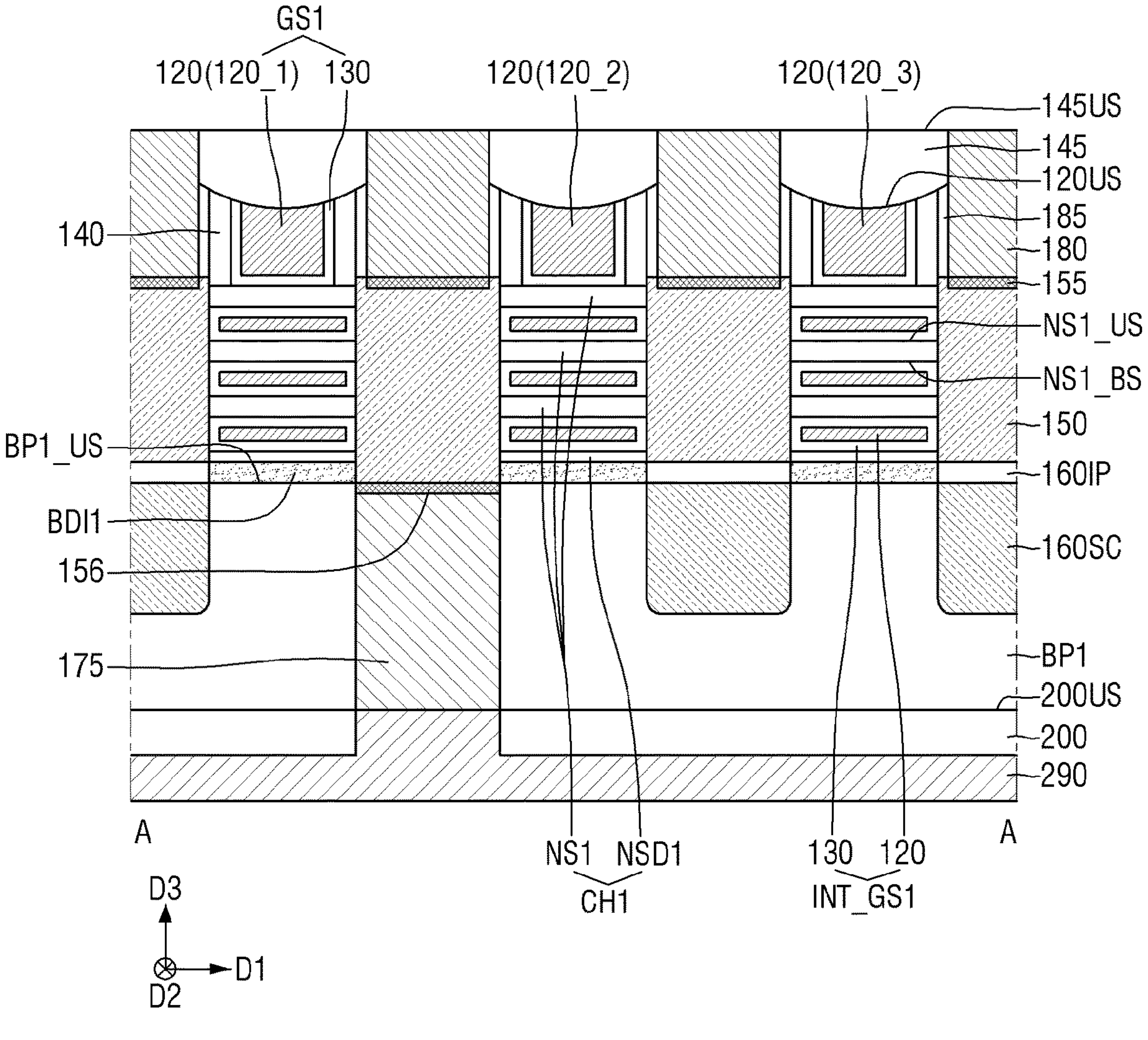
FIGS. 26 and 27 are cross-sectional views of a semiconductor device according to some embodiments of the present disclosure.
Figure 27:
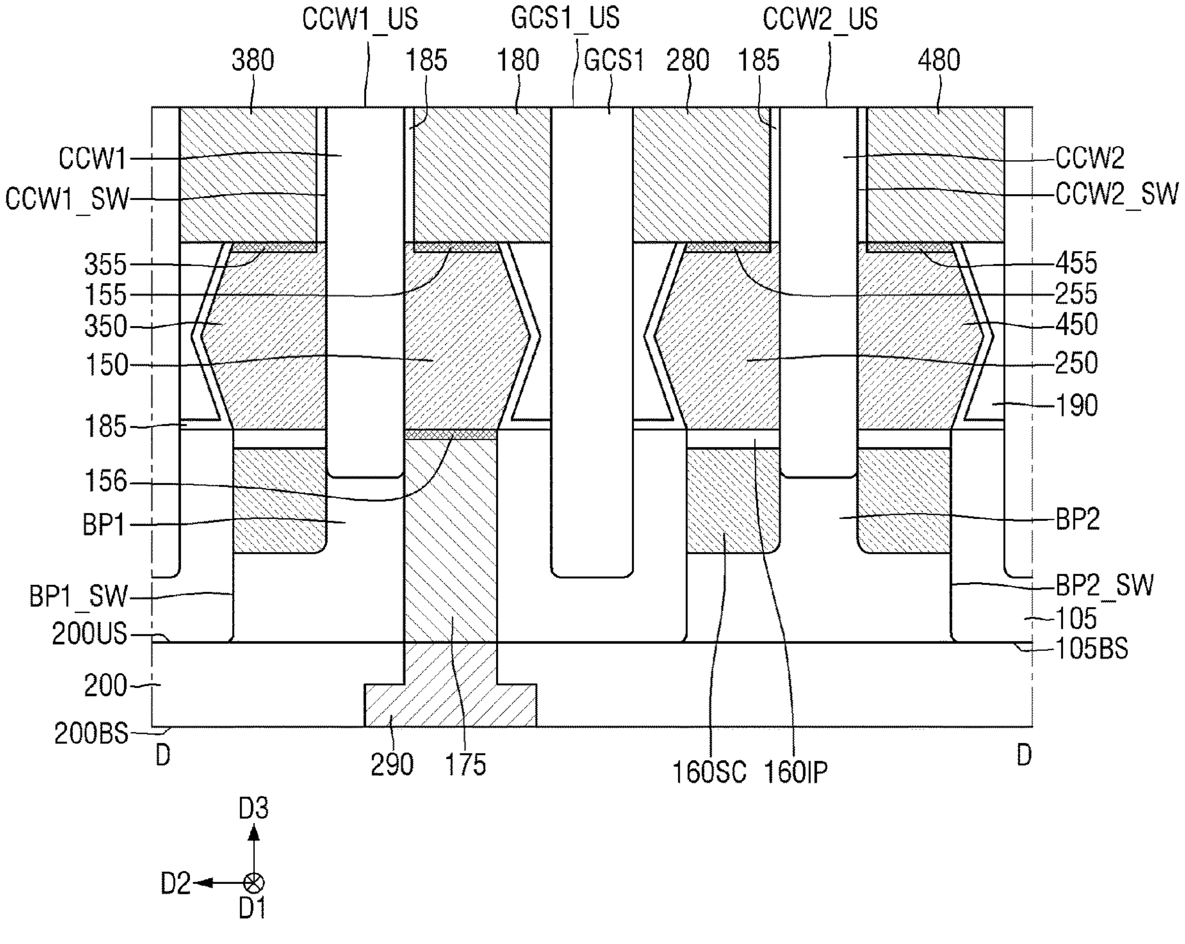

FIG. 23 is a cross-sectional view of a semiconductor device according to some embodiments of the present disclosure. FIGS. 24 and 25 are cross-sectional views of a semiconductor device according to some embodiments of the present disclosure. FIGS. 26 and 27 are cross-sectional views of a semiconductor device according to some embodiments of the present disclosure. For convenience, the embodiments of FIGS. 23 through 27 will hereinafter be described, highlighting the differences with the embodiment of FIGS. 20 through 22.

Referring to FIG. 23, first source/drain patterns 150 may penetrate (i.e., extend into) first lower insulating patterns BDI1.

The first source/drain patterns 150 may be in contact with the first lower insulating patterns BDI1 and a first lower pattern BP1.

As the first lower insulating patterns BDI1 are separated from one another by the first source/drain patterns 150, a plurality of first lower insulating patterns BDI1 may be disposed on an upper surface BP1_US of a first lower pattern BP1. The first lower insulating patterns BDI1 may be arranged in the first direction D1. The first lower insulating patterns BDI1 may be positioned to overlap with first gate structures GS1 in the third direction D3.

For example, the above description of the first source/drain patterns 150 and the first lower insulating patterns BDI1 may also be applicable to second source/drain patterns 250 and second lower insulating patterns BDI2, third source/drain patterns 350 and third lower insulating patterns BDI3, and fourth source/drain patterns 450 and fourth lower insulating patterns BDI4. In another example, the above description of the first source/drain patterns 150 and the first lower insulating patterns BDI1 may also be applicable to the third source/drain patterns 350 and the third lower insulating patterns BDI3, but not to the second source/drain patterns 250 and second lower insulating patterns BDI2 and the fourth source/drain patterns 450 and the fourth lower insulating patterns BDI4.

Referring to FIGS. 24 and 25, first channel patterns CH1 do not include dummy sheet patterns ("NSD1" of FIGS. 20 and 21) between a first lower insulating pattern BDI1 and their corresponding sets of first sheet patterns NS1.

As no dummy sheet patterns are disposed between the first lower insulating pattern BDI1 and the sets of first sheet pattern NS1, first gate insulating films 130 may be in contact with the upper surface of the first lower insulating pattern BDI1.

Similarly, in this embodiment, second channel patterns CH2, third channel patterns CH3, and fourth channel patterns CH4 do not include dummy sheet patterns.

Referring to FIGS. 26 and 27, the semiconductor device according to some embodiments of the present disclosure may further include sacrificial semiconductor patterns 160SC, sacrificial pattern capping films 160IP, a rear source/drain contact 175, and a rear wiring line 290.

First and second lower patterns BP1 and BP2 may be disposed on a second substrate 200. The second substrate 200 may have first and second surfaces 200US and 200BS, respectively, which are opposite to each other in the third direction D3. The first and second lower patterns BP1 and BP2 may be disposed on the first surface 200US, which may be an upper surface of the second substrate 200.

The second substrate 200 may include an insulating material, such as at least one of silicon oxide, silicon nitride, and a combination thereof. The second substrate 200 may be a substrate formed by a deposition process after the removal of the first substrate 100 of FIGS. 2 through 6.

The field insulating film 105 may be in contact with the second substrate 200. The bottom surface 105BS of the field insulating film 105 faces the second substrate 200.

The sacrificial semiconductor patterns 160SC may be disposed in the first and second lower patterns BP1 and BP2. The sacrificial semiconductor patterns 160SC may be disposed between the second substrate 200 and first source/drain patterns 150, second source/drain patterns 250, third source/drain patterns 350, and fourth source/drain patterns 450. The sacrificial semiconductor patterns 160SC may overlap with the first source/drain patterns 150, the second source/drain patterns 250, the third source/drain patterns 350, and the fourth source/drain patterns 450 in the third direction D3.

The sacrificial pattern capping films 160IP may be disposed between the first source/drain patterns 150 and the sacrificial semiconductor patterns 160SC and between the second source/drain patterns 250 and the sacrificial semiconductor patterns 160SC. The sacrificial pattern capping films 160IP may be disposed between the third source/drain patterns 350 and the sacrificial semiconductor patterns 160SC and between the fourth source/drain patterns 450 and the sacrificial semiconductor patterns 160SC.

The sacrificial semiconductor patterns 160SC may include a material with etch selectivity with respect to the first and second lower patterns BP1 and BP2. In a case where the first and second lower patterns BP1 and BP2 are Si patterns, the sacrificial semiconductor patterns 160SC may include SiGe. The sacrificial pattern capping films 160IP may include an insulating material.

The rear wiring line 290 may be disposed in the second substrate 200. The rear wiring line 290 may include a line portion and a via portion. The line portion of the rear wiring line 290 is illustrated as extending in a first direction D1, but the present disclosure is not limited thereto. The via portion of the rear wiring line 290 may extend upwardly from the line portion of the rear wiring line 290 in the third direction D3. Contrary to what is depicted, the rear wiring line 290 may not include the via portion.

The rear source/drain contact 175 may be disposed between the first source/drain patterns 150 and the rear wiring line 290. The rear source/drain contact 175 electrically connects the first source/drain contacts 150 and the rear wiring line 290.

The rear source/drain contact 175 is illustrated as being connected to some of the first source/drain patterns 150, but the present disclosure is not limited thereto. Although not explicitly depicted, the rear source/drain contact 175 may be connected to the second source/drain patterns 250, the third source/drain patterns 350, and the fourth source/drain patterns 450.

A rear contact silicide film 156 may be disposed between the rear source/drain contact 175 and the first source/drain patterns 150.

The rear source/drain contact 175 and the rear wiring line 290 are illustrated as being single conducive films, but the present disclosure is not limited thereto. Although not explicitly depicted, at least one of the rear source/drain contact 175 and the rear wiring line 290 may have a multilayer conductive film structure including a barrier film and a filling film. The rear source/drain contact 175 and the rear wiring line 290 may include at least one of, for example, a metal, a conductive metal nitride, a conductive metal carbide, a conductive metal oxide, a conductive metal carbonitride, and a 2D material.

Figure 28:
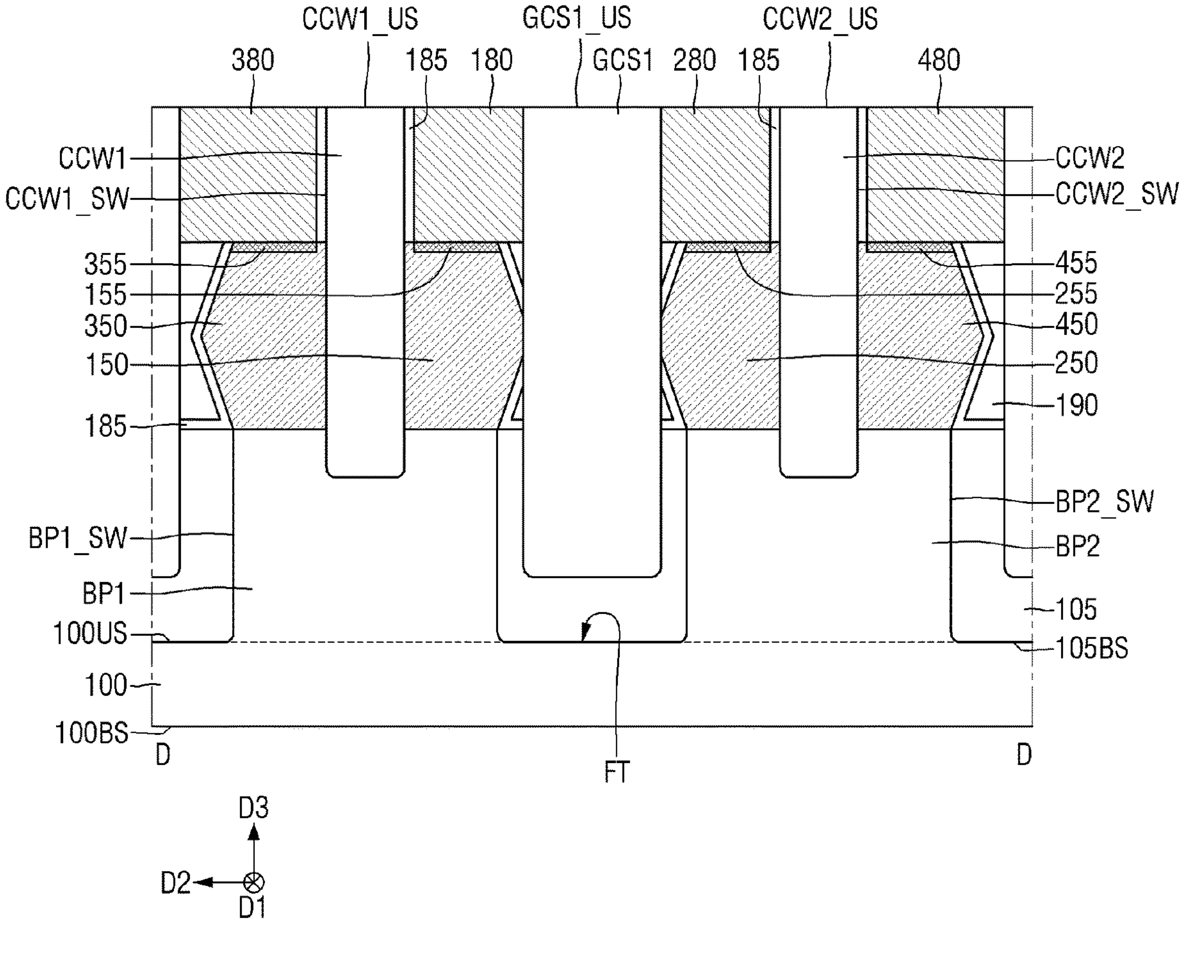
FIGS. 28 through 30 are cross-sectional views of semiconductor devices according to some embodiments of the present disclosure.
Figure 29:
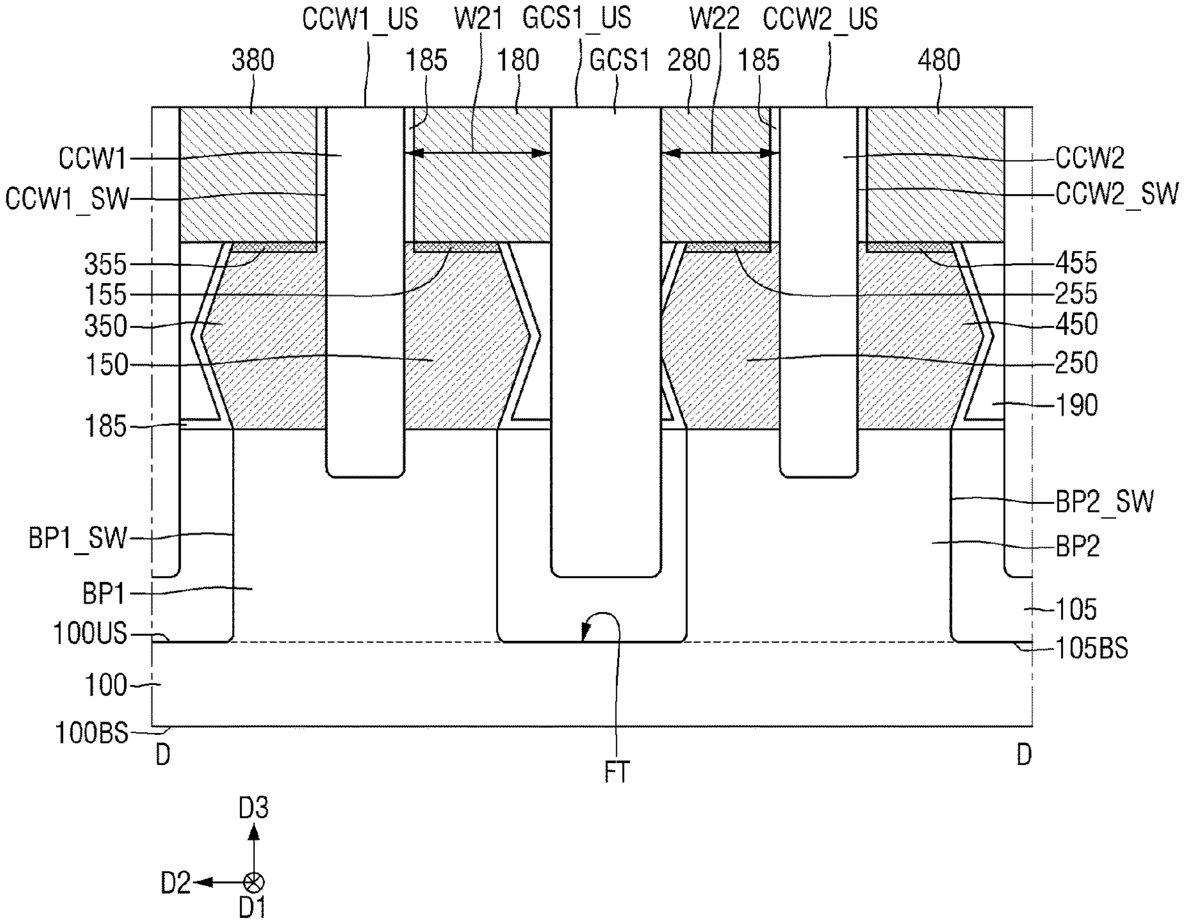
Figure 30:
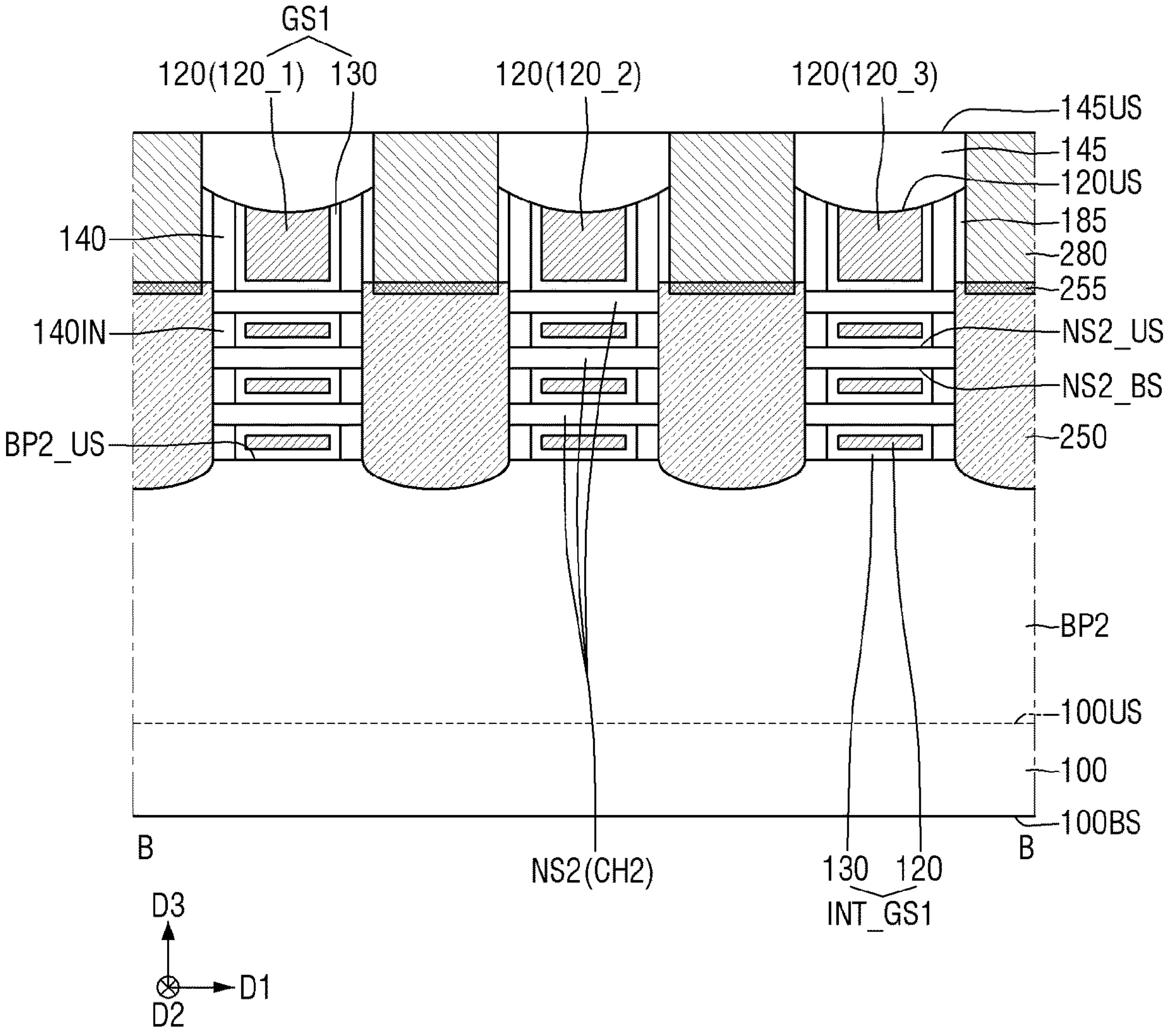

FIGS. 28 through 30 are cross-sectional views of semiconductor devices according to some embodiments of the present disclosure. For convenience, the embodiments of FIGS. 28 through 30 will hereinafter be described, highlighting the differences with the embodiment of FIGS. 1 through 12.

Referring to FIG. 28, a first gate separation structure GCS1 may be in contact with first and second source/drain patterns 150 and 250.

Source/drain etch stopper films 185 may not be disposed on a field insulating film 105 between the first source/drain pattern 150 and the first gate separation structure GCS1. The source/drain etch stopper films 185 may not be disposed between the second source/drain pattern 250 and the first gate separation structure GCS1.

Referring to FIG. 29, a distance W21 in the second direction D2 between a first gate separation structure GCS1 and a first channel separation structure CCW1 may be greater than a distance W22 in the second direction D2 between the first gate separation structure GCS1 and a second channel separation structure CCW2.

The first gate separation structure GCS1 may not be in contact with a first source/drain pattern 150. The first gate separation structure GCS1 may be in contact with a second source/drain pattern 250.

Referring to FIG. 30, the semiconductor device according to some embodiments of the present disclosure may further include inner spacers 140 IN, which are disposed between second source/drain patterns 250 and first inner gate structures INT_GS1.

The inner spacers 140 IN may be disposed between a second lower pattern BP2 and their corresponding second sheet patterns NS2 and between the corresponding second sheet patterns NS2, which are adjacent to one another in a third direction D3. The first inner gate structures INT_GS1 may not be in contact with the second source/drain patterns 250.

The inner spacers 140 IN may include at least one of, for example, SiN, SiON, $SiO_2$, SiOCN, SiBN, SiOBN, SiOC, and a combination thereof.

Figure 31:
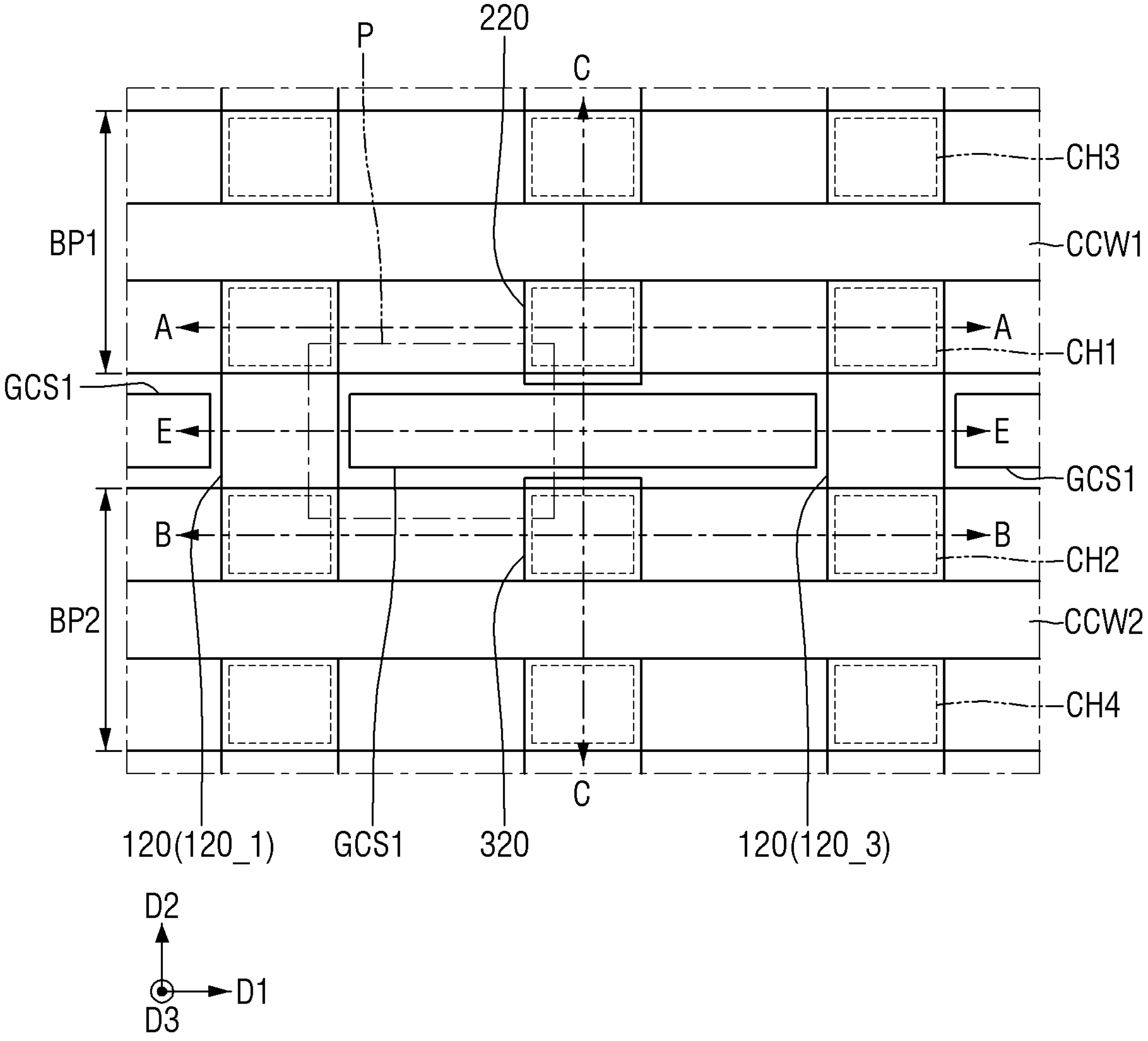
FIG. 31 is a layout view of a semiconductor device according to some embodiments of the present disclosure.
Figure 32:
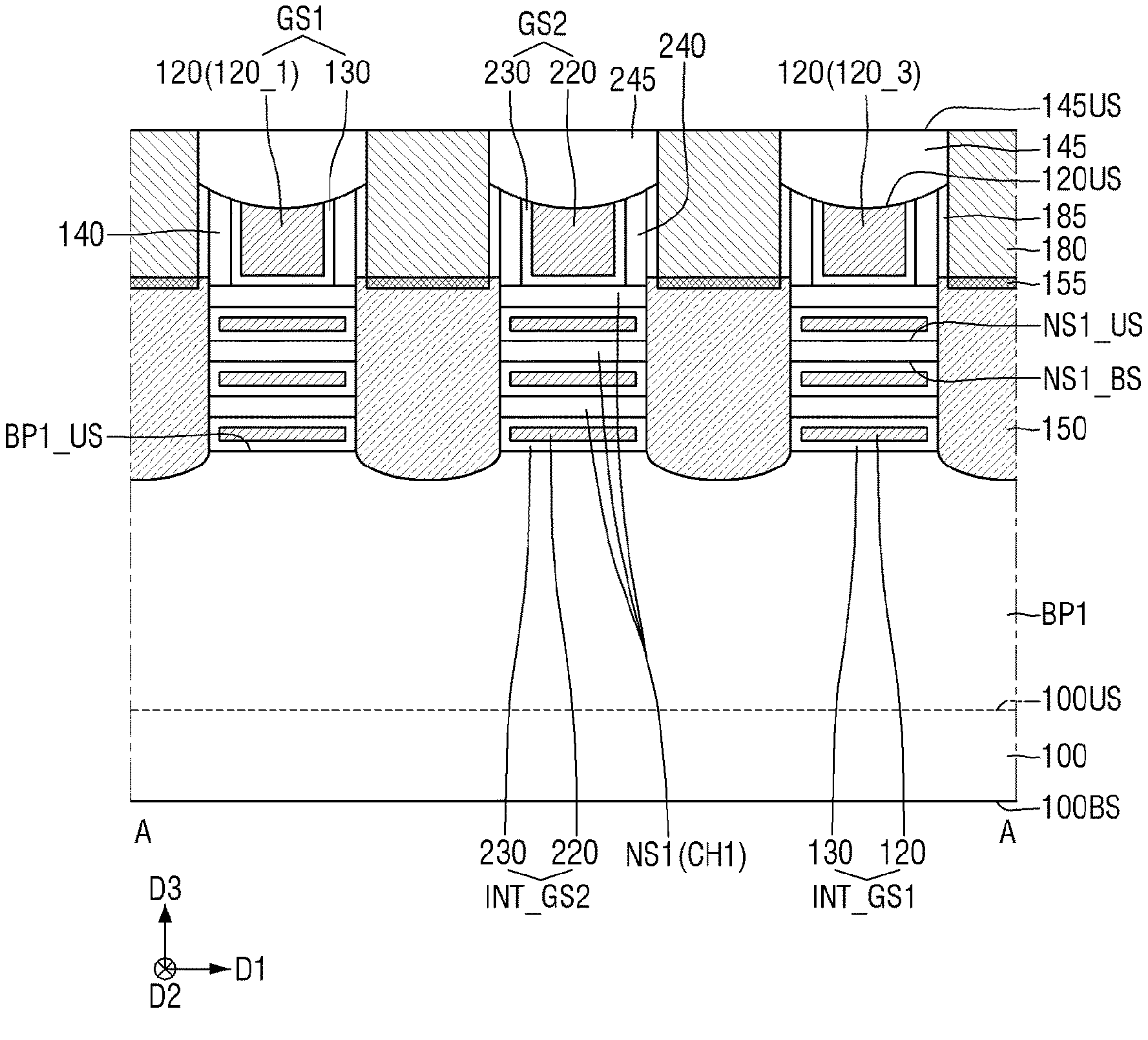
FIGS. 32 through 35 are cross-sectional views taken along lines A-A, B-B, C-C, and E-E, respectively, of FIG. 31.
Figure 33:
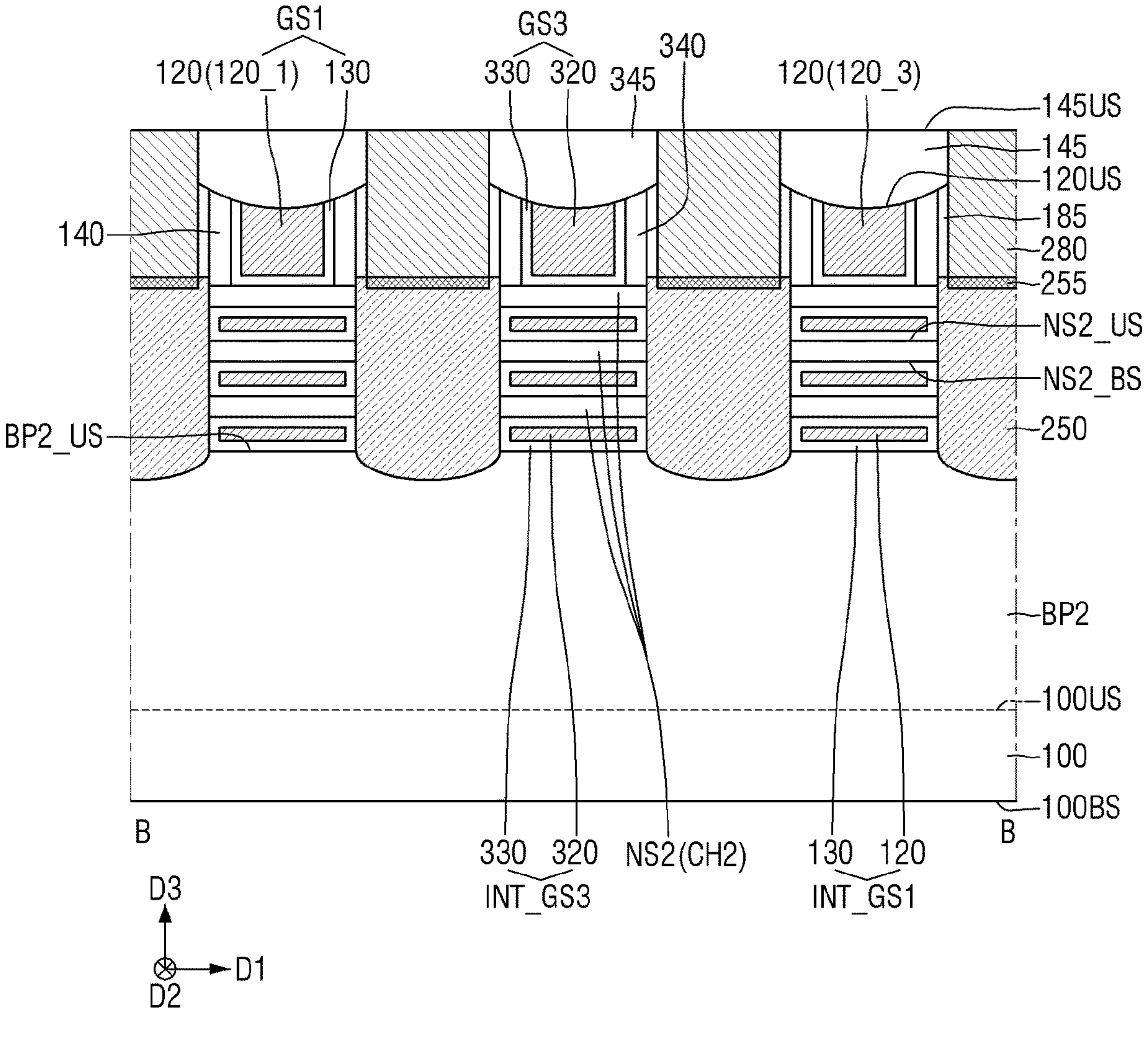
Figure 34:
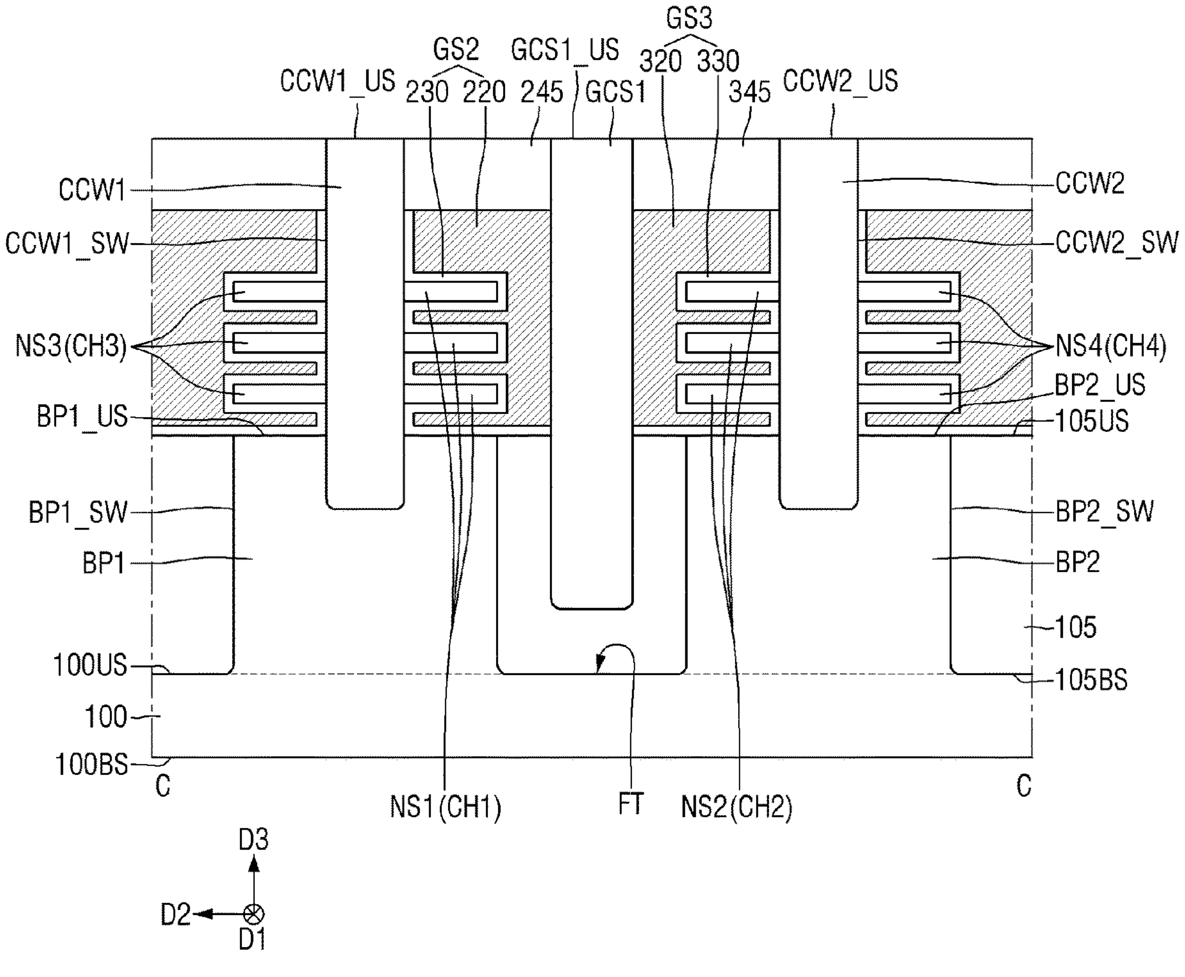
Figure 35:
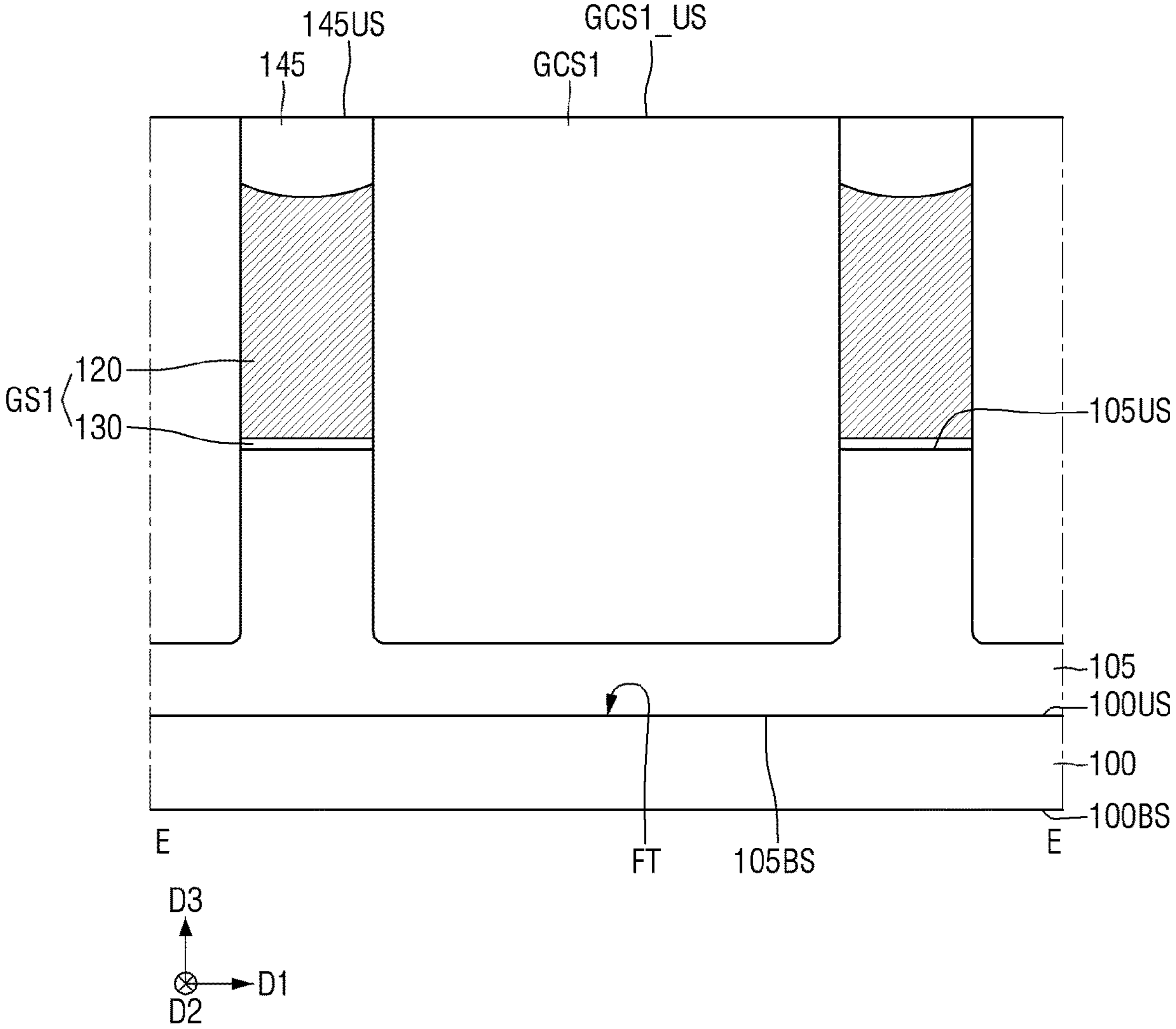

FIG. 31 is a layout view of a semiconductor device according to some embodiments of the present disclosure. FIGS. 32 through 35 are cross-sectional views taken along lines A-A, B-B, C-C, and E-E of the device shown in FIG. 31. For convenience, the embodiment of FIGS. 31 through 35 will hereinafter be described, highlighting the differences with the embodiment of FIGS. 1 through 12.

Referring to FIGS. 31 through 35, the semiconductor device according to some embodiments of the present disclosure may further include second and third gate electrodes 220 and 320, respectively, between the first gate electrodes 120.

Second and third gate structures GS2 and GS3 may be disposed between first gate structures GS1 that are adjacent to each other in a first direction D1. The second and third gate structures GS2 and GS3 may be aligned with one another in a second direction D2.

The second and third gate structures GS2 and GS3 may be spaced apart from each other in the second direction D2. A first gate separation structure GCS1 may separate the second and third gate structures GS2 and GS3. For example, the first gate structures GS1 may be separated by the first gate separation structure GCS1, and as a result, the second and third gate structures GS2 and GS3 may be formed.

The second gate structure GS2 may be disposed between a first channel separation structure CCW1 and the first gate separation structure GCS1. The second gate structure GS2 may be in contact with the first channel separation structure CCW1 and the first gate separation structure GCS1. The second gate structure GS2 may be disposed on a first lower pattern BP1.

The third gate structure GS3 may be disposed between a second channel separation structure CCW2 and the first gate separation structure GCS1. The third gate structure GS3 may be in contact with the second channel separation structure CCW2 and the first gate separation structure GCS1. The third gate structure GS3 may be disposed on a second lower pattern BP2.

The second gate structure GS2 may be in contact with an upper surface 105US of a field insulating film 105 and an upper surface BP1_US of a first lower pattern BP1. Some of a plurality of first channel patterns CH1 may be disposed between the second gate structure GS2 and the first channel separation structure CCW1.

The third gate structure GS3 may be in contact with the upper surface 105US of the field insulating film 105 and an upper surface BP2_US of the second lower pattern BP2. Some of a plurality of second channel patterns CH2 may be disposed between the third gate structure GS3 and the second channel separation structure CCW2.

The second gate structure GS2 may include the second gate electrode 220 and a second gate insulating film 230. The third gate structure GS3 may include the third gate electrode 320 and a third gate insulating film 330.

The second gate structure GS2 may include second inner gate structures INT_GS2. The second inner gate structures INT_GS2 may be disposed between the first lower pattern BP1 and their corresponding first sheet patterns NS1 and between the corresponding first sheet patterns NS1, which are adjacent to one another in a third direction D3. The third gate structure GS3 may include third inner gate structures INT_GS3. The third inner gate structures INT_GS3 may be disposed between the second lower pattern BP2 and their corresponding second sheet patterns NS2 and between the corresponding second sheet patterns NS2, which are adjacent to one another in the third direction D3.

The second and third gate electrodes 220 and 320 may be disposed between the first and second channel separation structures CCW1 and CCW2, which are adjacent to each other in the second direction D2. The second and third gate electrodes 220 and 320 may be aligned in the second direction D2. The second and third gate electrodes 220 and 320 may be disposed between the first gate electrodes 120 that are adjacent to each other in the first direction D1. For example, the second and third gate electrodes 220 and 320 may be disposed between first and third connection gate electrodes 120_1 and 120_3.

The second gate insulating film 230 may extend (in the first direction D1 and/or second direction D2) along the upper surface 105US of the field insulating film 105 and the upper surface BP1_US of the first lower pattern BP1. The second gate insulating film 230 may extend along parts of sidewalls CCW1_SW of the first channel separation structure CCW1. The second gate insulating film 230 is disposed between the second gate electrode 220 and the first sheet patterns NS1.

The third gate insulating film 330 may extend along the upper surface 105US of the field insulating film 105 and the upper surface BP2_US of the second lower pattern BP2. The third gate insulating film 330 may extend along parts of sidewalls CCW2_SW of the second channel separation structure CCW2. The third gate insulating film 330 is disposed between the third gate electrode 320 and the second sheet patterns NS2.

Second gate spacers 240 may be disposed on the sidewalls of the second gate structure GS2. Third gate spacers 340 may be disposed on the sidewalls of the third gate structure GS3.

A second gate capping pattern 245 may be disposed on the second gate structure GS2. The second gate capping pattern 245 may be disposed between the first channel separation structure CCW1 and the first gate separation structure GCS1. The second gate capping pattern 245 may be in contact with the first channel separation structure CCW1 and the first gate separation structure GCS1.

A third gate capping pattern 345 may be disposed on the third gate structure GS3. The third gate capping pattern 345 may be disposed between the second channel separation structure CCW2 and the first gate separation structure GCS1. The third gate capping pattern 345 may be in contact with the second channel separation structure CCW2 and the first gate separation structure GCS1.

The first gate separation structure GCS1 may be in contact with the second and third gate structures GS2 and GS3, respectively. The first gate separation structure GCS1 may be in contact with the second gate electrode 220 and the second gate insulating film 230. The first gate separation structure GCS1 may be in contact with the third gate electrode 320 and the third gate insulating film 330.

Figure 36:
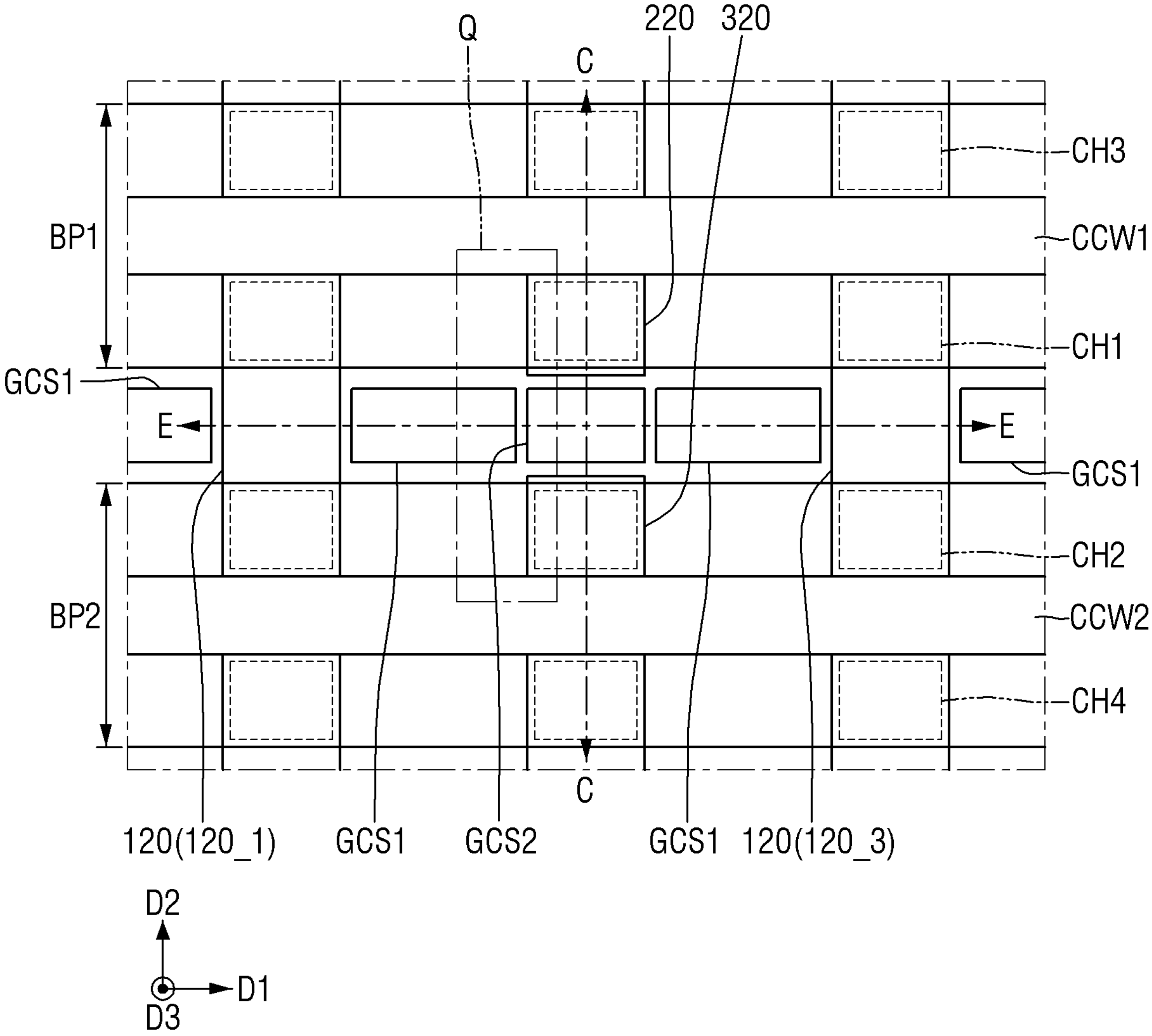
FIG. 36 is a layout view of a semiconductor device according to some embodiments of the present disclosure.
Figure 37:
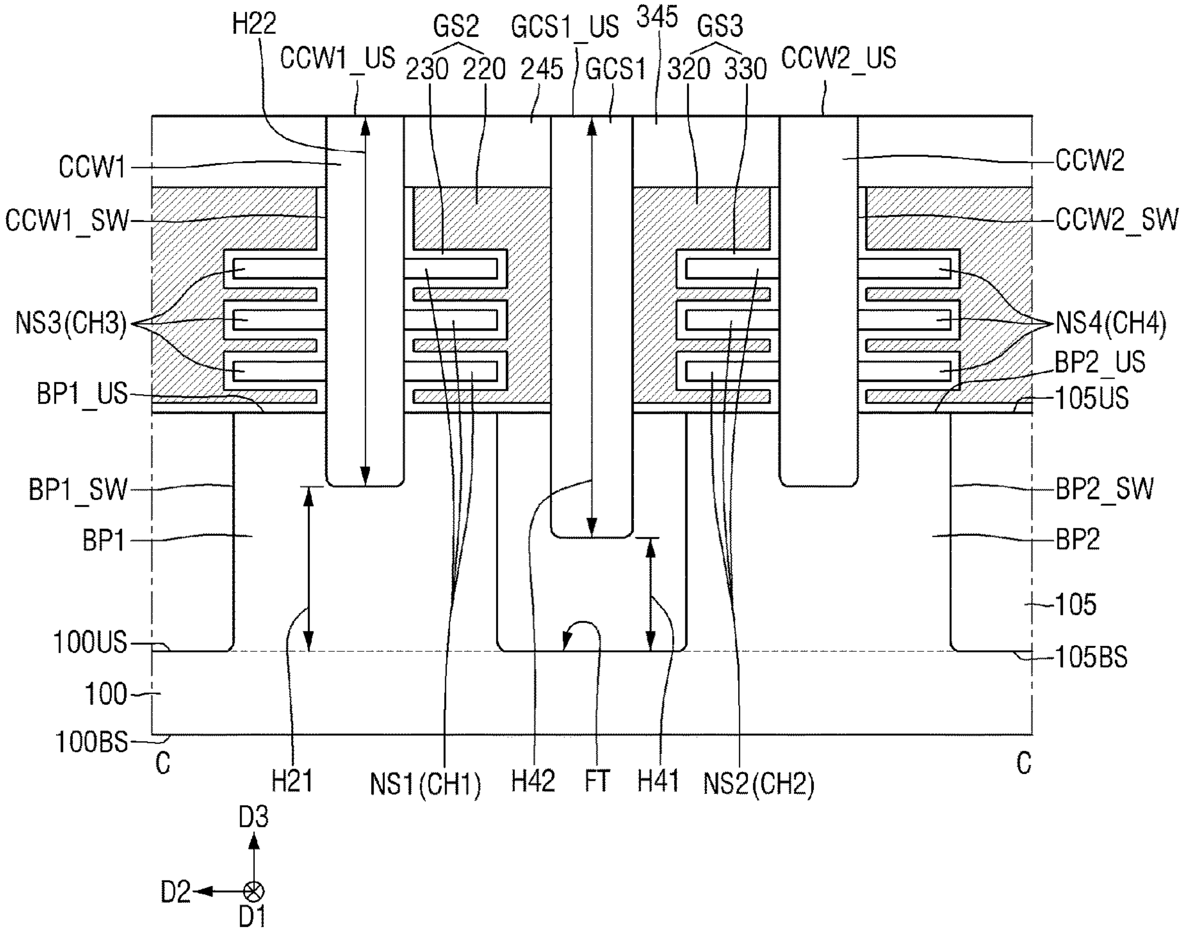
FIGS. 37 and 38 are cross-sectional views taken along lines C-C and E-E, respectively, of FIG. 36.
Figure 38:
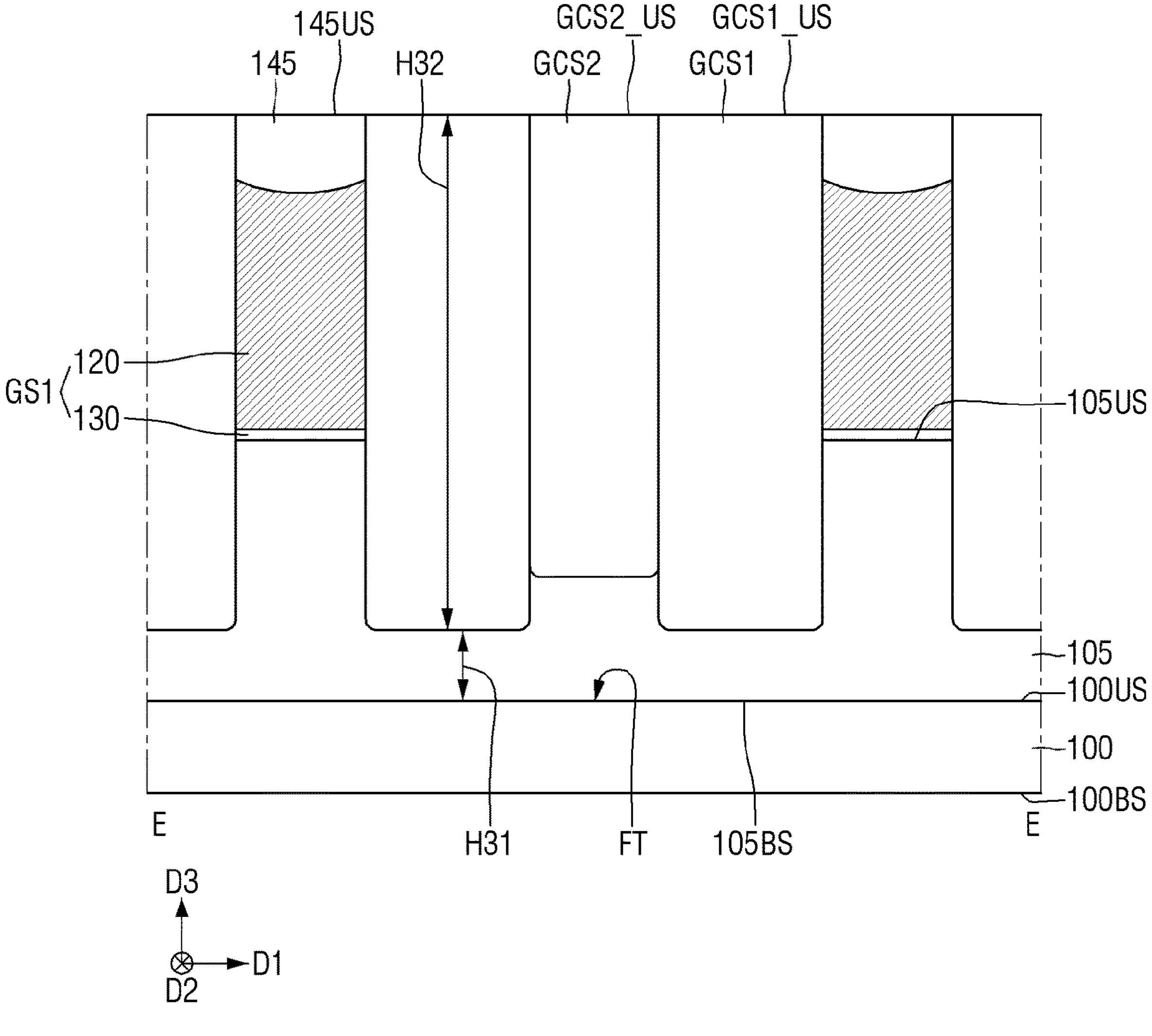
Figure 39:
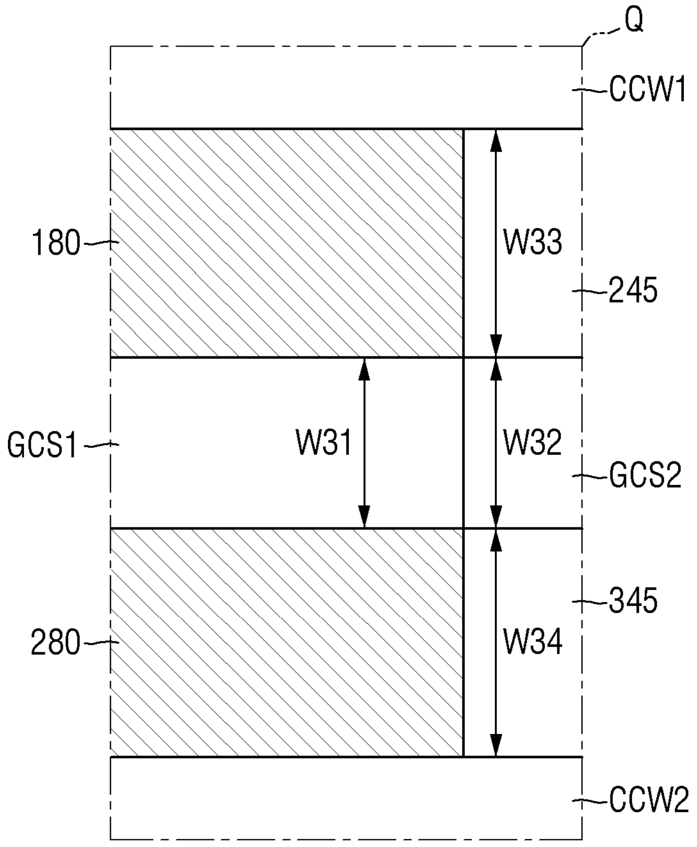
FIGS. 39 through 41 are plan views of part Q of FIG. 36.
Figure 40:
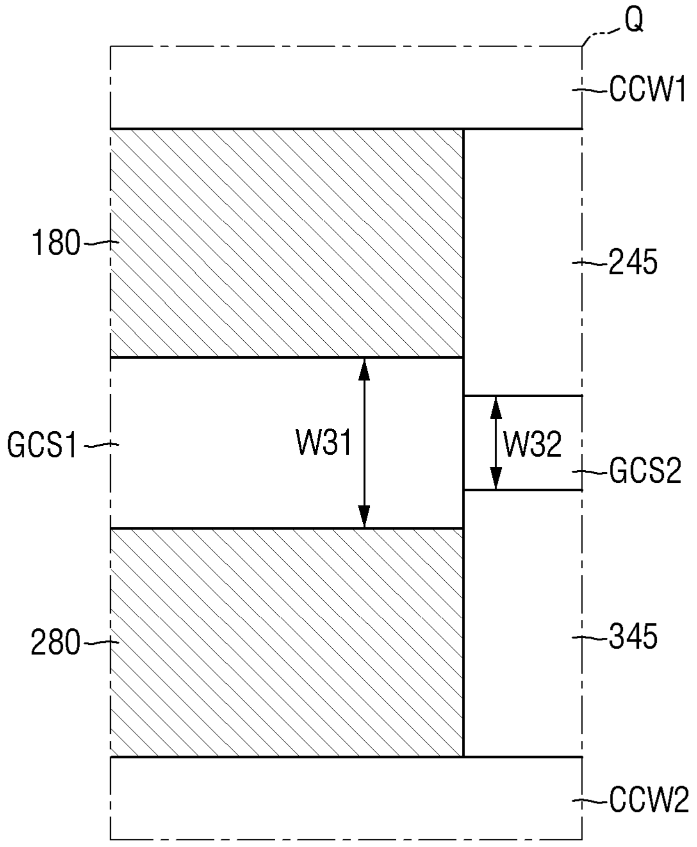
Figure 41:
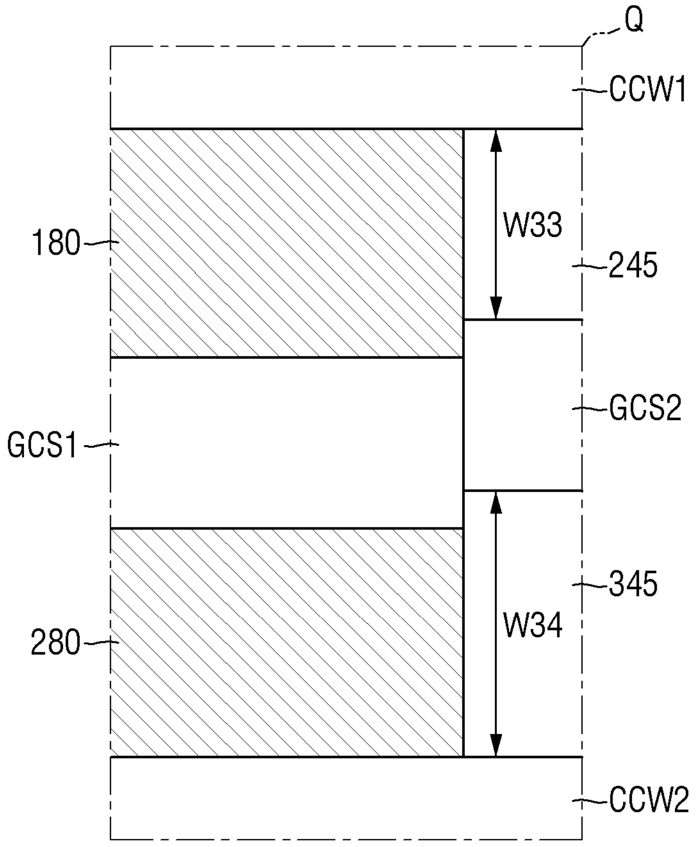

FIG. 36 is a layout view of a semiconductor device according to some embodiments of the present disclosure. FIGS. 37 and 38 are cross-sectional views taken along lines C-C and E-E of the device shown in FIG. 36. FIGS. 39 through 41 are plan views of region Q of the device shown in FIG. 36. For convenience, the embodiment of FIGS. 36 through 41 will hereinafter be described, highlighting the differences with the embodiment of FIGS. 1 through 12.

Referring to FIGS. 36 through 41, the semiconductor device according to some embodiments of the present disclosure may further include a second gate separation structure GCS2, a second gate electrode 220, and a third gate electrode 320.

A second gate structure GS2, including the second gate electrode 220, and a third gate structure GS3, including the third gate electrode 320, may be substantially the same as their corresponding counterparts of FIGS. 31 through 35 and will hereinafter be described, focusing mainly on the differences from their corresponding counterparts of FIGS. 31 through 35.

A second gate separation structure GCS2 may be disposed between the second and third gate structures GS2 and GS3. The second gate separation structure GCS2 may be disposed between first gate separation structures GCS1, which are adjacent to each other in a first direction D1.

The second gate separation structure GCS2 separates the second and third gate structures GS2 and GS3. For example, first gate structures GS1 may be separated by the second gate separation structure GCS2 in the first direction D1, and as a result, the second and third gate structures GS2 and GS3 may be formed.

A second gate capping pattern 245 may be disposed between a first channel separation structure CCW1 and the second gate separation structure GCS2. The second gate capping pattern 245 may be in contact with the first channel separation structure CCW1 and the second gate separation structure GCS2.

A third gate capping pattern 345 may be disposed between a second channel separation structure CCW2 and the second gate separation structure GCS2. The third gate capping pattern 345 may be in contact with the second channel separation structure CCW2 and the second gate separation structure GCS2.

The second gate separation structure GCS2 may be in contact with the second and third gate structures GS2 and GS3. The second gate separation structure GCS2 may be in contact with the second gate electrode 220 and a second gate insulating film 230. The second gate separation structure GCS2 may be in contact with the third gate electrode 320 and a third gate insulating film 330. The second gate separation structure GCS2 may be in contact with the first gate separation structures GCS1, which are disposed on both sides of the second gate separation structure GCS2 in the first direction D1.

The second gate separation structure GCS2 may include an insulating material. The second gate separation structure GCS2 may include at least one of, for example, SiN, SiON, $SiO_2$, SiOCN, SiBN, SiOBN, SiOC, AlO, and a combination thereof. The second gate separation structure GCS2 is illustrated as being a single film, but the present disclosure is not limited thereto.

A height "H21+H22" from a bottom surface 105BS of a field insulating film 105 to an upper surface CCW1_US of the first channel separation structure CCW1 in the third direction D3 may be the same as a height "H41+H42" from the bottom surface 105BS of the field insulating film 105 to an upper surface GCS2_US of the second gate separation structure GCS2. For example, the upper surface GCS2_US of the second gate separation structure GCS2 may be disposed on the same plane as the upper surface CCW1_US of the first channel separation structure CCW1.

A height H22, in the third direction D3, of the first channel separation structure CCW1 may be different from a height H42, in the third direction D3, of the second gate separation structure GCS2. A height H41 from the bottom surface 105BS of the field insulating film 105 to a lowermost part of the second gate separation structure GCS2 in the third direction D3 may be different from a height H21 from the bottom surface 105BS of the field insulating film 105 to a lowermost part of the second gate separation structure GCS2. Contrary to what is depicted, the height H22 of the first channel separation structure CCW1 may be the same as the height H42 of the second gate separation structure GCS2.

A height H32, in the third direction D3, of the first gate separation structure GCS1 may be different from a height H42, in the third direction D3, of the second gate separation structure GCS2. A height H41 from the bottom surface 105BS of the field insulating film 105 to the lowermost part of the second gate separation structure GCS2 may be different from a height H31 from the bottom surface 105BS of the field insulating film 105 to the lowermost part of the first gate separation structure GCS1. Contrary to what is depicted, the height H32 of the first gate separation structure GCS1 may be the same as the height H42 of the second gate separation structure GCS2.

Referring to FIG. 39, a width W31 of the first gate separation structure GCS1 in a second direction D2 may be the same as a width W32 of the second gate separation structure GCS2 in the second direction D2. For example, the width W31 of the first gate separation structure GCS1 in the second direction D2 may be measured on an upper surface GCS1_US of the first gate separation structure GCS1.

A distance W33 between the first channel separation structure CCW1 and the second gate separation structure GCS2 in the second direction D2 may be the same as a distance W34 between the second channel separation structure CCW2 and the second gate separation structure GCS2 in the second direction D2.

Referring to FIG. 40, the width W31 of the first gate separation structure GCS1 in the second direction D2 may be different from the width W32 of the second gate separation structure GCS2 in the second direction D2. For example, the width W31 of the first gate separation structure GCS1 in the second direction D2 may be greater than the width W32 of the second gate separation structure GCS2 in the second direction D2, but the present disclosure is not limited thereto.

Referring to FIG. 41, the distance W33 between the first channel separation structure CCW1 and the second gate separation structure GCS2 in the second direction D2 may be different from the distance W34 between the second channel separation structure CCW2 and the second gate separation structure GCS2 in the second direction D2.

FIGS. 42 through 67 are layout views or cross-sectional views illustrating intermediate steps of an example method of fabricating a semiconductor device according to some embodiments of the present disclosure.

Figure 42:
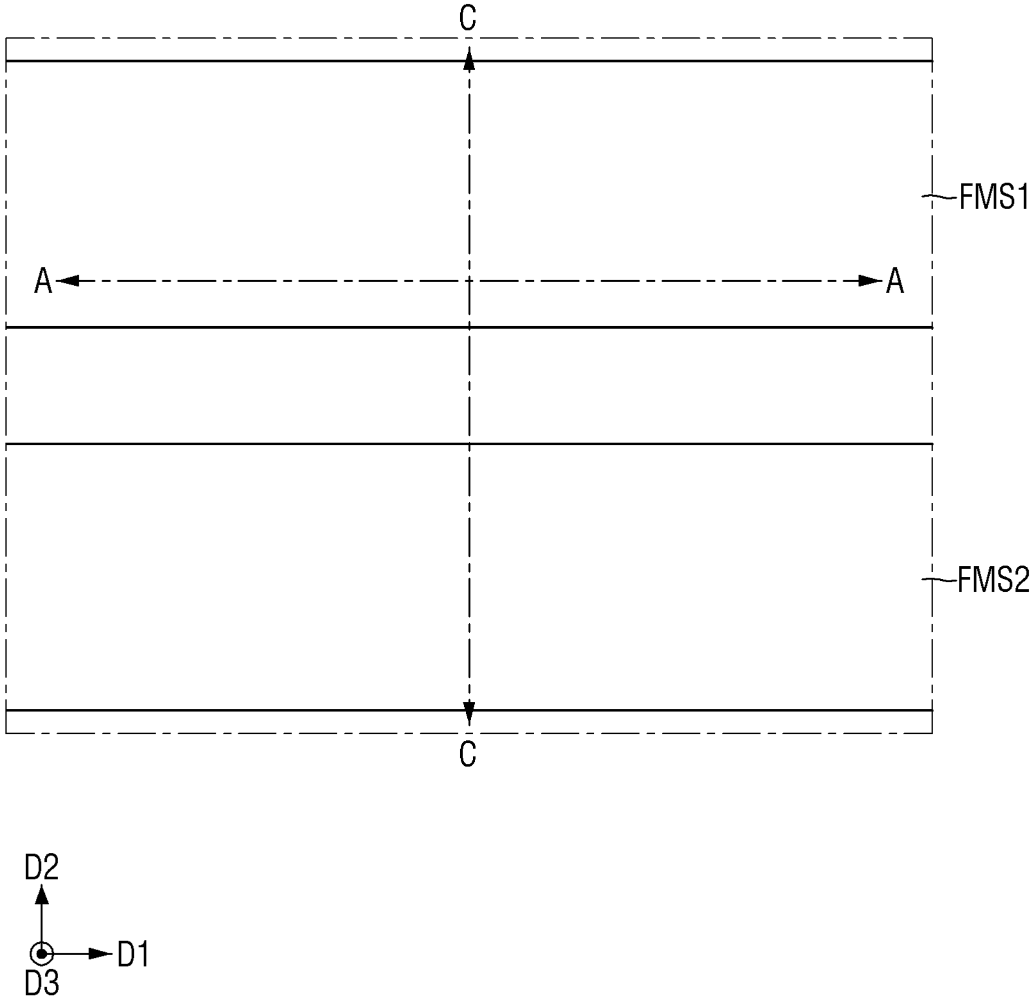
FIGS. 42 through 67 are layout views or cross-sectional views illustrating intermediate steps of a method of fabricating a semiconductor device according to some embodiments of the present disclosure.
Figure 43:
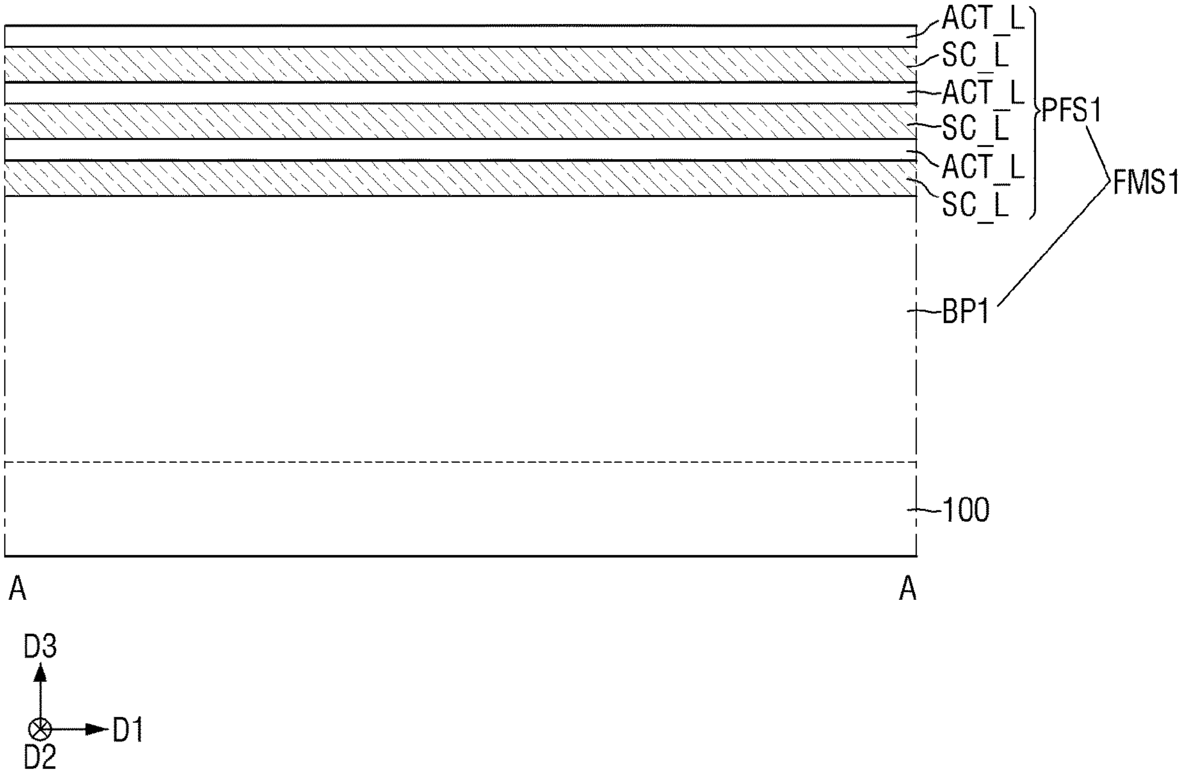
Figure 44:
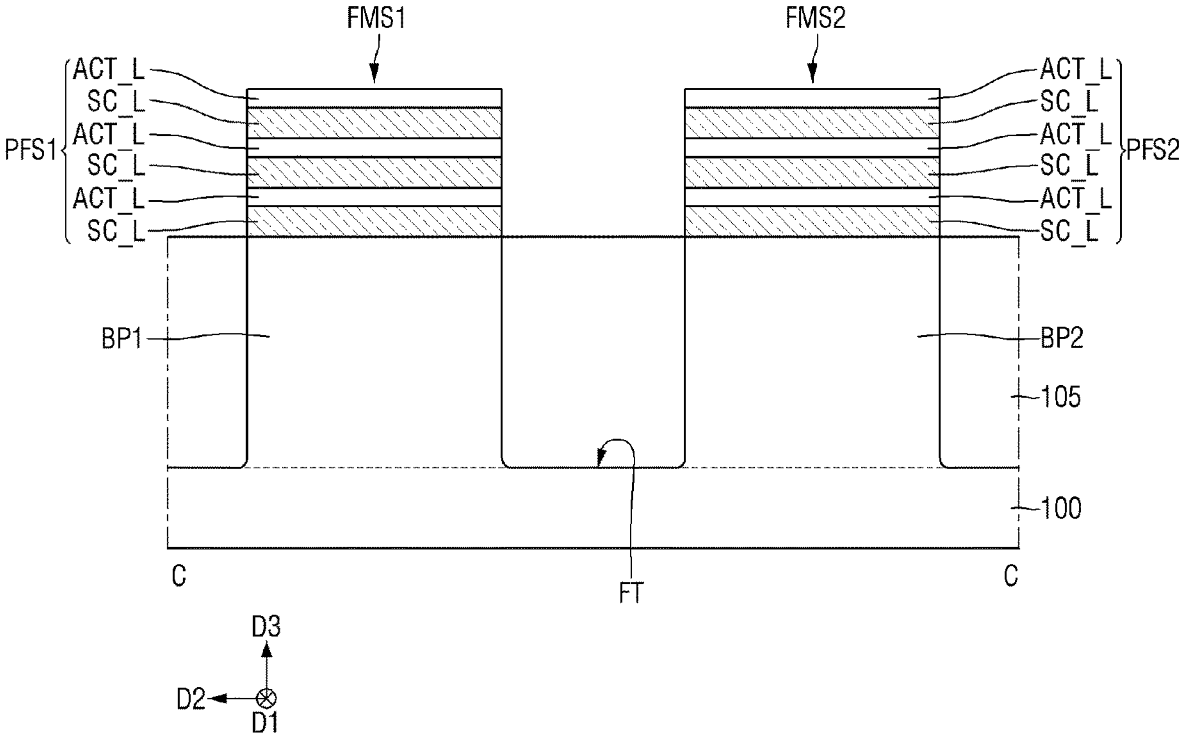

Referring to FIGS. 42 through 44, first and second mold fin-type patterns FMS1 and FMS2 may be formed on a first substrate 100.

The first and second mold fin-type pattern FMS1 and FMS2 may extend in a first direction D1. The first and second mold fin-type patterns FMS1 and FMS2 may be spaced apart from each other in a second direction D2. The first and second mold fin-type patterns FMS1 and FMS2 may be defined by fin trenches FT, which extend in the first direction D1.

The first mold fin-type pattern FMS1 may include a first lower pattern BP1 and a first pre-pattern structure PFS1. The second mold fin-type pattern FMS2 may include a second lower pattern BP2 and a second pre-pattern structure PFS2. The first pre-pattern structure PFS1 is formed on the first lower pattern BP1. The second pre-pattern structure PFS2 is formed on the second lower pattern BP2.

Each of the first and second pre-pattern structures PFS1 and PFS2 may include a plurality of pre-sacrificial patterns SC_L and a plurality of pre-active patterns ACT_L, which are alternately stacked with the pre-sacrificial patterns SC_L in a third direction D3. For example, the pre-active patterns ACT_L may include silicon films, and the pre-sacrificial patterns SC_L may include SiGe films.

A field insulating film 105 may be formed on the first substrate 100. The field insulating film 105 may partially fill the fin trenches FT.

Referring to FIGS. 45 through 48, a dummy gate electrode 120DP may be formed on the first and second mold fin-type patterns FMS1 and FMS2.

The dummy gate electrode 120DP may include extension portions 120DP_L, which extend in the second direction D2, and a connection portion 120DP_E, which intersects the extension portions 120DP_L and extends in the first direction D1. In a plan view, the dummy gate electrode 120DP may be configured to have a mesh shape.

The extension portions 120DP_L of the dummy gate electrode 120DP may be formed on the first and second mold fin-type patterns FMS1 and FMS2. The extension portions 120DP_L of the dummy gate electrode 120DP may intersect the first and second mold fin-type patterns FMS1 and FMS2.

The connection portion 120DP_E of the dummy gate electrode 120DP may connect each set of extension portions 120DP_L that are adjacent to one another in the first direction D1. The connection portion 120DP_E of the dummy gate electrode 120DP may be formed between the first and second mold fin-type patterns FMS1 and FMS2. The connection portion 120DP_E of the dummy gate electrode 120DP may be formed on the field insulating film 105.

Dummy gate insulating films 130P are formed between the dummy gate electrode 120DP and the first mold fin-type pattern FMS1 and between the dummy gate electrode 120DP and the second mold fin-type pattern FMS2. A dummy gate capping film 120HM is formed on the dummy gate electrode 120DP. The dummy gate capping film 120HM is formed along the upper surface of the dummy gate electrode 120DP.

The dummy gate insulating films 130P may include, for example, silicon oxide, but the present disclosure is not limited thereto. The dummy gate electrode 120DP may include, for example, polysilicon, but the present disclosure is not limited thereto. The dummy gate capping film 120HM may include, for example, silicon nitride, but the present disclosure is not limited thereto.

Figure 49:
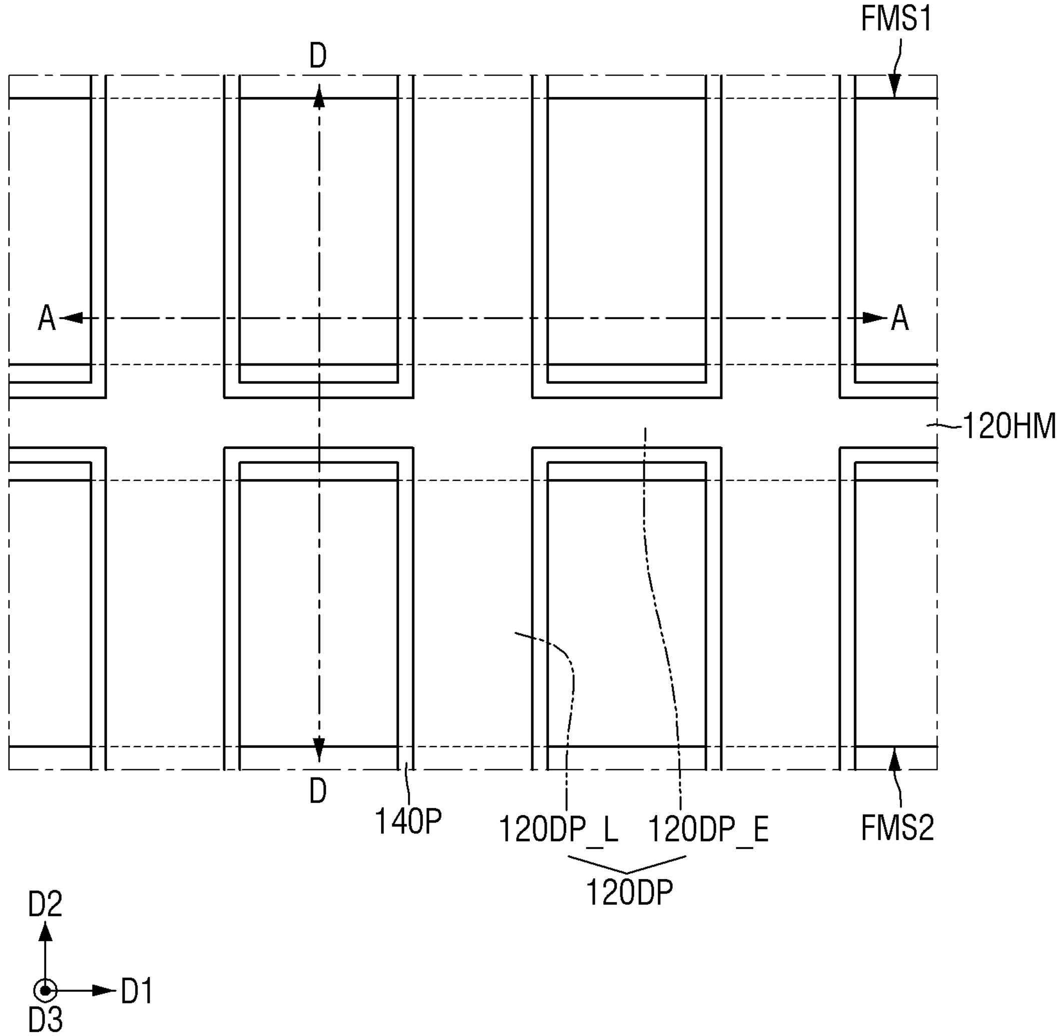
Figure 50:
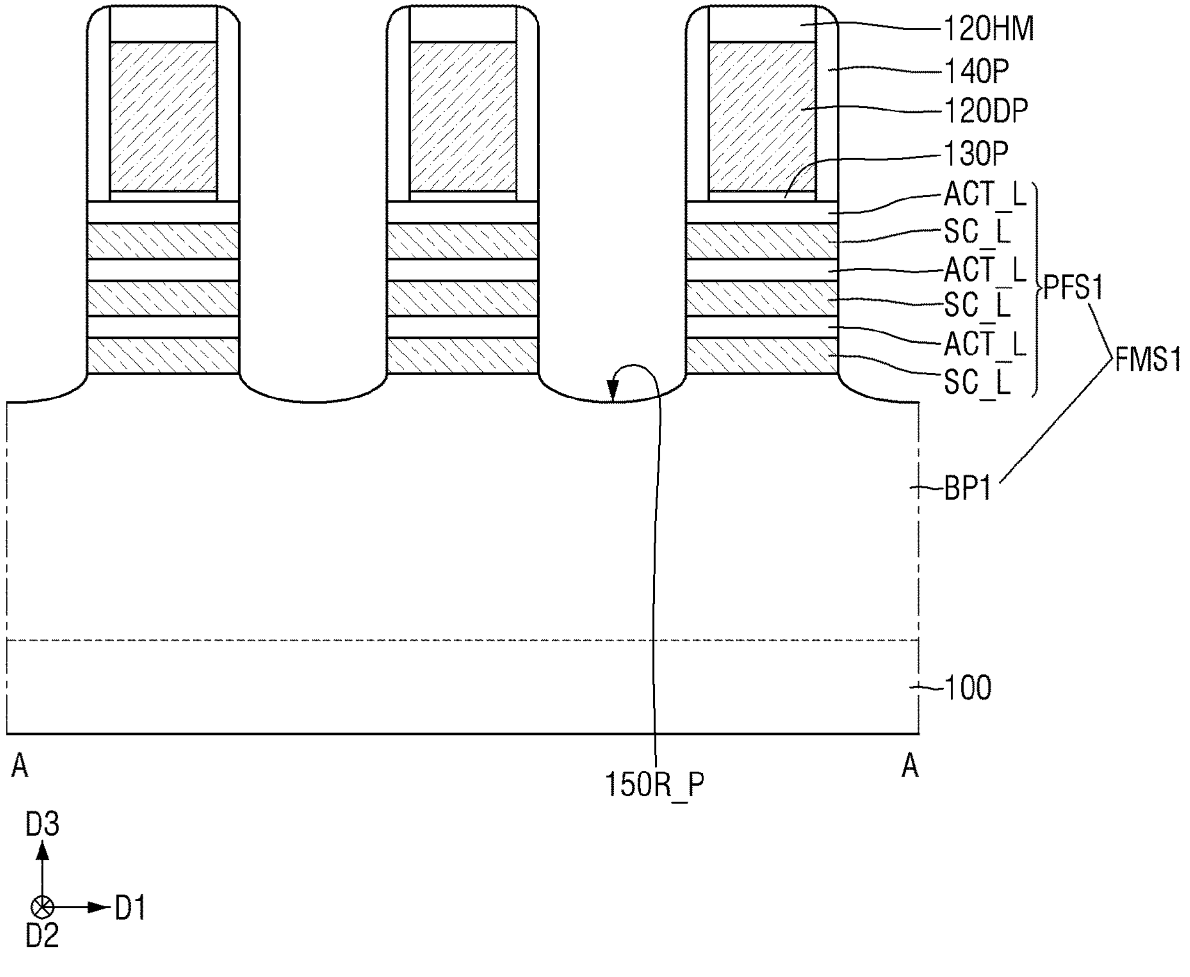
Figure 51:
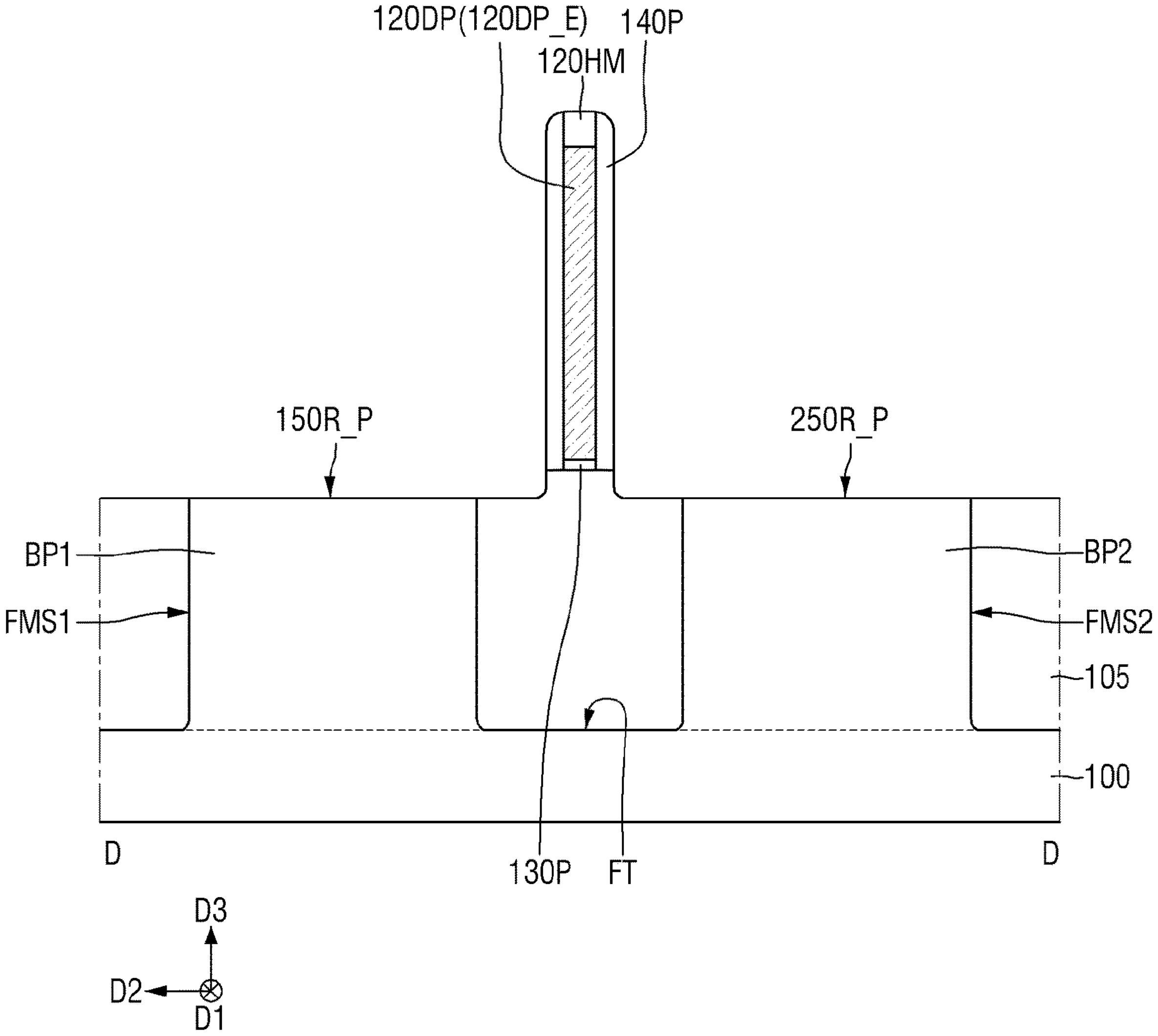
Figure 52:
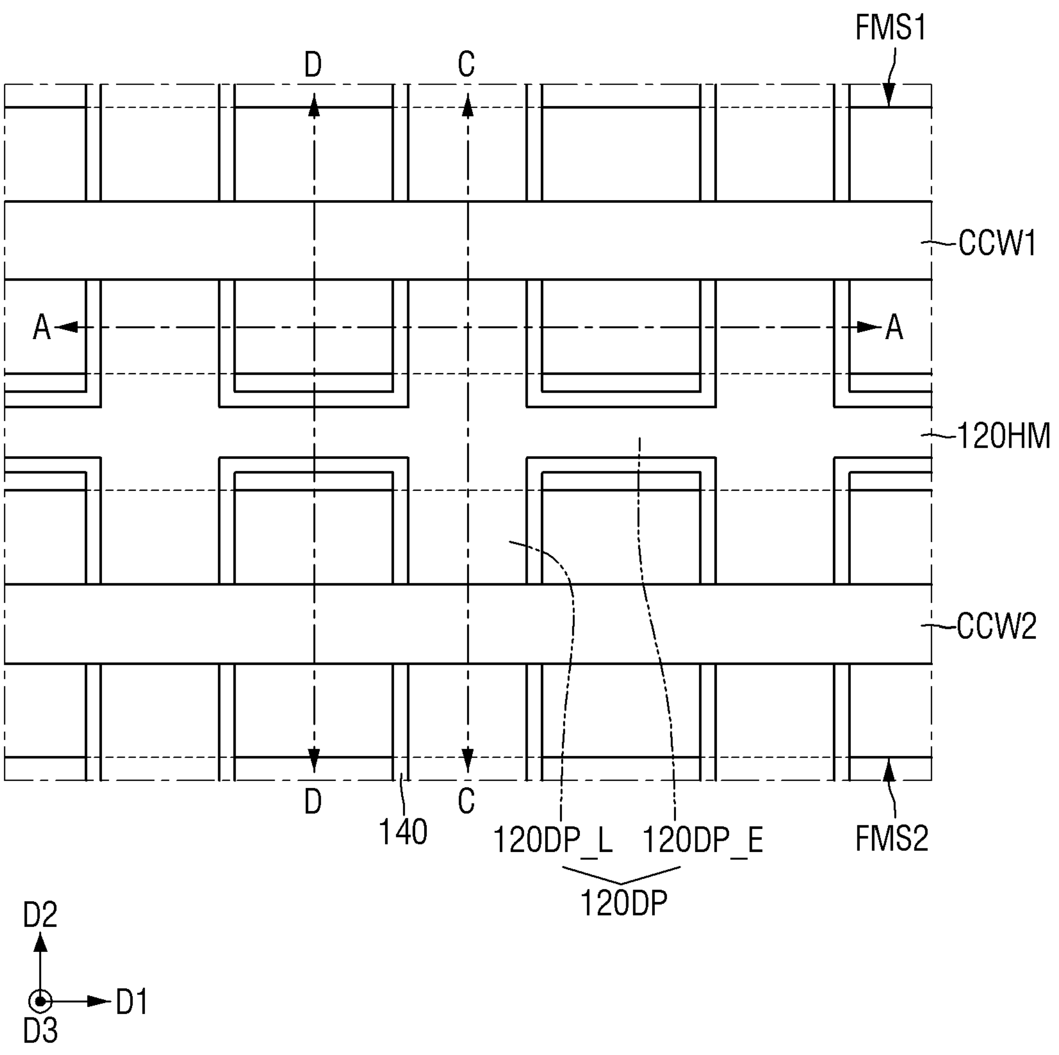
Figure 53:
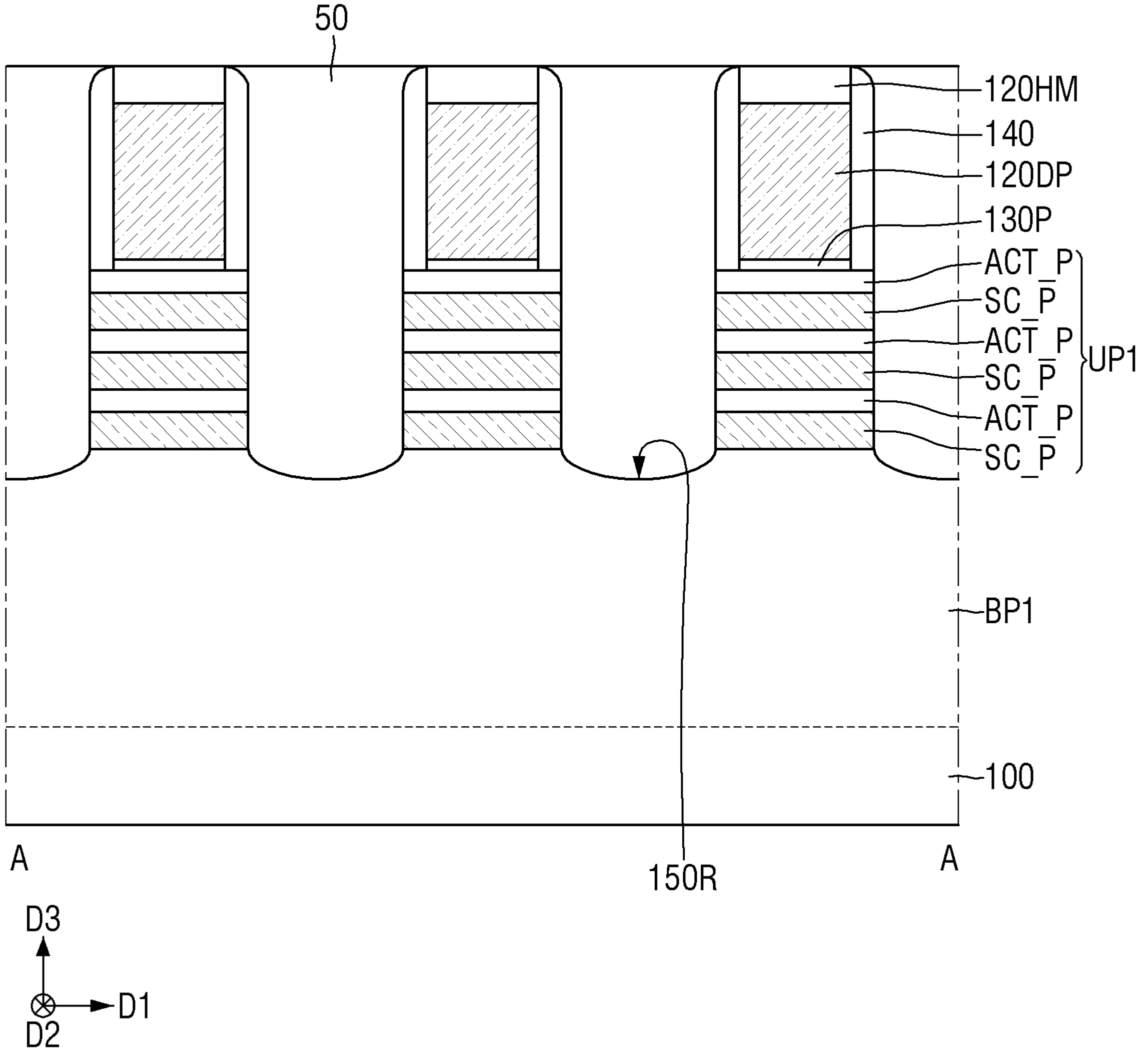
Figure 54:
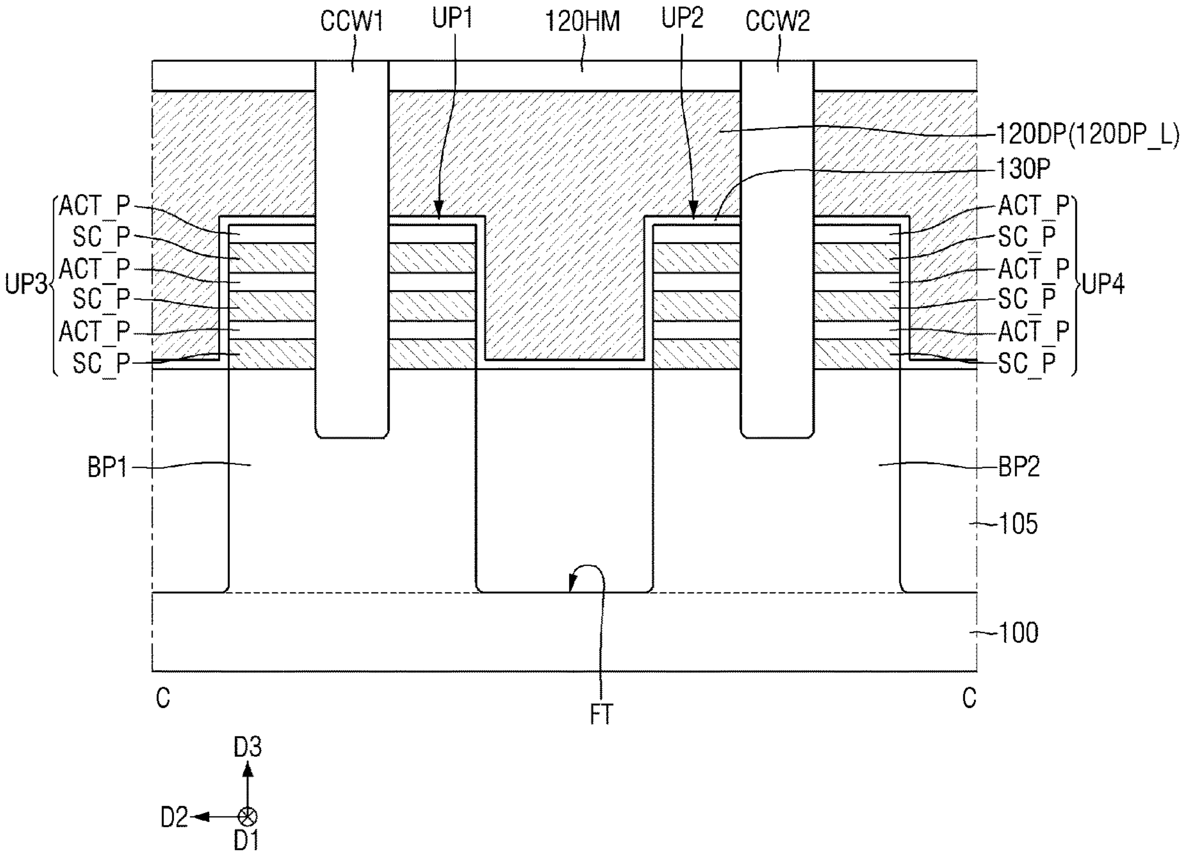
Figure 55:
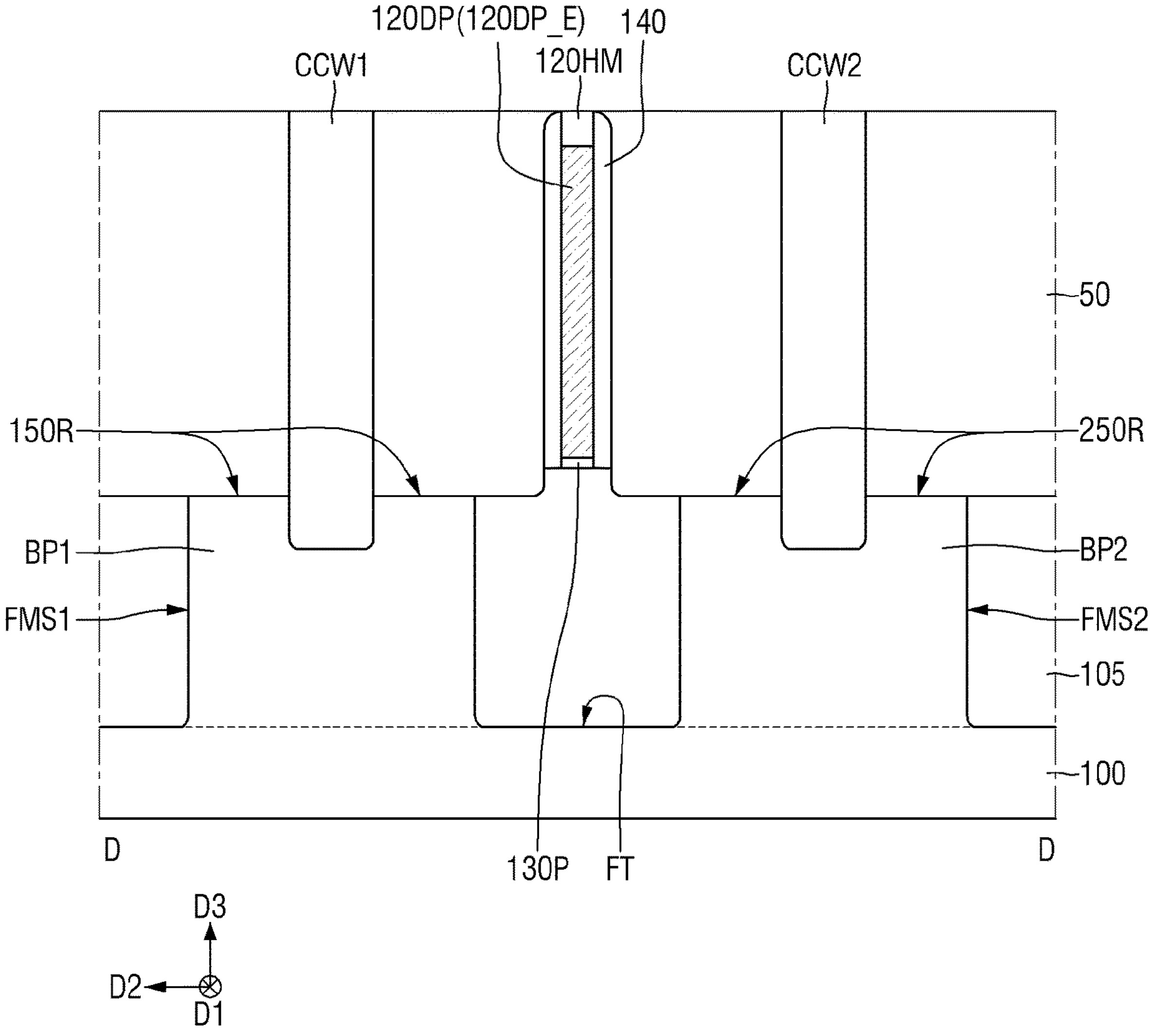

Referring to FIGS. 49 through 51, dummy gate spacers 140P may be formed on the sidewalls of the dummy gate electrode 120DP.

During the formation of the dummy gate spacers 140P, a first pre-source/drain recess 150R_P may be formed in the first mold fin-type pattern FMS1 using the dummy gate electrode 120DP as a mask.

Also, a second pre-source/drain recess 250R_P may be formed in the second mold fin-type pattern FMS2 using the dummy gate electrode 120DP as a mask. The first and second pre-source/drain recesses 150R_P and 250R_P may be formed at the same time.

The first and second pre-source/drain recesses 150R_P and 250R_P may be formed between their corresponding sets of extension portions 120DP_L that are adjacent to one another in the first direction D1. The first pre-source/drain recess 150R_P may be formed by removing at least a portion of the first pre-pattern structure PFS1. The second pre-source/drain recess 250R_P may be formed by removing at least a portion of the second pre-pattern structure PFS2.

Referring to FIGS. 52 through 55, a sacrificial insulating film 50 may be formed on the first substrate 100.

The sacrificial insulating film 50 may fill the first and second pre-source/drain recesses 150R_P and 250R_P. The sacrificial insulating film 50 may fill the spaces in the dummy gate electrode 120DP. The sacrificial insulating film 50 may be formed up to the upper surface of the dummy gate capping film 120HM.

Thereafter, a first channel separation structure CCW1 may be formed on the first lower pattern BP1. The first channel separation structure CCW1 may extend in the first direction D1. The first channel separation structure CCW1 may be formed in the first pre-pattern structure PFS1 and the sacrificial insulating film 50. The first channel separation structure CCW1 may separate the first pre-pattern structure PFS1 into two parts. As a result, first upper pattern structures UP1 and third upper pattern structures UP3 may be formed on the first lower pattern BP1. Also, the first channel separation structure CCW1 may separate the first pre-source/drain recess 150R_P into two first source/drain recesses 150R.

A second channel separation structure CCW2 may be formed on the second lower pattern BP2. The second channel separation structure CCW2 may extend in the first direction D1. The second channel separation structure CCW2 may be formed in the second pre-pattern structure PFS2 and the sacrificial insulating film 50. The second channel separation structure CCW2 may separate the second pre-pattern structure PFS2 into two parts. As a result, second upper pattern structures UP2 and fourth upper pattern structures UP4 may be formed on the second lower pattern BP2. Also, the second channel separation structure CCW2 may separate the second pre-source/drain recess 250R_P into two second source/drain recesses 250R. The first and second channel separation structures CCW1 and CCW2 may be formed at the same time.

Each of the first upper pattern structures UP1, second upper pattern structures UP2, third upper pattern structures UP3, and fourth upper pattern structures UP4 may include a plurality of sacrificial patterns SC_P and a plurality of active patterns ACT_P, which are alternately stacked with the sacrificial patterns SC_P in the third direction D3.

The dummy gate spacers 140P may be separated by the first and second channel separation structures CCW1 and CCW2. As a result, first gate spacers 140 may be formed. Referring to FIGS. 52 through 58, the sacrificial insulating film 50 is removed.

As a result, the first source/drain recesses 150R and the second source/drain recesses 250R may be exposed. In other words, the first upper pattern structures UP1, the second upper pattern structures UP2, the third upper pattern structures UP3, and the fourth upper pattern structures UP4 may be exposed.

First source/drain patterns 150 and third source/drain patterns 350 may be formed in the first source/drain recesses 150R. The first source/drain patterns 150 and the third source/drain patterns 350 may be formed on the first lower pattern BP1.

The first source/drain patterns 150 and the third source/drain patterns 350 may be separated by the first channel separation structure CCW1. The first source/drain patterns 150 and the third source/drain patterns 350 may be in contact with the first channel separation structure CCW1. The first source/drain patterns 150 may be in contact with the first upper pattern structures UP1. Although not specifically illustrated, the third source/drain patterns 350 may be in contact with the third upper pattern structures UP3.

Second source/drain patterns 250 and fourth source/drain patterns 450 may be formed in the second source/drain recesses 250R. The second source/drain patterns 250 and the fourth source/drain patterns 450 may be formed on the second lower pattern BP2.

The second source/drain patterns 250 and the fourth source/drain patterns 450 may be separated by the second channel separation structure CCW2. The second source/drain patterns 250 and the fourth source/drain patterns 450 may be in contact with the second channel separation structure CCW2. The second source/drain patterns 250 may be in contact with the second upper pattern structures UP2. Although not specifically illustrated, the fourth source/drain patterns 450 may be in contact with the fourth upper pattern structures UP4.

Figure 56:
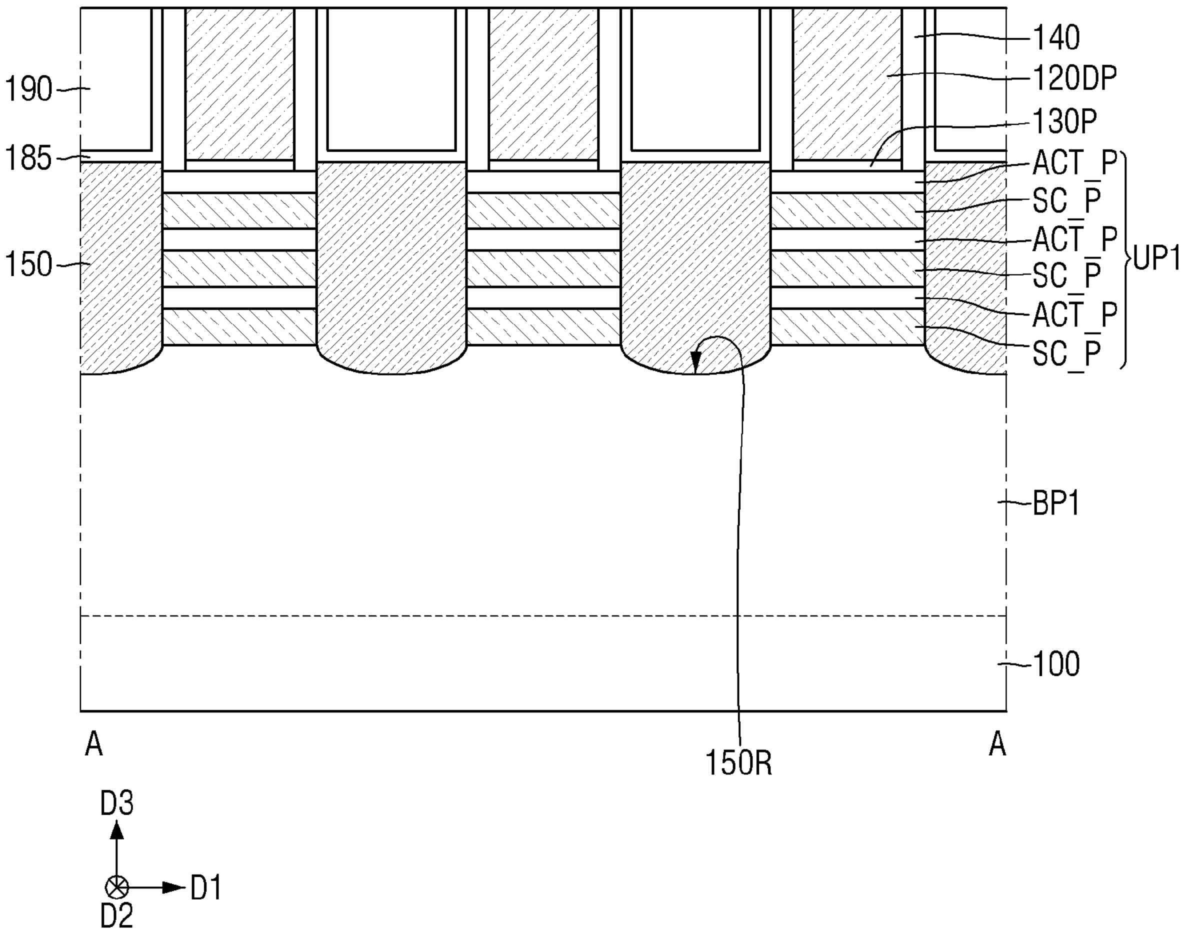
Figure 57:
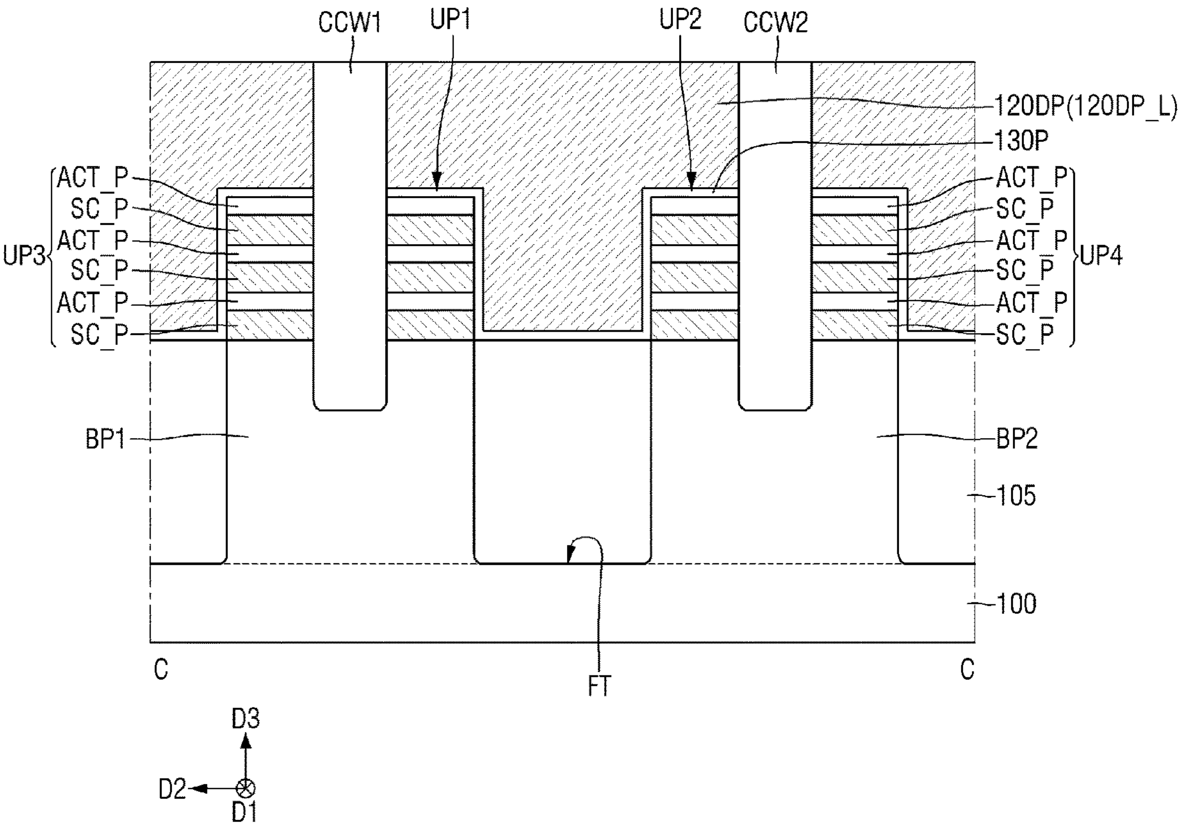
Figure 58:
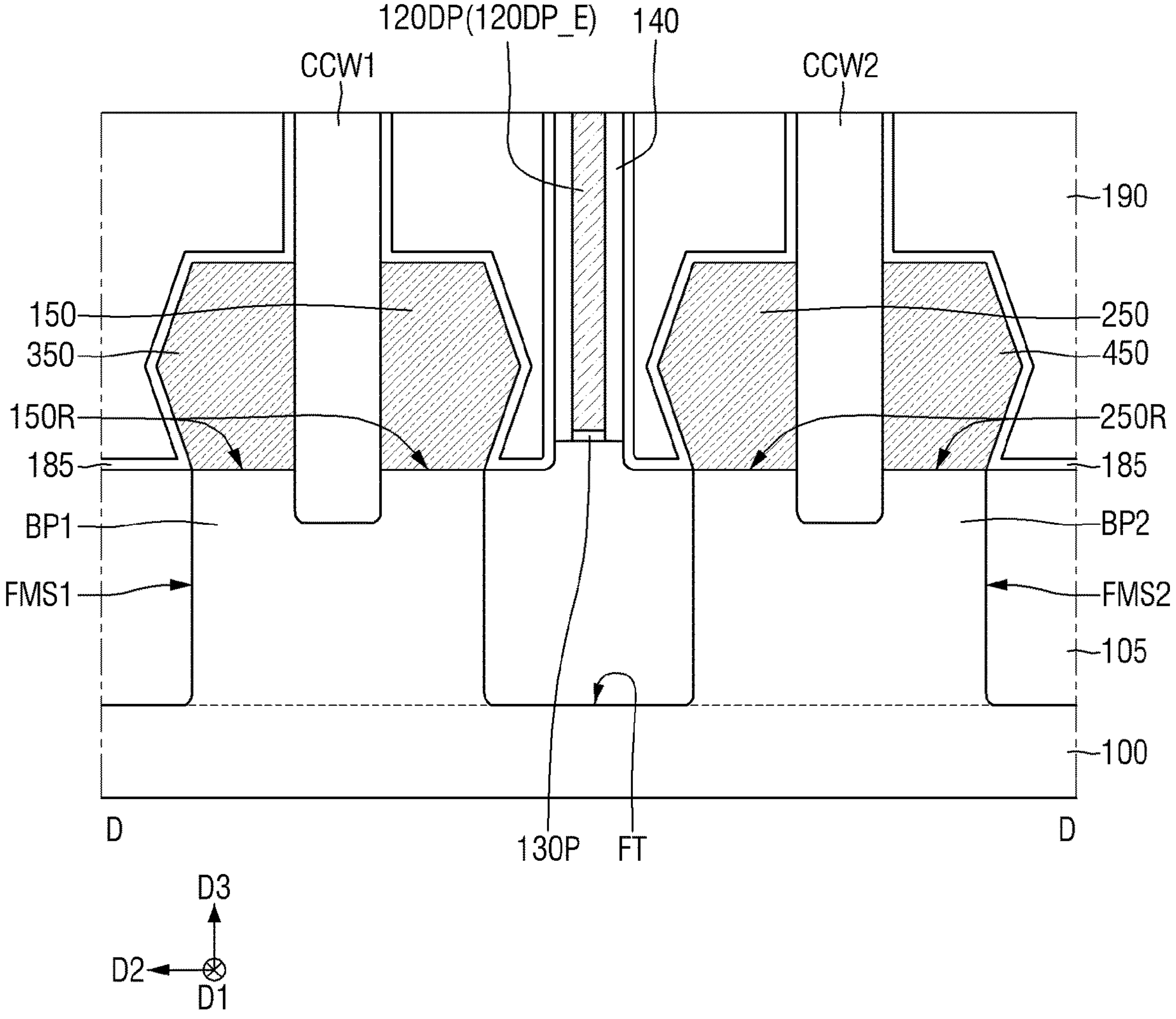

Referring to FIGS. 56-58, the second source/drain patterns 250, the third source/drain patterns 350, and the fourth source/drain patterns 450 may be in contact with the second upper pattern structures UP2, the third upper pattern structures UP3, and the fourth upper pattern structures UP4, respectively.

After the formation of the first source/drain patterns 150 and the third source/drain patterns 350, the second source/drain patterns 250 and the fourth source/drain patterns 450 may be formed. Alternatively, after the formation of the second source/drain patterns 250 and the fourth source/drain patterns 450, the first source/drain patterns 150 and the third source/drain patterns 350 may be formed.

Thereafter, source/drain etch stopper films 185 and upper interlayer insulating films 190 may be formed on the first source/drain patterns 150, the second source/drain patterns 250, the third source/drain patterns 350, and the fourth source/drain patterns 450. During the formation of the source/drain etch stopper films 185 and the upper interlayer insulating films 190, the dummy gate capping film 120HM may be removed. The dummy gate electrode 120DP may be exposed.

Figure 59:
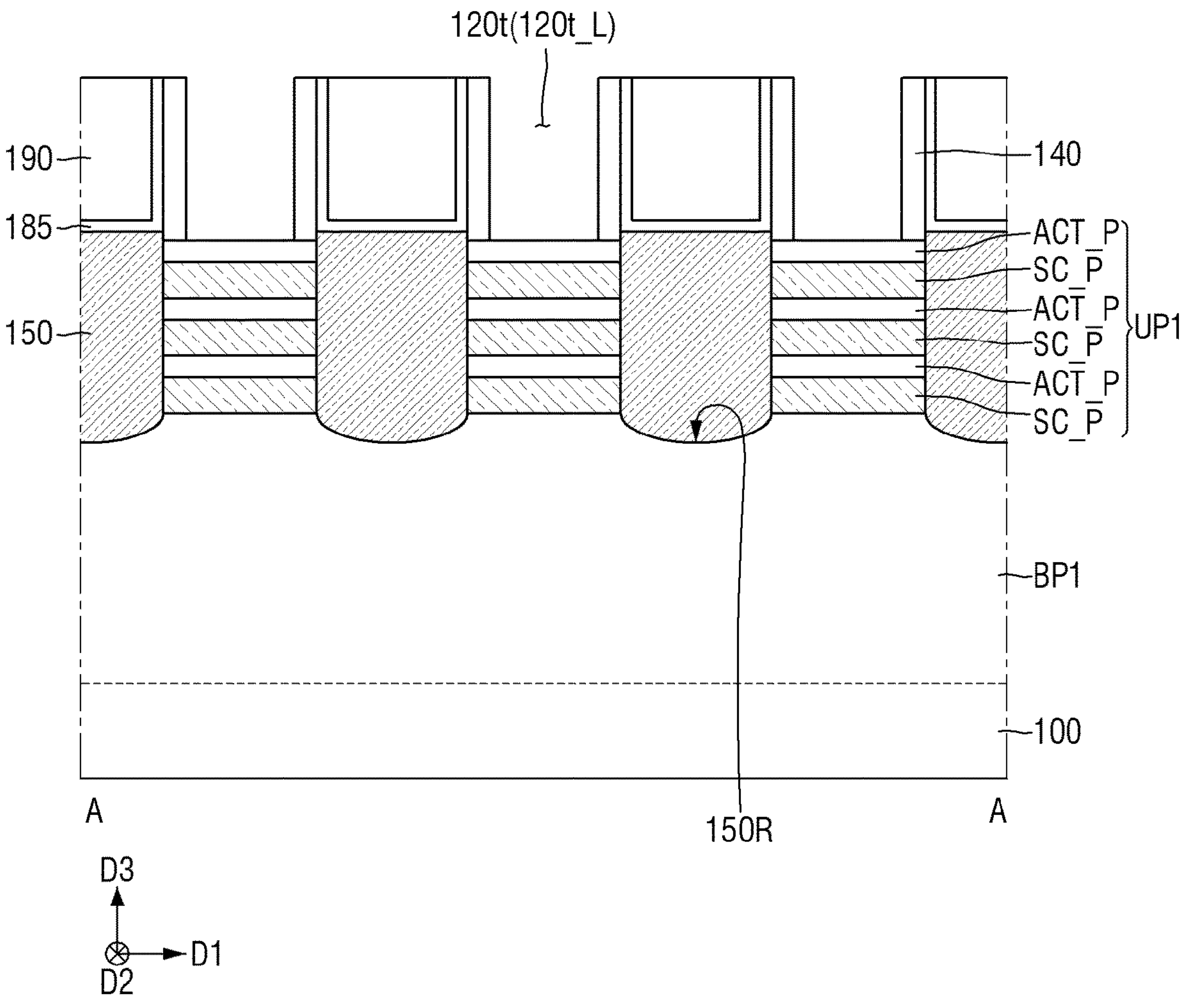
Figure 60:
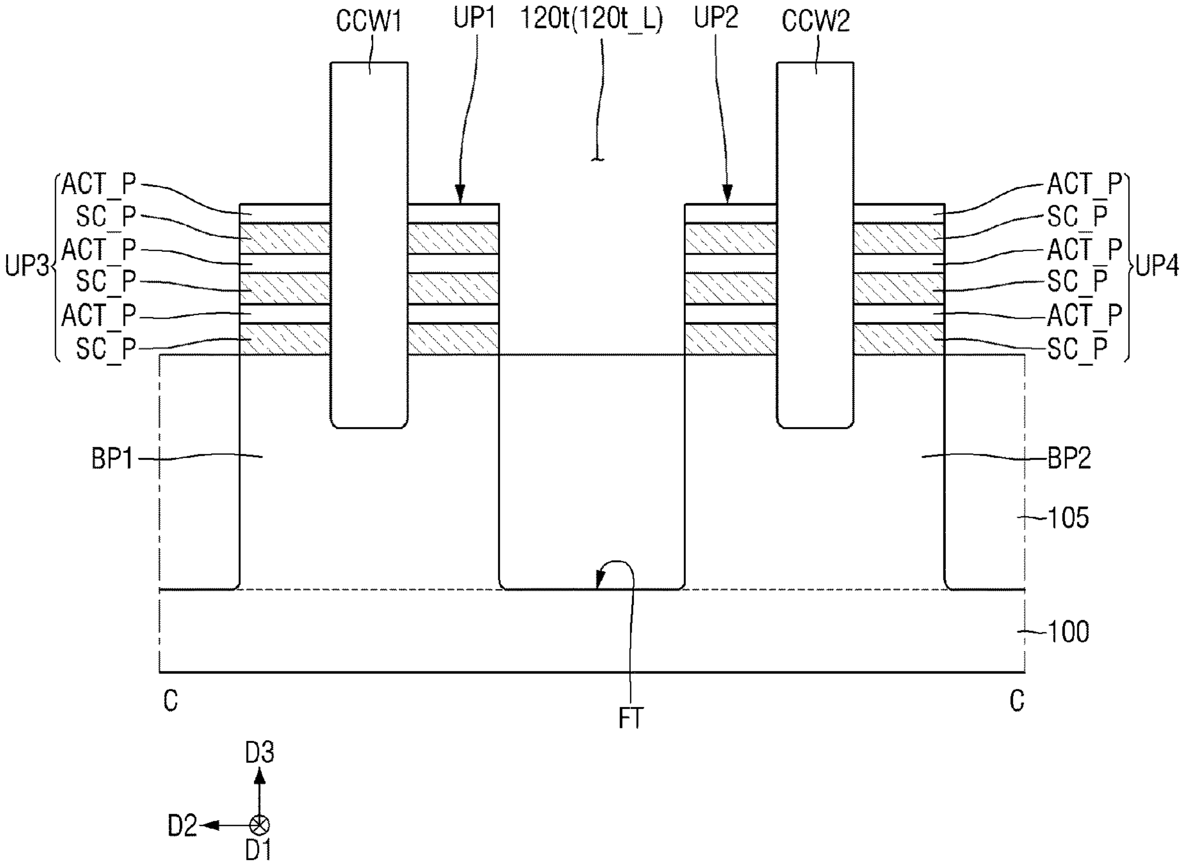
Figure 61:
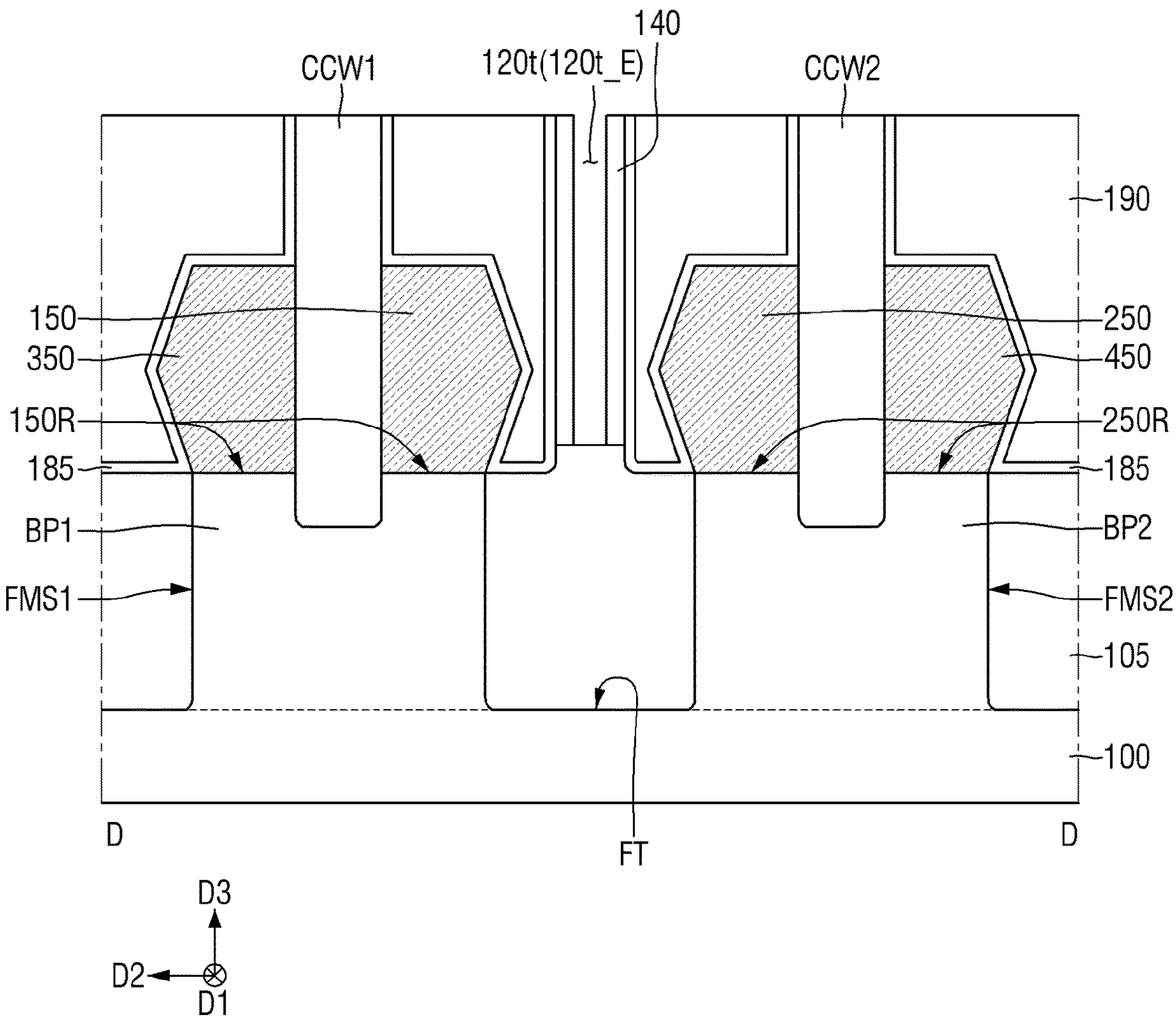

Referring to FIGS. 59 through 61, a gate trench 120*t* may be formed by removing the dummy gate electrode 120DP and the dummy gate insulating films 130P (see FIG. 58).

The gate trench 120*t* may expose the first upper pattern structures UP1, the second upper pattern structures UP2, the third upper pattern structures UP3, and the fourth upper pattern structures UP4. The gate trench 120t may include extension portions 120t_L, which extend in the second direction D2, and a connection portion 120t_E, which intersects the extension portions 120t_L and extends in the first direction D1.

The extension portions 120t_L of the gate trench 120t may be formed at the locations where the extension portions 120DP_L of the dummy gate electrode 120DP have been removed. The connection portion 120t_E of the gate trench 120t may be formed at the location where the connection 120DP_E of the dummy gate electrode 120DP has been removed. The gate trench 120t may have a mesh shape.

Figure 62:
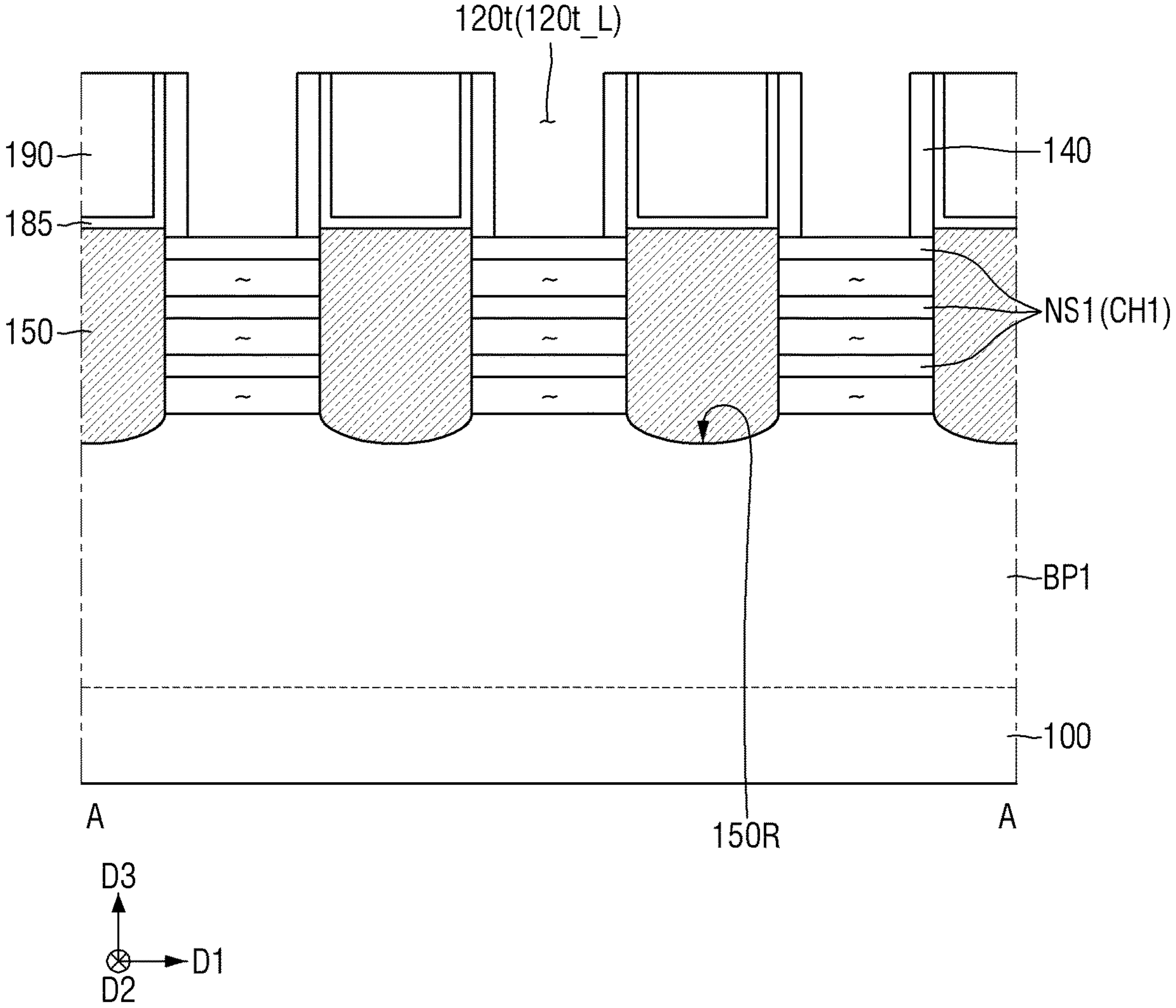
Figure 63:
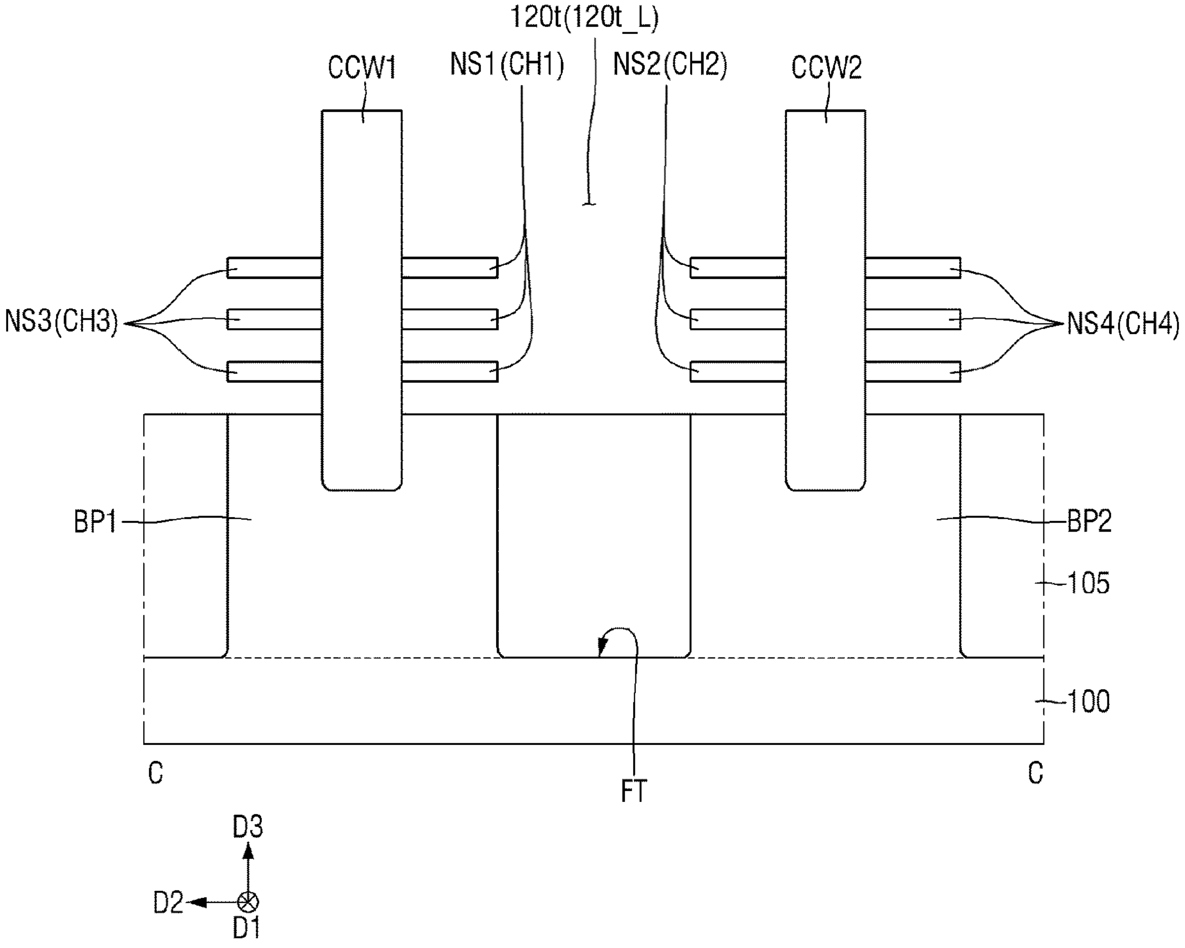
Figure 64:
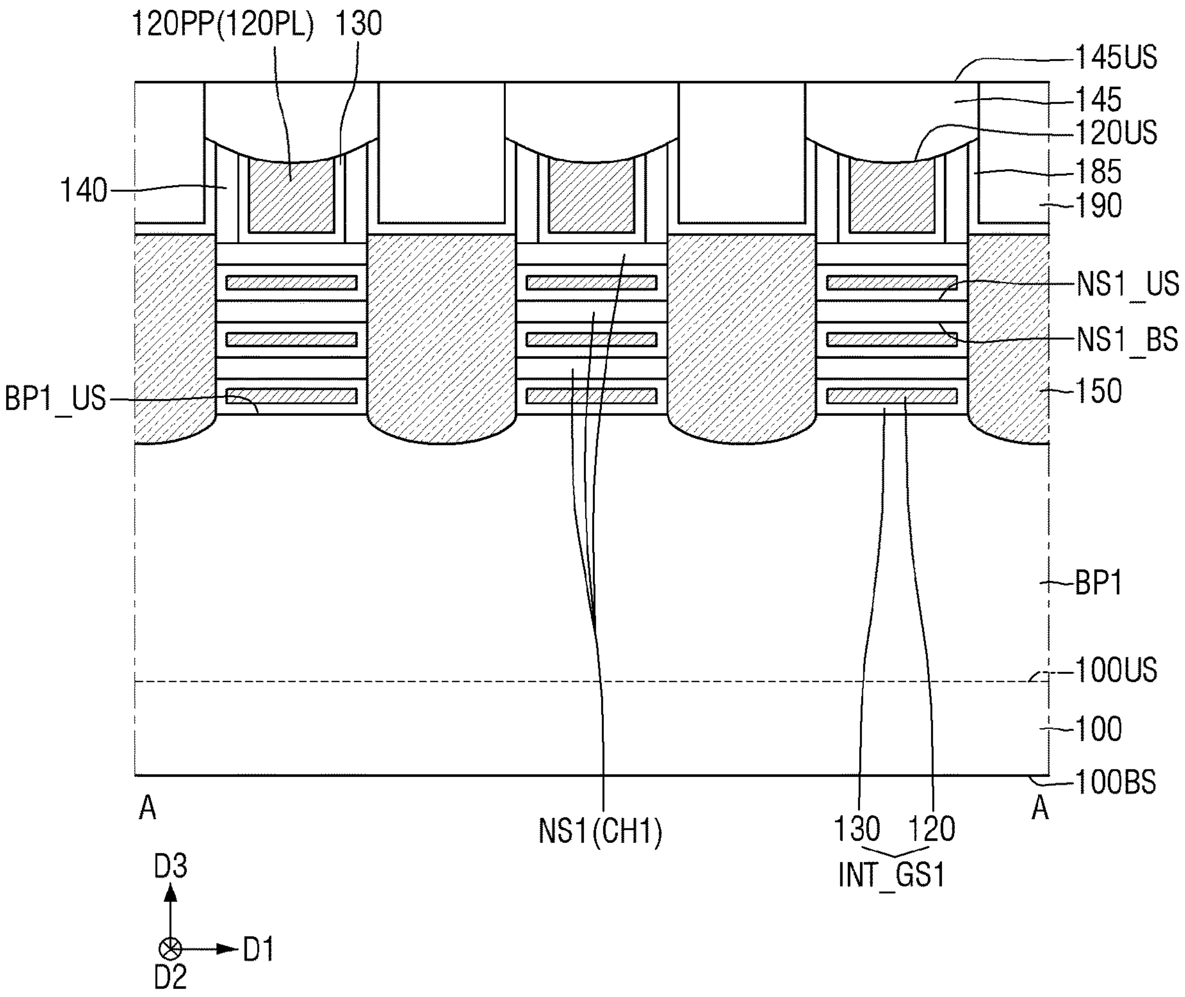
Figure 65:
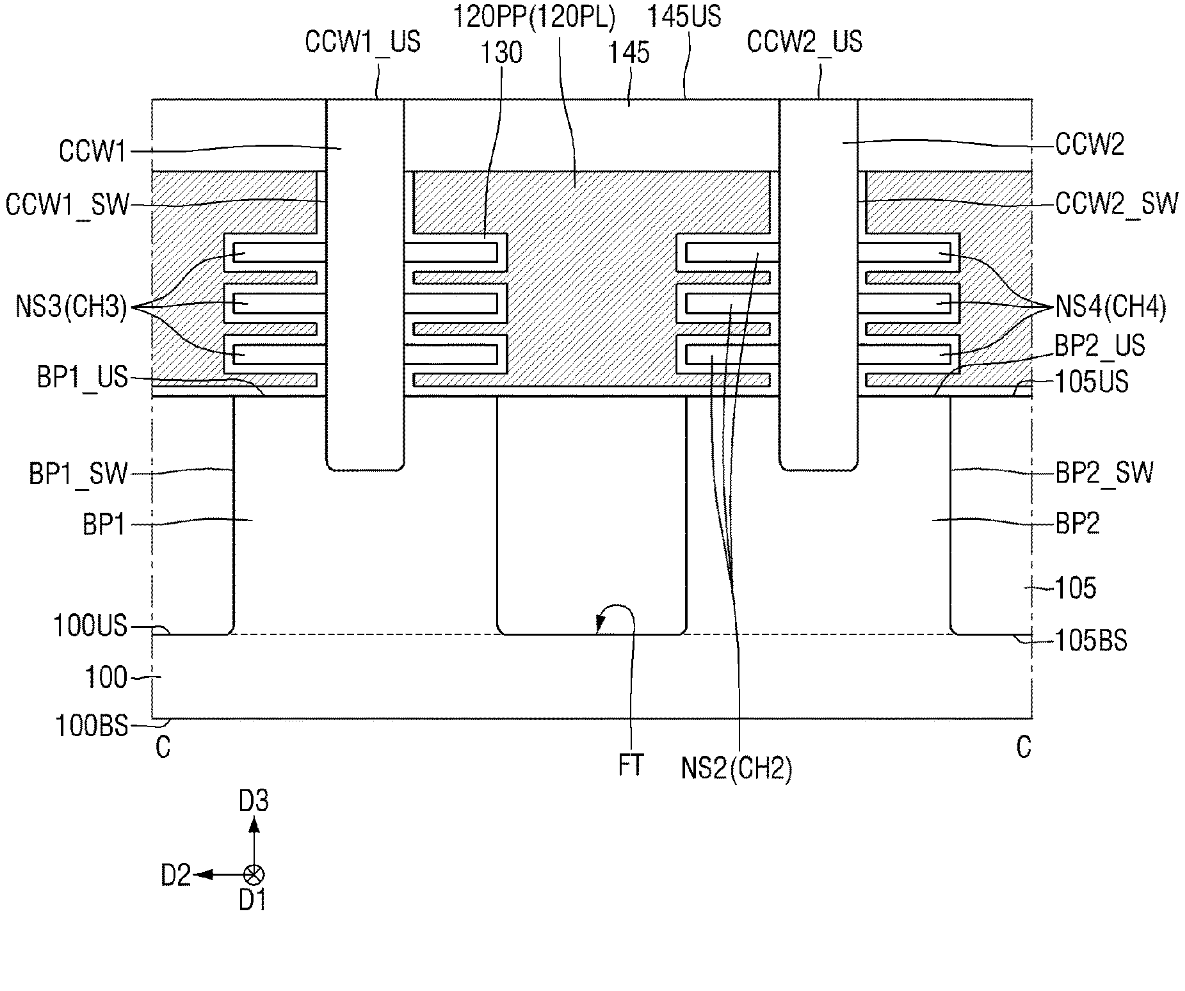
Figure 66:
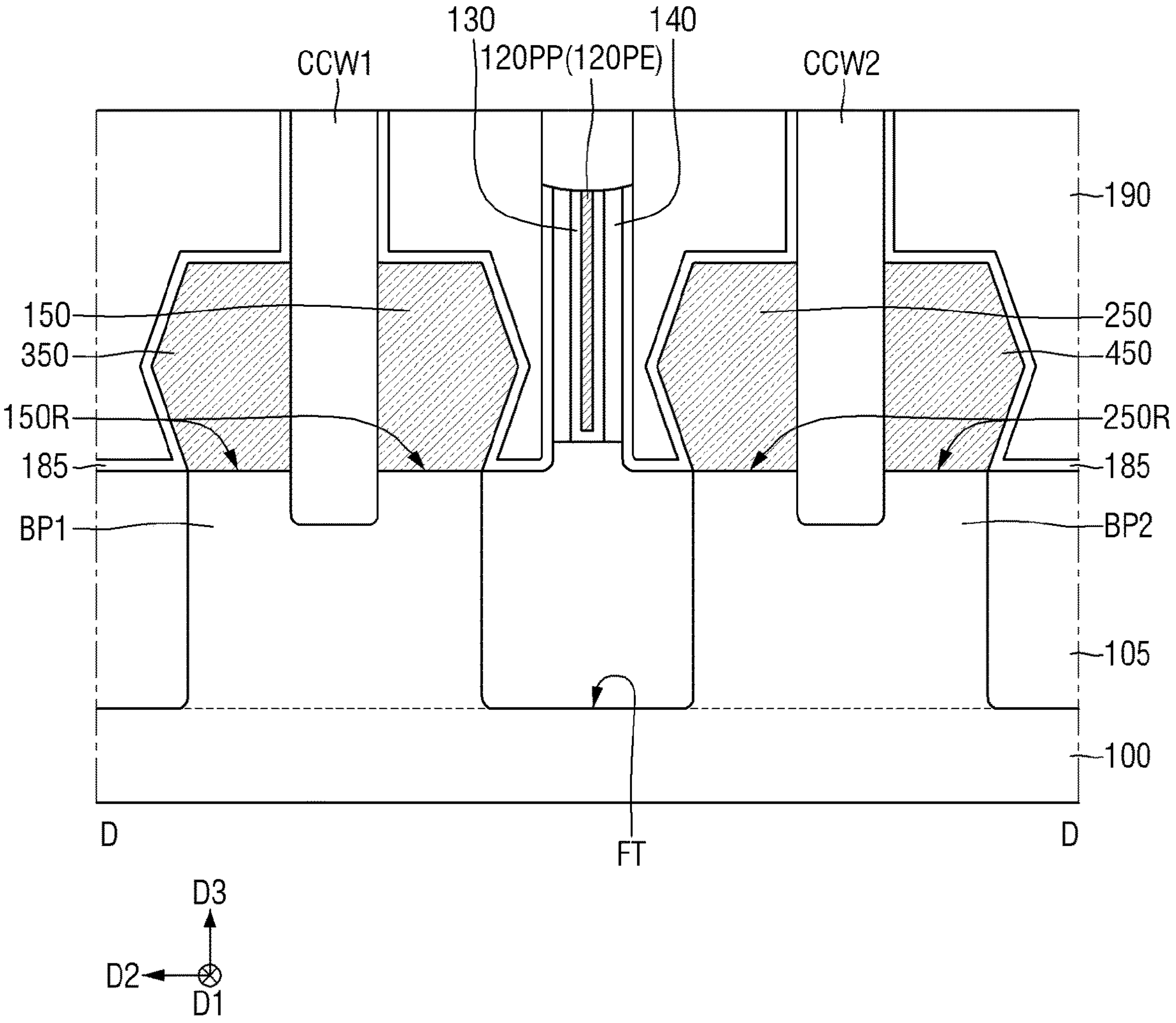
Figure 67:
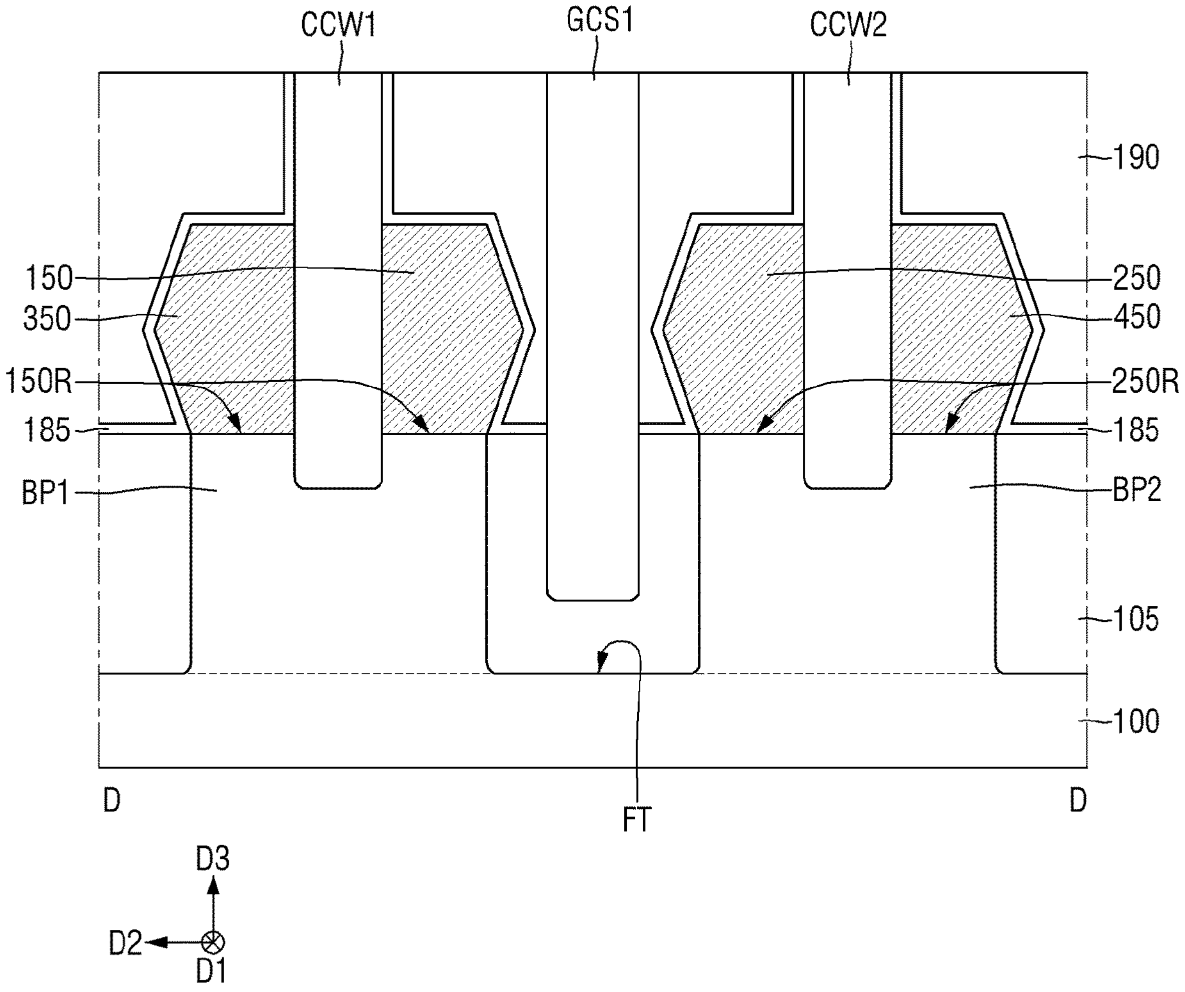

Referring to FIGS. 62 and 63, by removing the sacrificial patterns SC_P of each of the first upper pattern structures UP1, exposed by the gate trench 120t, first sheet patterns NS1, which are in contact with the first channel separation structure CCW1 and the first source/drain patterns 150, may be formed.

By removing the sacrificial patterns SC_P of each of the second upper pattern structures UP2, exposed by the gate trench 120t, second sheet patterns NS2, which are in contact with the second channel separation structure CCW2 and the second source/drain patterns 250, may be formed.

By removing the sacrificial patterns SC_P of each of the third upper pattern structures UP3, exposed by the gate trench 120t, third sheet patterns NS3 may be formed, and by removing the sacrificial patterns SC_P of each of the fourth upper pattern structures UP4, exposed by the gate trench 120t, fourth sheet patterns NS4 may be formed.

Referring to FIGS. 62 through 66, a pre-gate structure, which includes a pre-gate electrode 120PP and first gate insulating films 130, may be formed in the gate trench 120t.

First gate capping patterns 145 may be formed on the pre-gate electrode 120PP and the first gate insulating films 130. The pre-gate electrode 120PP may include extension portions 120PL and a connection portion 120PE. The extension portions 120PL of the pre-gate electrode 120PP extend in the second direction D2. The extension portions 120PL of the pre-gate electrode 120PP may be formed in the extension portions 120t_L of the gate trench 120t. The extension portions 120PL of the pre-gate electrode 120PP may intersect the first sheet patterns NS1 and the second sheet patterns NS2.

The connection portion 120PE of the pre-gate electrode 120PP extends in the first direction D1. The connection portion 120PE of the pre-gate electrode 120PP may be formed in the connection portion 120t_E of the gate trench 120t. The connection portion 120PE of the pre-gate electrode 120PP connects each set of extension portions 120PL of the pre-gate electrode 120PP that are adjacent to one another in the first direction D1.

Referring to FIGS. 64 through 67, a first gate separation structure GCS1 may be formed between extension portions 120PL of the pre-gate electrode 120PP that are adjacent to each other in the first direction D1.

The first gate separation structure GCS1 may separate the extension portions 120PL of the pre-gate electrode 120PP that are adjacent to each other in the first direction D1. During the formation of the first gate separation structure GCS1, the connection portion 120PE of the pre-gate electrode 120PP may be removed.

At least parts of the first gate insulating films 130, which extend along the sidewalls and the bottom surface of the connection portion 120PE of the pre-gate electrode 120PP, may be removed. As a result, first gate electrodes 120 may be formed.

Although not specifically illustrated, the first gate separation structure GCS1 may separate at least one extension portion 120PL of the pre-gate electrode 120PP into two parts. In this case, the two parts may become the second and third gate electrodes 220 and 320 of FIG. 34.

Figure 68:
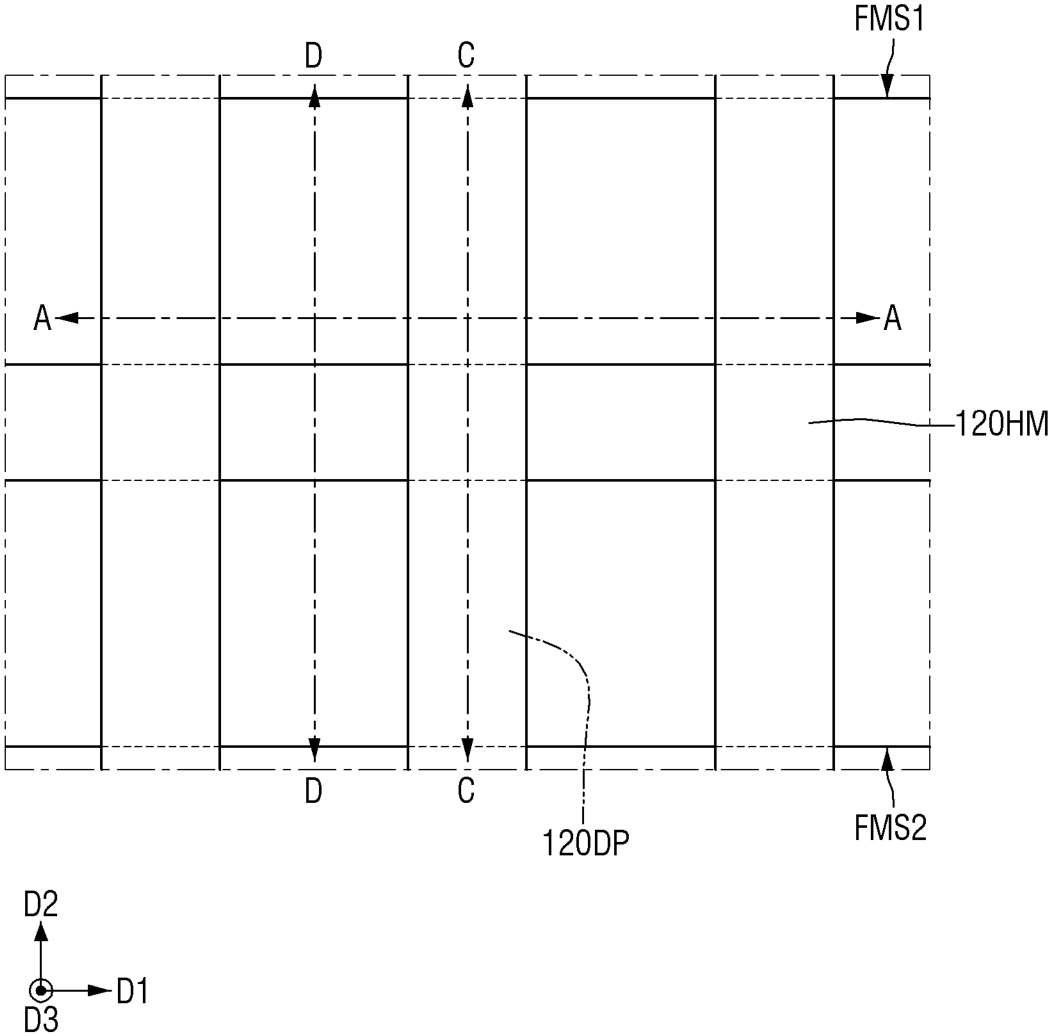
FIGS. 68 through 78 are layout views or cross-sectional views illustrating intermediate steps of an example method of fabricating a semiconductor device according to some embodiments of the present disclosure.
Figure 69:
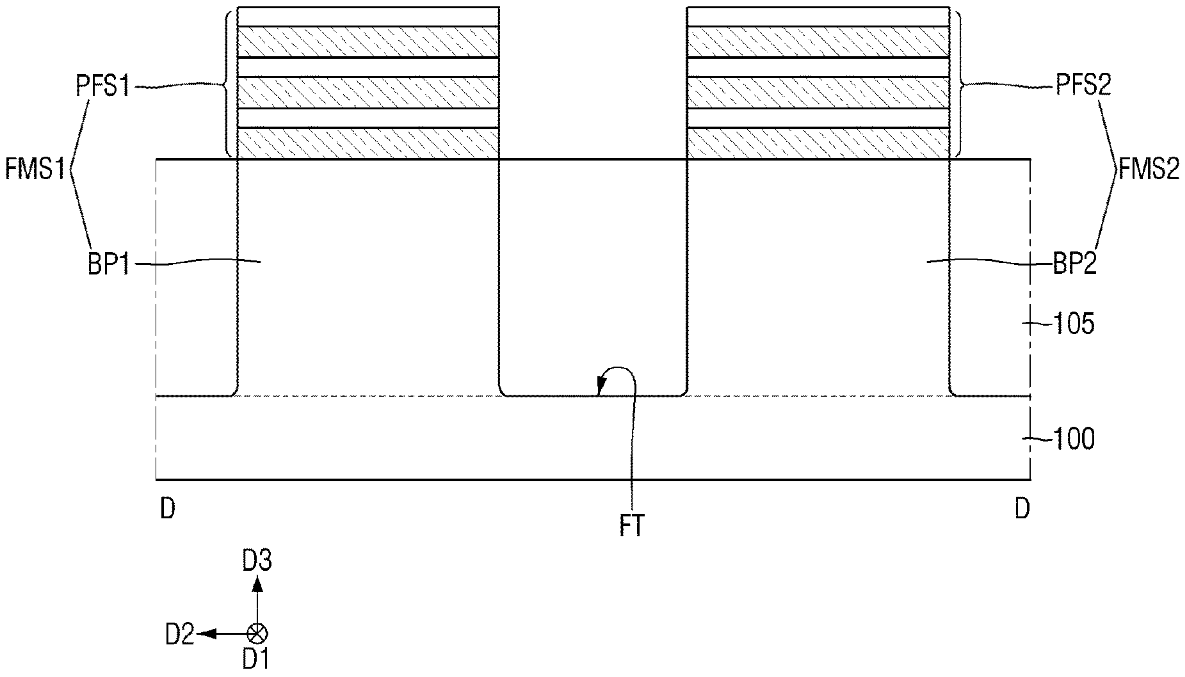

FIGS. 68 through 78 are layout views or cross-sectional views illustrating intermediate steps of an example method of fabricating a semiconductor device according to some embodiments of the present disclosure. Specifically, FIGS. 68 and 69 illustrate steps to be performed after the steps depicted in FIGS. 42 through 44.

Referring to FIGS. 68 and 69, a plurality of dummy gate electrodes 120DP may be formed on first and second mold fin-type patterns FMS1 and FMS2.

The dummy gate electrodes 120DP may extend in a second direction D2. The dummy gate electrodes 120DP are not connected to one another. The dummy gate electrodes 120DP may have a linear shape. The dummy gate electrodes 120DP may intersect the first and second mold fin-type patterns FMS1 and FMS2.

Figure 46:
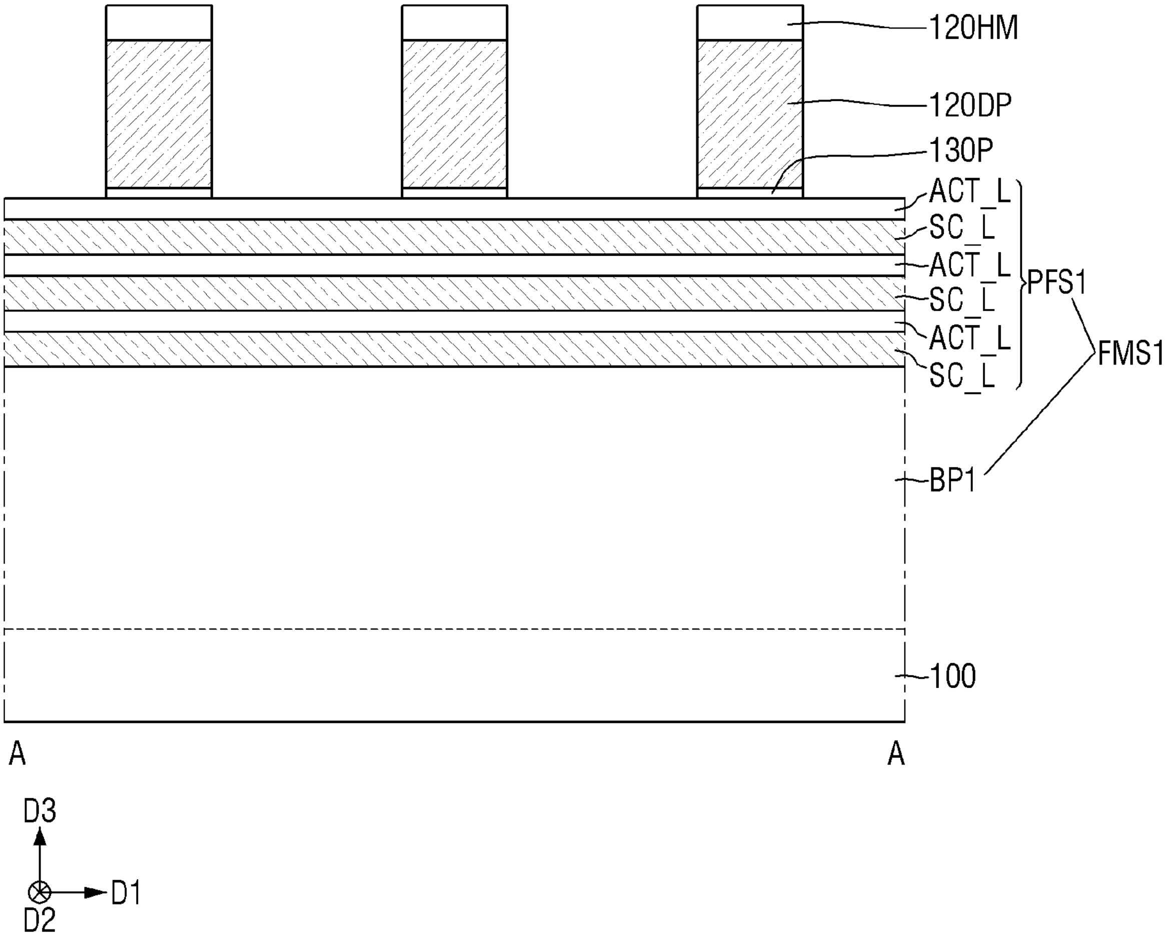
Figure 47:
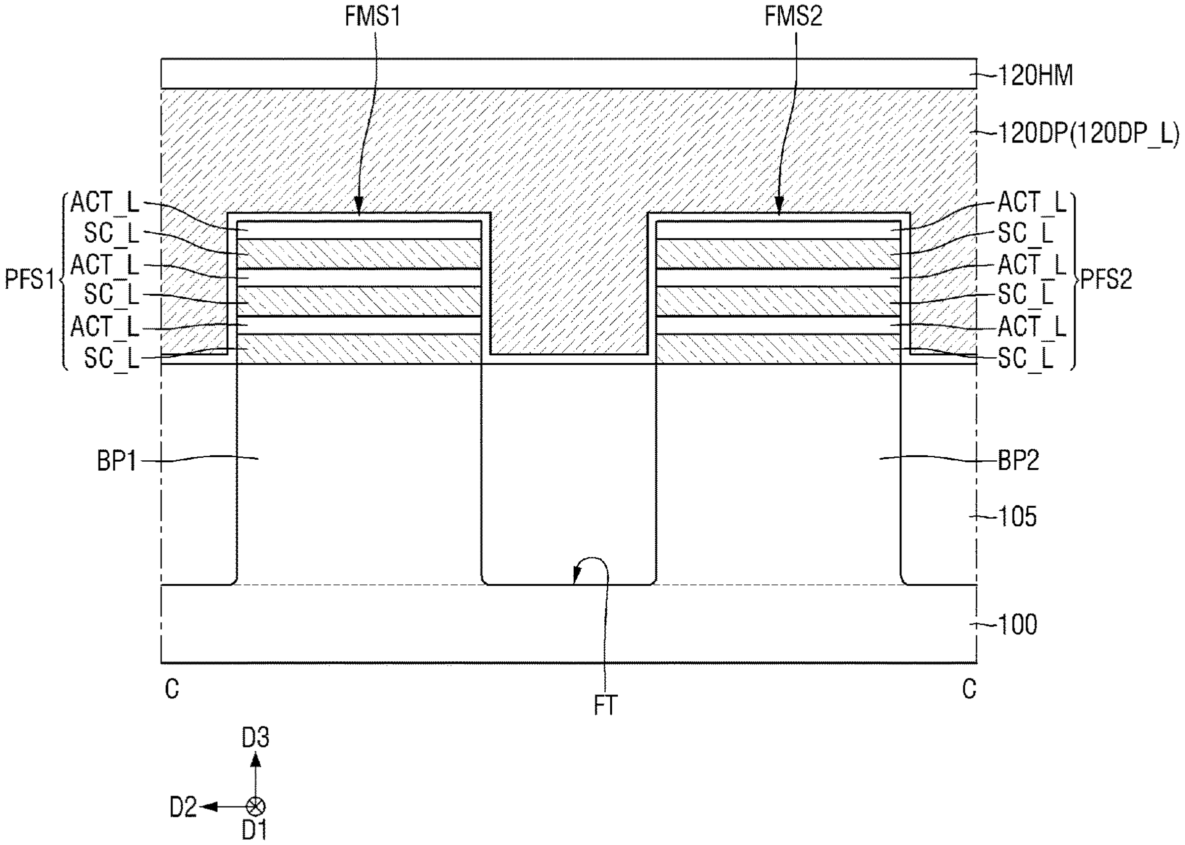
Figure 48:
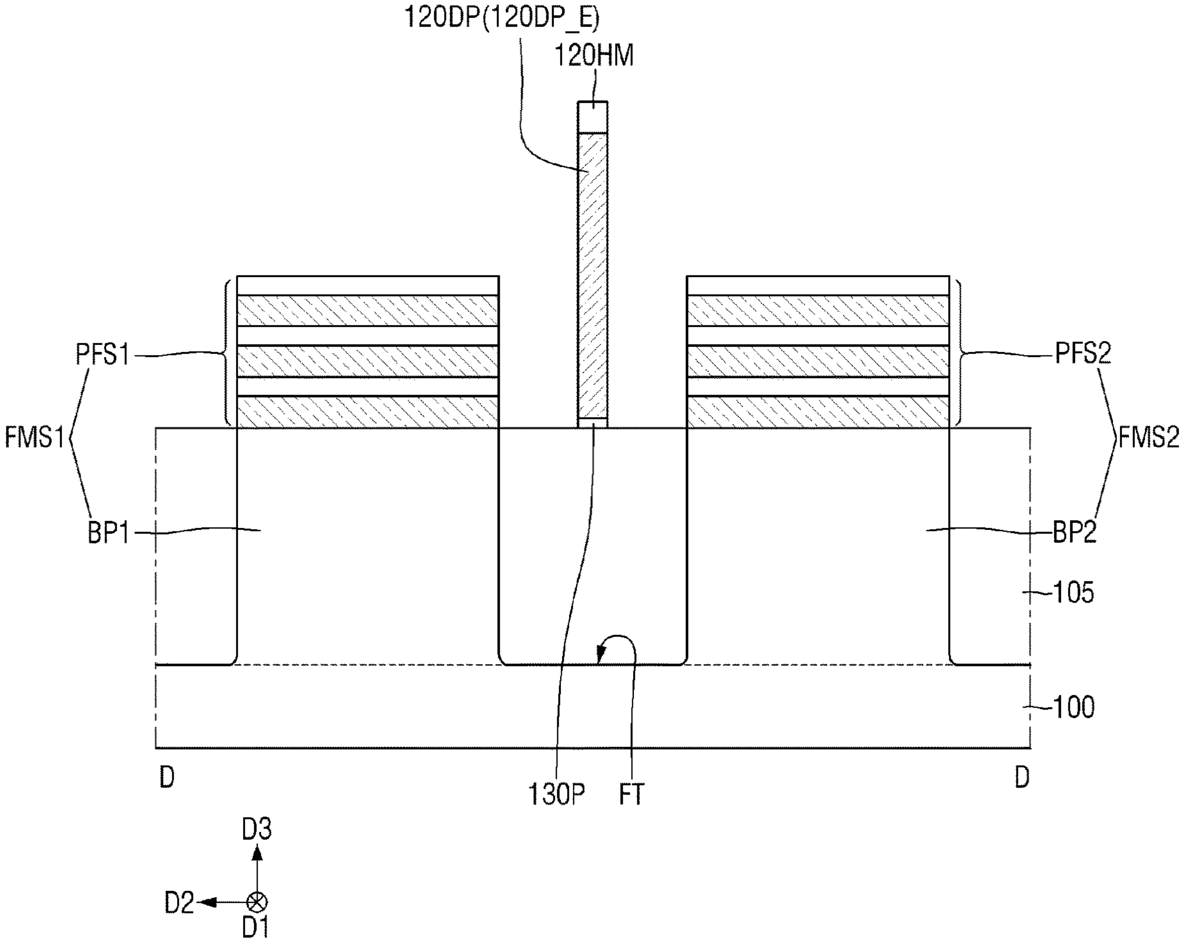

Cross-sectional views taken along lines A-A and C-C of FIG. 68 may be the same as FIGS. 46 and 47, respectively.

Figure 70:
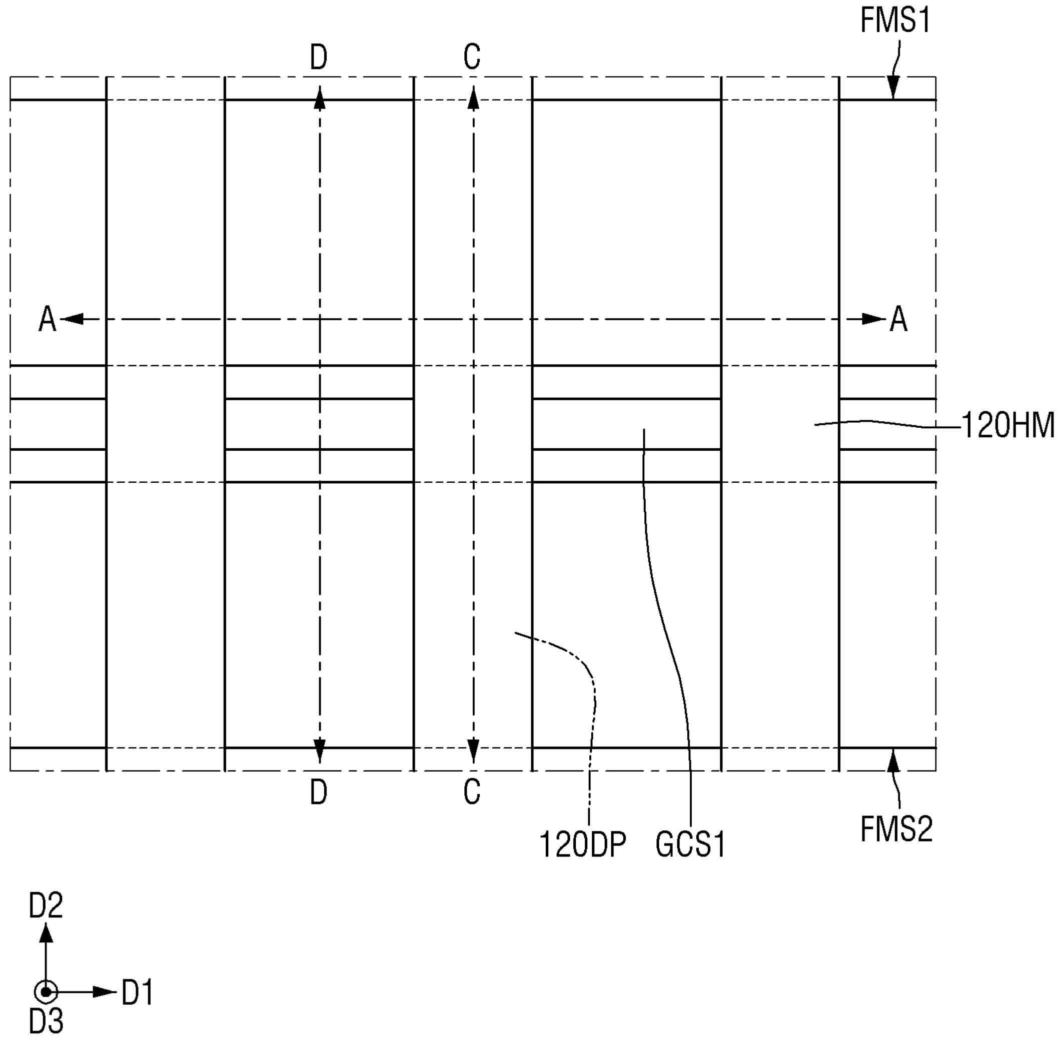
Figure 71:
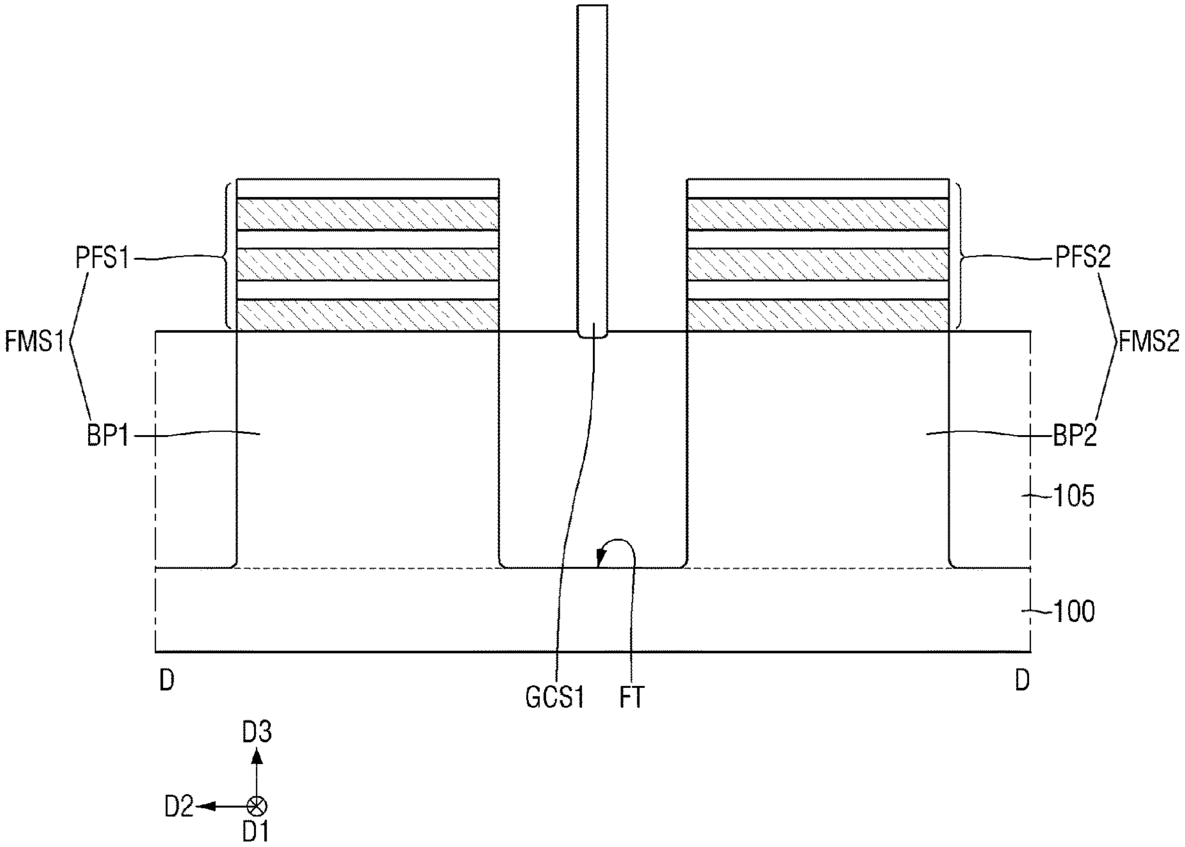

Referring to FIGS. 70 and 71, first gate separation structures GCS1 may be formed on a field insulating film 105.

The first gate separation structures GCS1 may be formed between the first and second mold fin-type patterns FMS1 and FMS2. The first gate separation structures GCS1 connect pairs of dummy gate electrodes 120DP that are adjacent to each other in the first direction D1.

Cross-sectional views taken along lines A-A and C-C of FIG. 70 may be the same as FIGS. 46 and 47, respectively.

Figure 72:
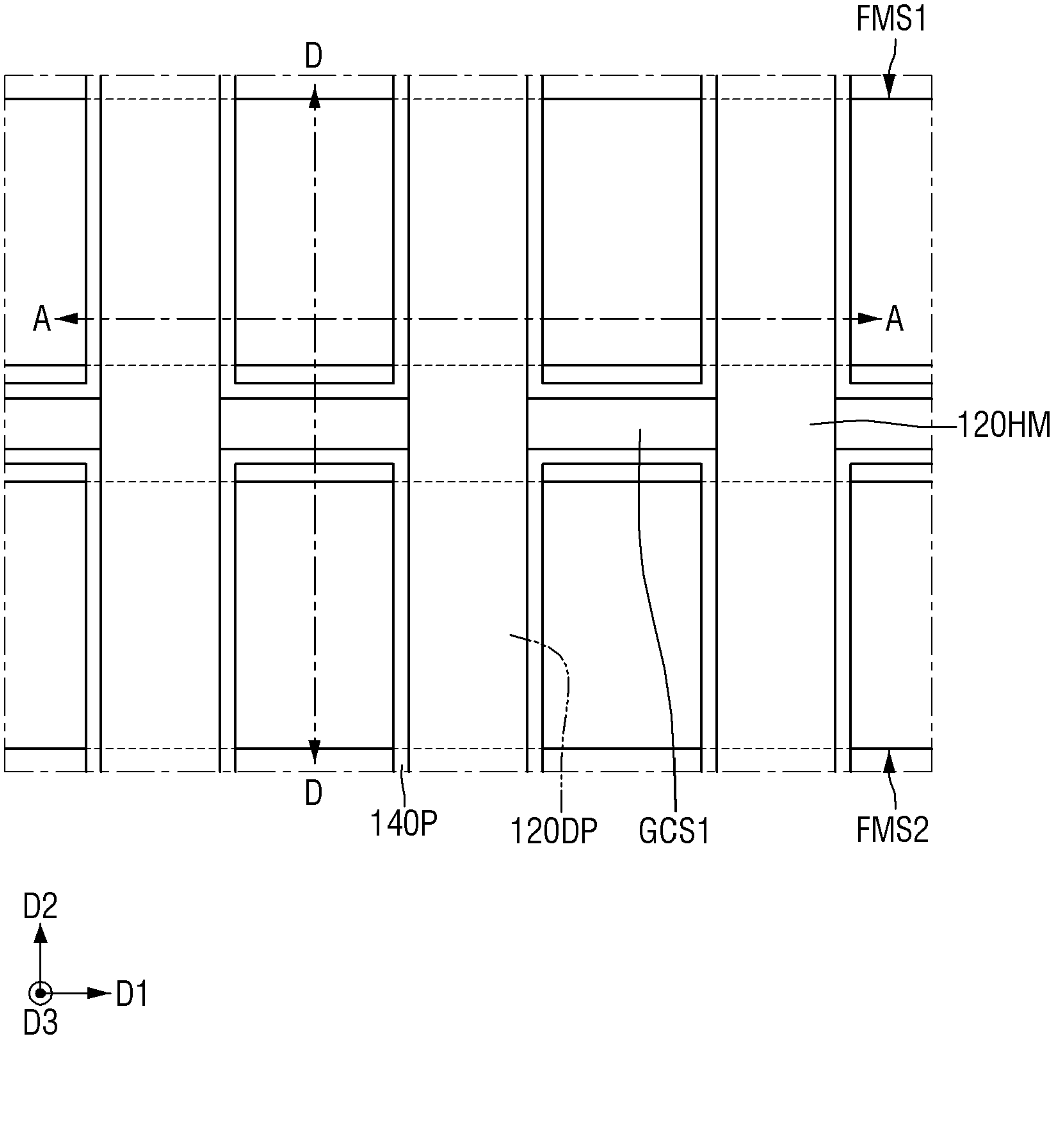
Figure 73:
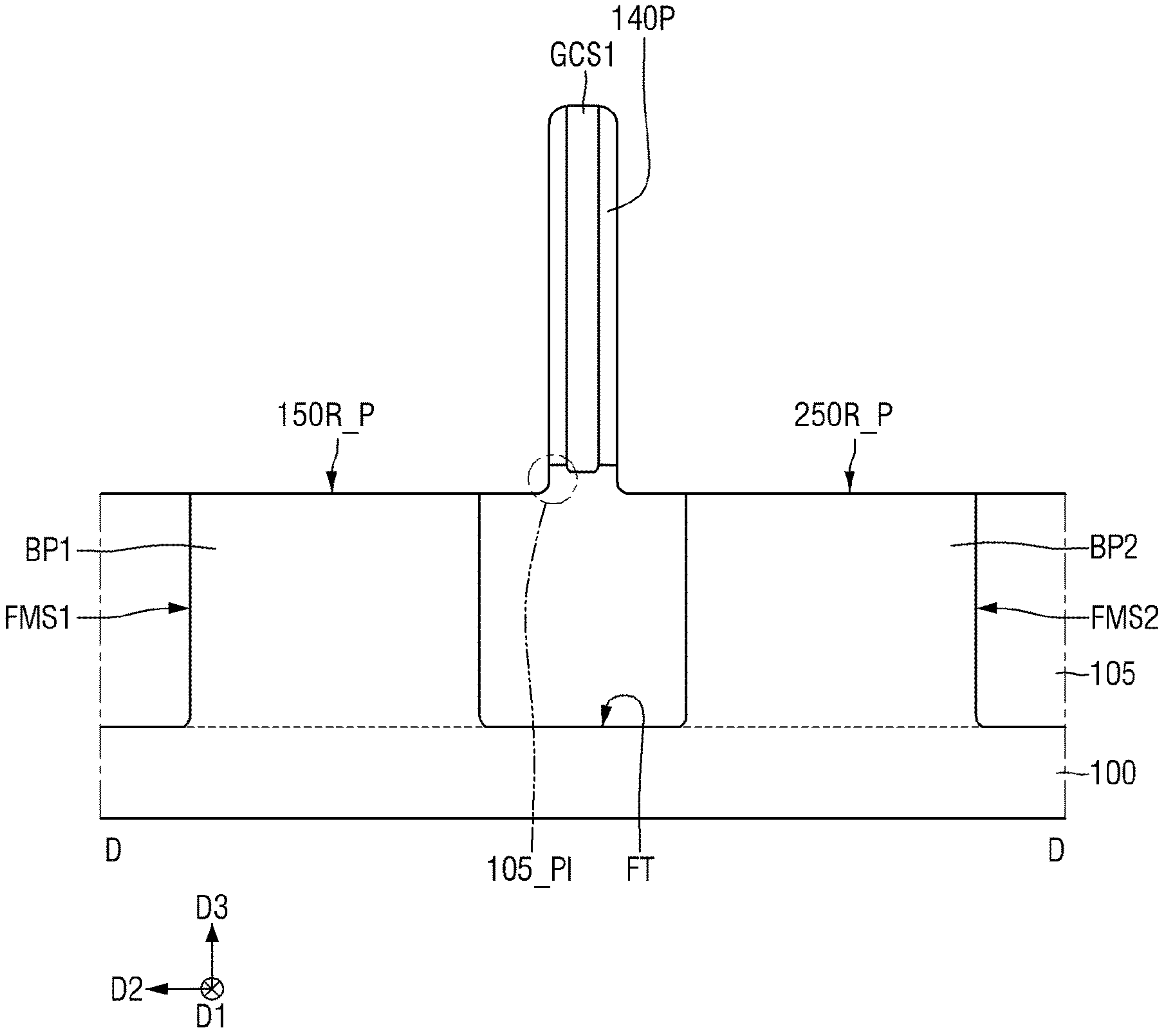

Referring to FIGS. 72 and 73, dummy gate spacers 140P may be formed on the sidewalls of the dummy gate electrodes 120DP and the sidewalls of the first gate separation structures GCS1.

During the formation of the dummy gate spacers 140P, first pre-source/drain recesses 150R_P and second pre-source/drain recesses 250R_P may be formed using the dummy gate electrodes 120DP as a mask. The first pre-source/drain recesses 150R_P may be formed in the first mold fin-type pattern FMS1. The second pre-source/drain recesses 250R_P may be formed in the second mold fin-type pattern FMS2.

A cross-sectional view taken along line A-A of FIG. 72 may be the same as FIG. 50.

Figure 74:
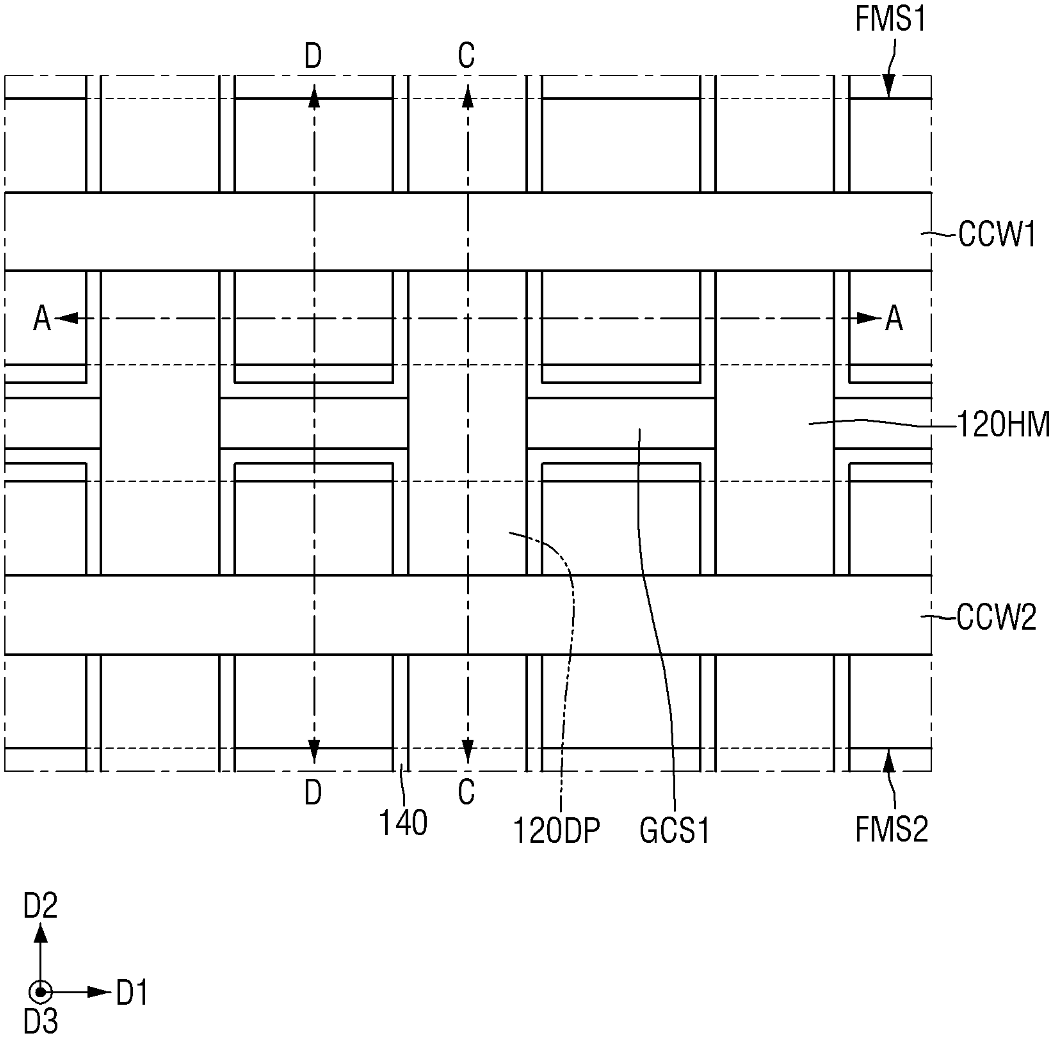
Figure 75:
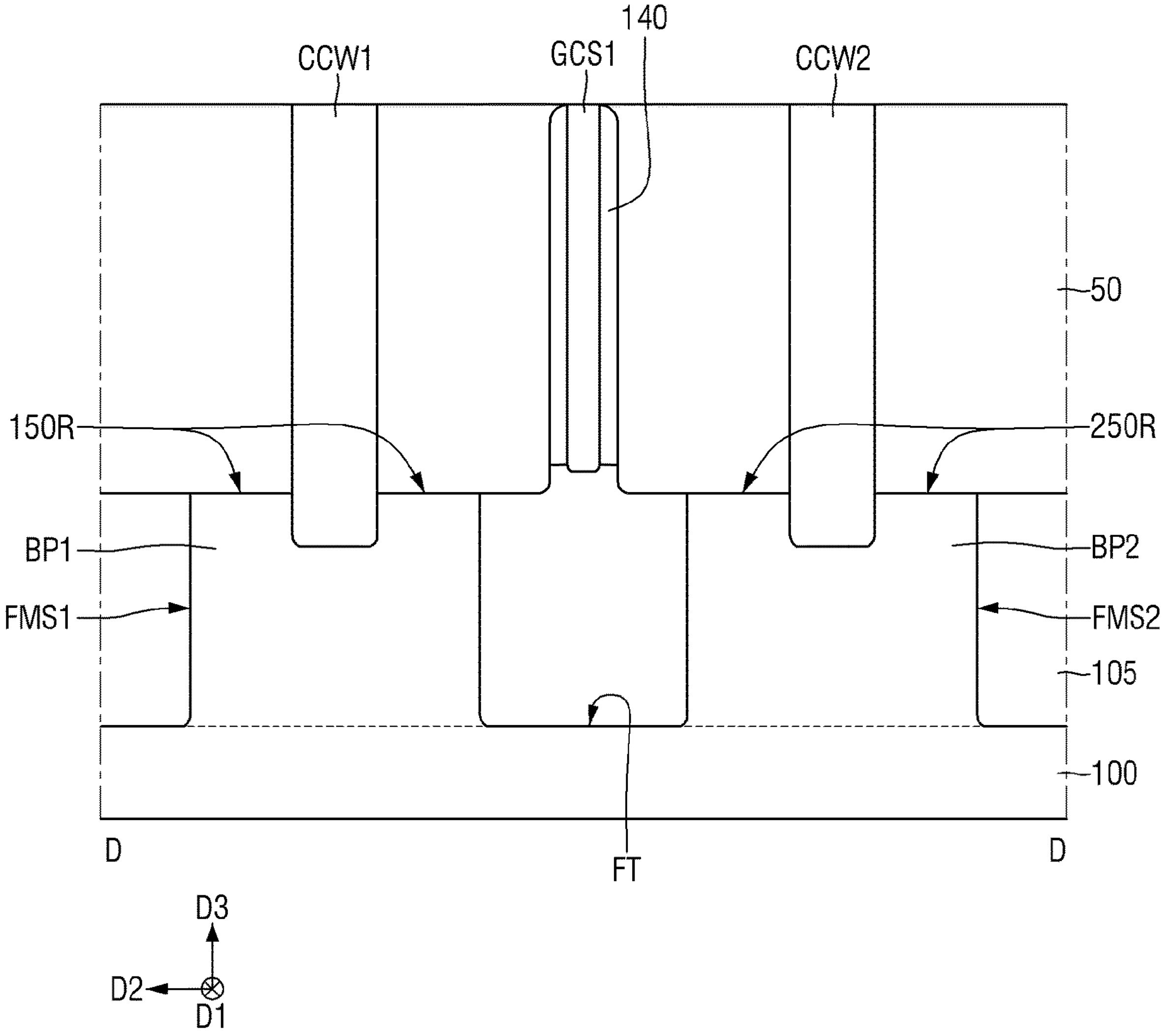

Referring to FIGS. 74 and 75, a first channel separation structure CCW1 may be formed on a first lower pattern BP1. A second channel separation structure CCW2 may be formed on a second lower pattern BP2.

During the formation of the first and second channel separation structures CCW1 and CCW2, first upper pattern structures UP1, second upper pattern structures UP2, third upper pattern structures UP3, and fourth upper pattern structures UP4 may be formed. Also, first source/drain recesses 150R and second source/drain recesses 250R may be formed. First gate spacers 140 may be formed.

The formation of the first and second channel separation structures CCW1 and CCW2 may be performed in substantially the same manner as that described above with reference to FIGS. 52 through 55.

Figure 76:
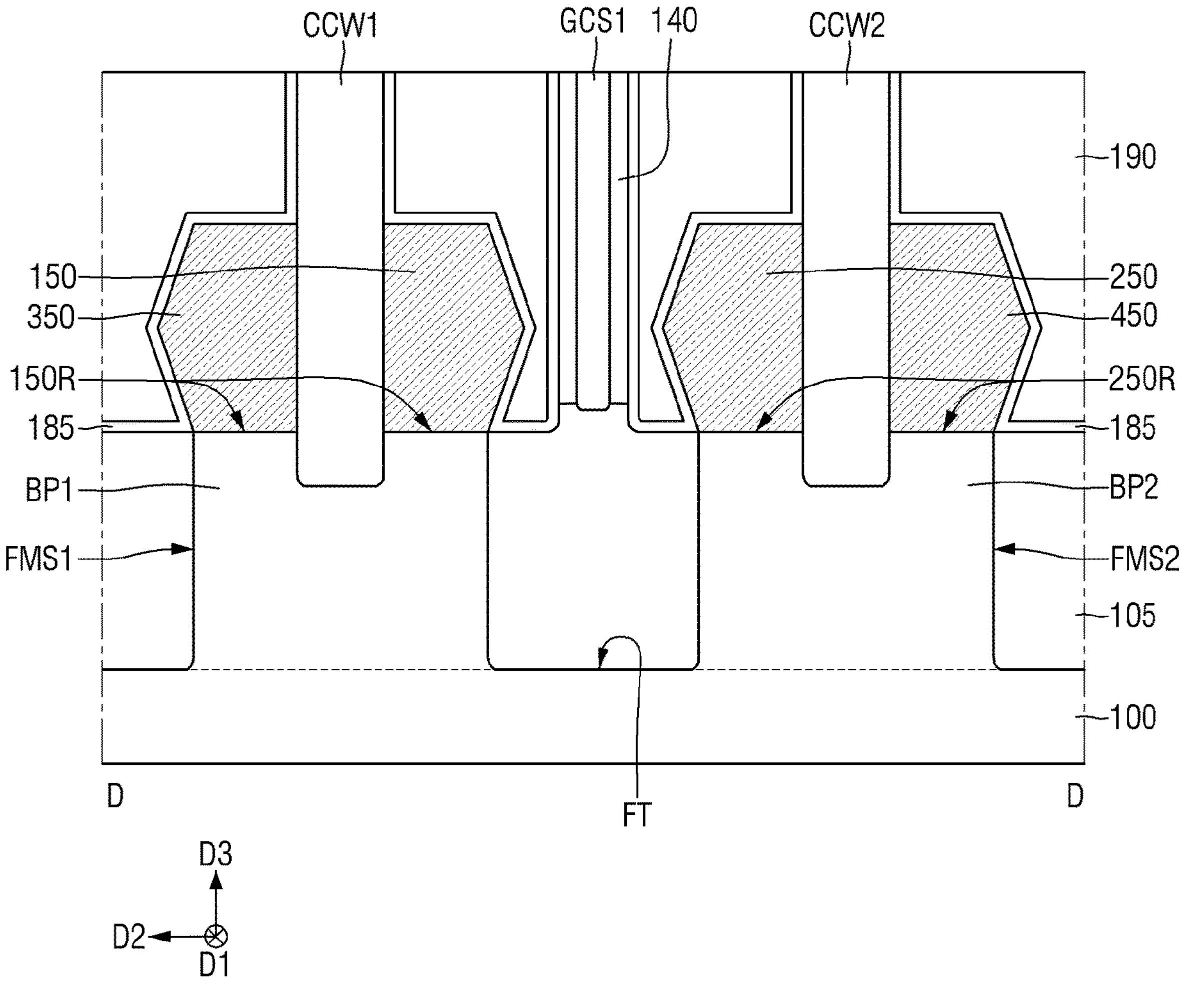
Figure 77:
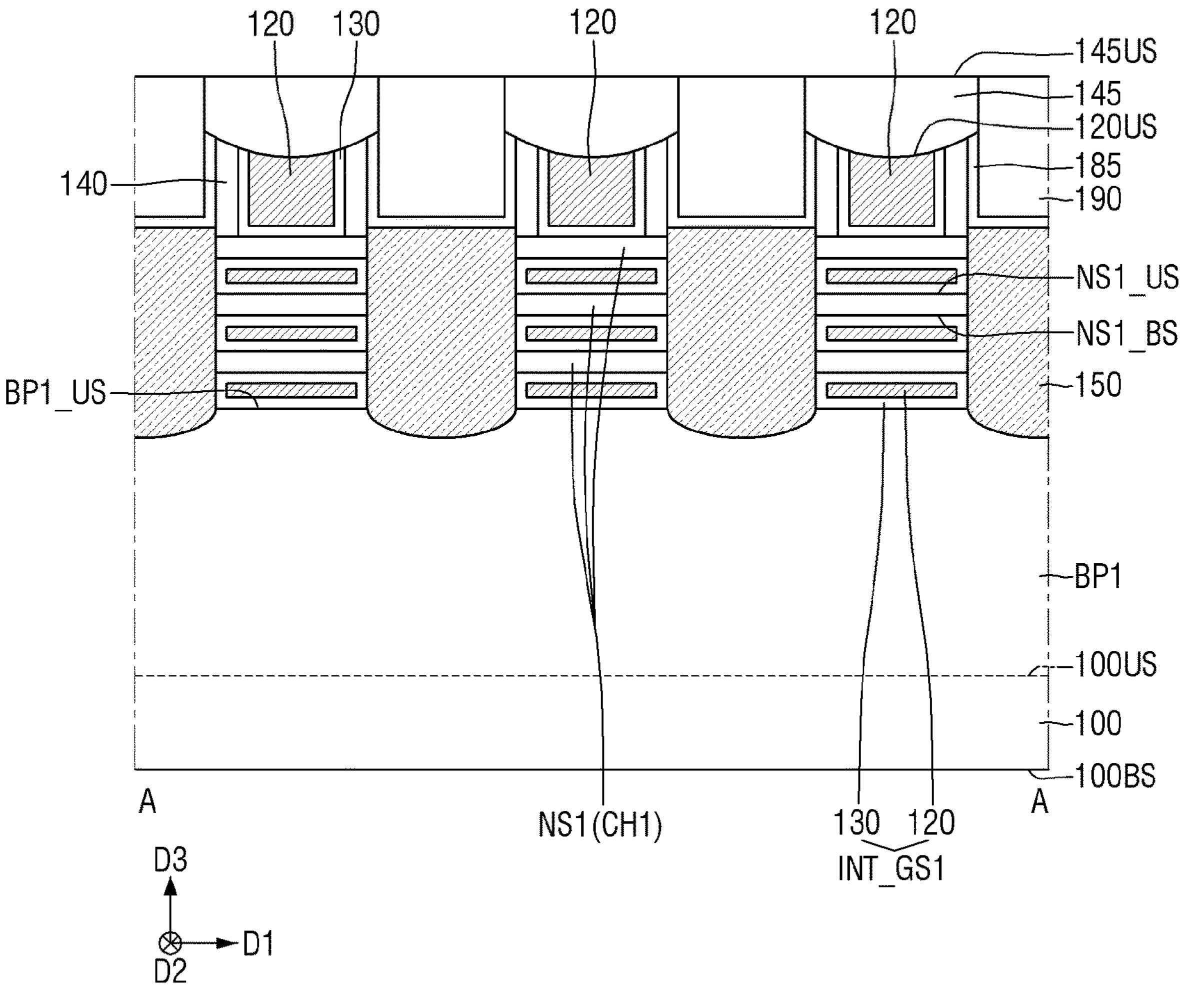
Figure 78:
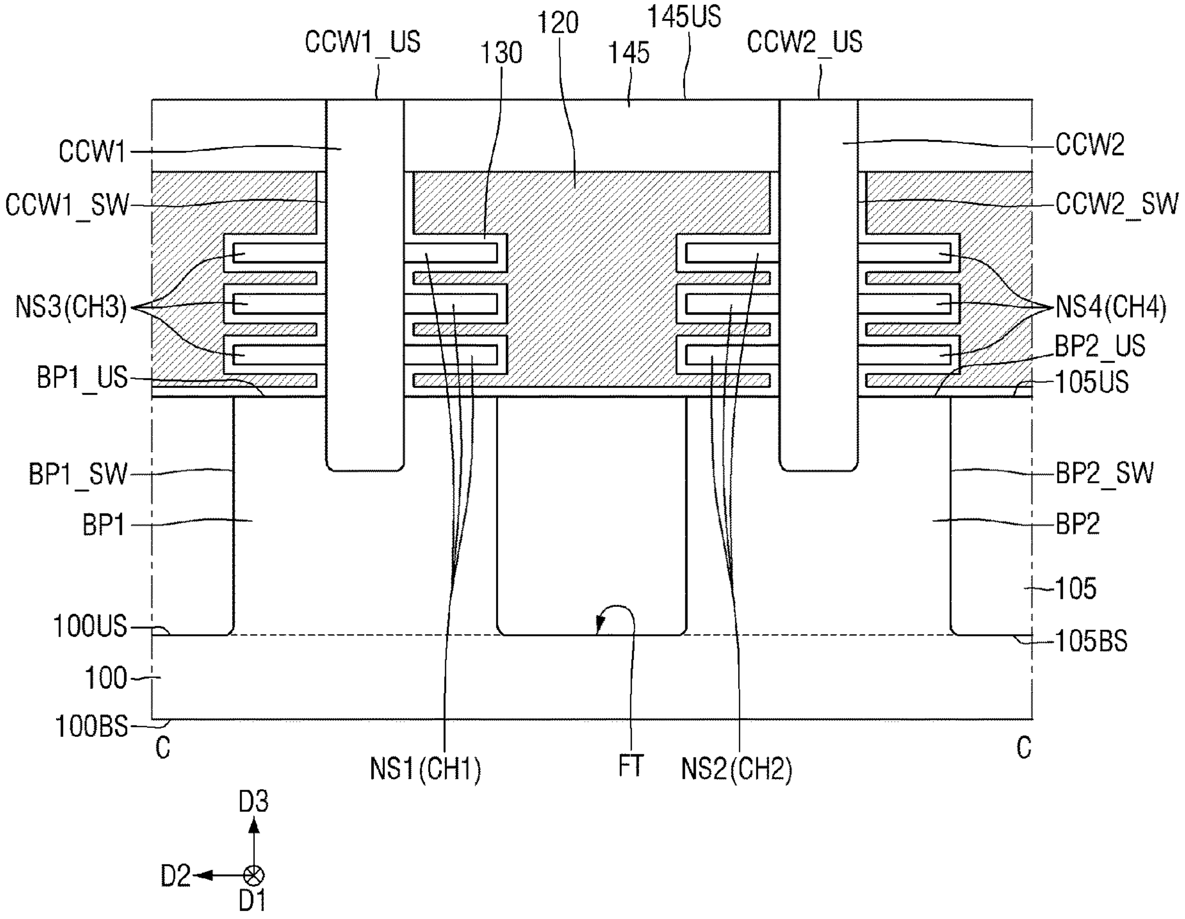

Referring to FIGS. 74 through 76, a sacrificial insulating film 50 is removed.

First source/drain patterns 150 and third source/drain patterns 350 may be formed in the first source/drain recesses 150R. Second source/drain patterns 250 and fourth source/drain patterns 450 may be formed in the second source/drain recesses 250R.

Thereafter, source/drain etch stopper films 185 and upper interlayer insulating films 190 may be formed on the first source/drain patterns 150, the second source/drain patterns 250, the third source/drain patterns 350, and the fourth source/drain patterns 450. The dummy gate electrodes 120DP may be exposed.

The steps depicted in FIG. 76 may be substantially the same as the steps described with reference to FIGS. 56 through 58.

Referring to FIGS. 59 through 63 and 76 through 78, a gate trench 120*t* may be formed by removing the dummy gate electrodes 120DP and the dummy gate insulating films 130P.

The gate trench 120*t* may expose the first upper pattern structures UP1, the second upper pattern structures UP2, the third upper pattern structures UP3, and the fourth upper pattern structures UP4. Sacrificial patterns SC_P may be removed from each of the first upper pattern structures UP1, second upper pattern structures UP2, third upper pattern structures UP3, and fourth upper pattern structures UP4 that are exposed. Consequently, first sheet patterns NS1, second sheet patterns NS2, third sheet patterns NS3, and fourth sheet patterns NS4 may be formed.

Thereafter, first gate electrodes 120 and first gate insulating films 130 may be formed in the gate trench 120*t*. The first gate electrodes 120 may intersect the first sheet patterns NS1 and the second sheet patterns NS2.

FIGS. 79 through 83 are cross-sectional views illustrating intermediate steps of an example method of fabricating a semiconductor device according to some embodiments of the present disclosure.

Figure 45:
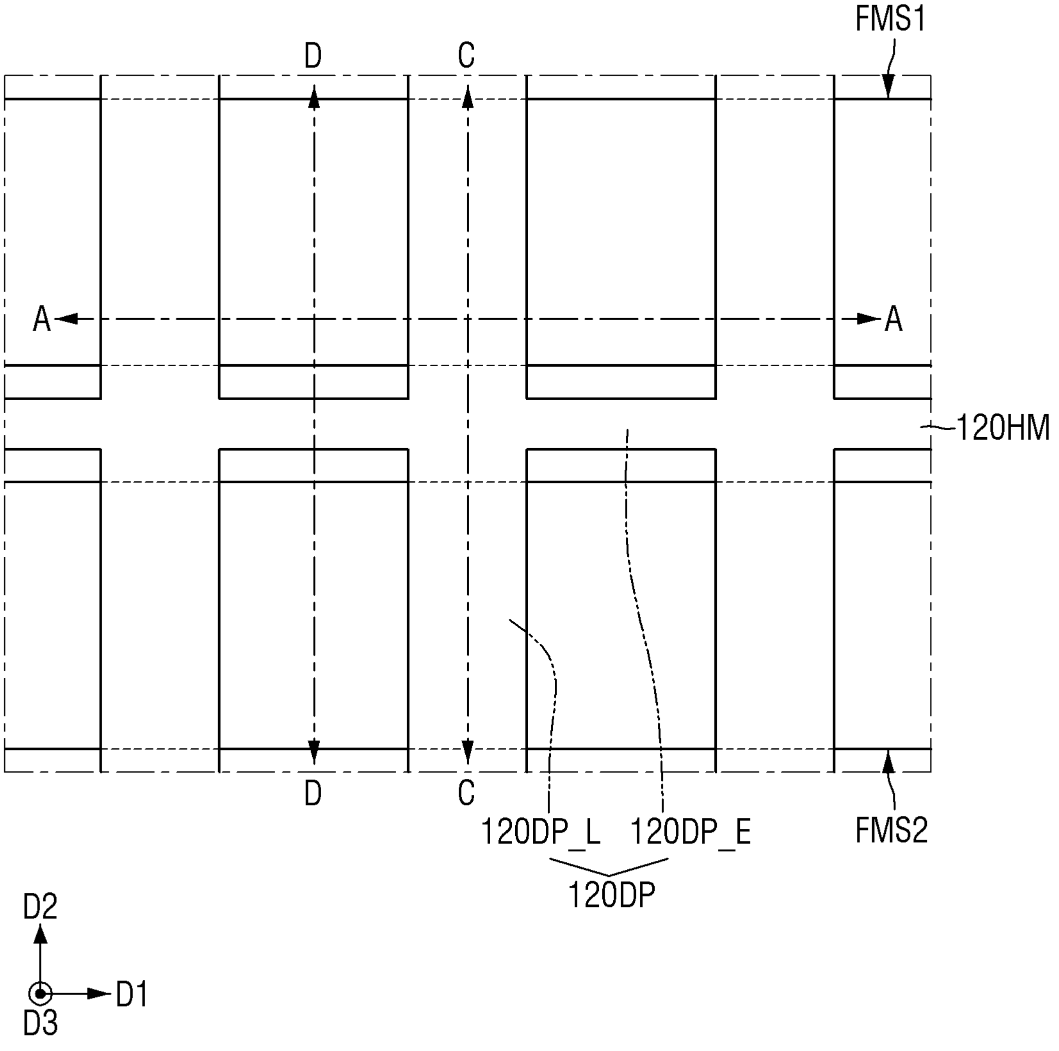
Figure 79:
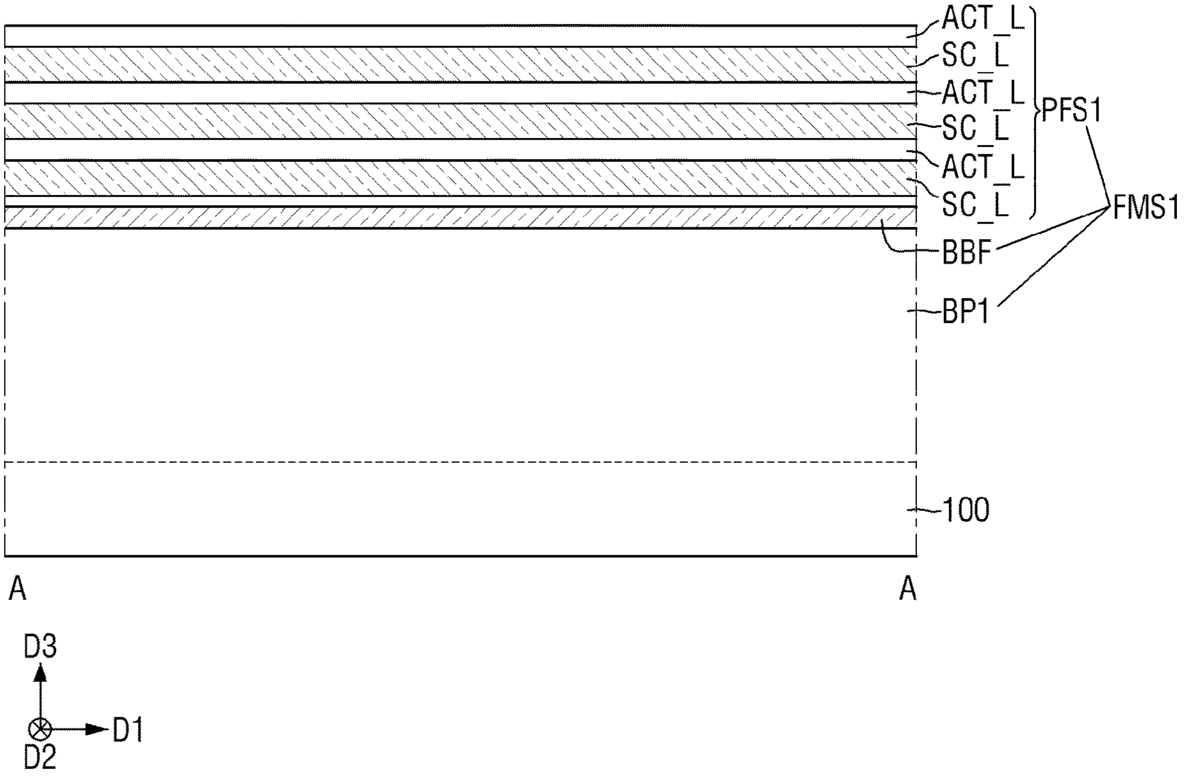
FIGS. 79 through 83 are cross-sectional views illustrating intermediate steps of an example method of fabricating a semiconductor device according to some embodiments of the present disclosure.
Figure 80:
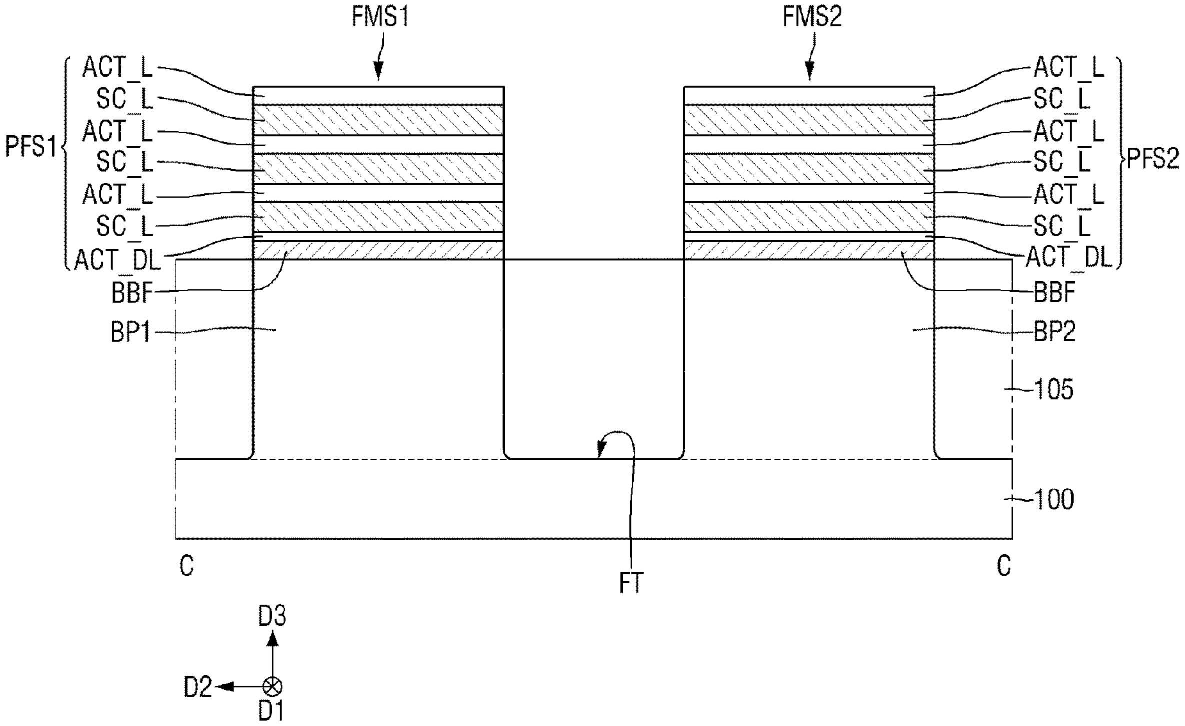

Specifically, FIGS. 79 and 80 are cross-sectional views taken along lines A-A and C-C, respectively, of FIG. 42, and FIGS. 81, 82, and 83 are cross-sectional views taken along lines A-A, C-C, and D-D, respectively, of FIG. 45.

Referring to FIGS. 79 and 80, a first mold fin-type pattern FMS1 may include a lower buffer pattern BBF, which is disposed between a first lower pattern BP1 and a first pre-pattern structure PFS1 in the third direction D3. The first pre-pattern structure PFS1 may further include a pre-dummy active pattern ACT_DL.

Similarly, a second mold fin-type pattern FMS2 may include a lower buffer pattern BBF, which is disposed between a second lower pattern BP2 and a second pre-pattern structure PFS2 in the third direction D3. The second pre-pattern structure PFS2 may further include a pre-dummy active pattern ACT_DL.

Alternatively, contrary to what is depicted, in some embodiments the first and second pre-pattern structures PFS1 and PFS2 may not include the pre-dummy active patterns ACT_DL.

For example, the pre-dummy active patterns ACT_DL may include Si films. The lower buffer patterns BBF may include a material with an etch selectivity with respect to pre-active patterns ACT_L and pre-sacrificial patterns SC_L.

For example, the pre-sacrificial patterns SC_L may include SiGe films doped with C, and the lower buffer patterns BBF may include SiGe films. In another example, the pre-sacrificial patterns SC_L may include SiGe films, and the lower buffer patterns BBF may include SiGe films doped with C. The etch rate of a SiGe film may vary depending on whether or not the SiGe film is doped with C. That is, the pre-sacrificial patterns SC_L may have an etch selectivity with respect to the lower buffer patterns BBF.

The etch selectivity of the lower buffer patterns BBF and the pre-active patterns ACT_L is not particularly limited. The material of the lower buffer pattern BBF is not restricted to a specific type as long as it exhibits etch selectivity toward the pre-active patterns ACT_L and the pre-sacrificial patterns SC_L.

Figure 81:
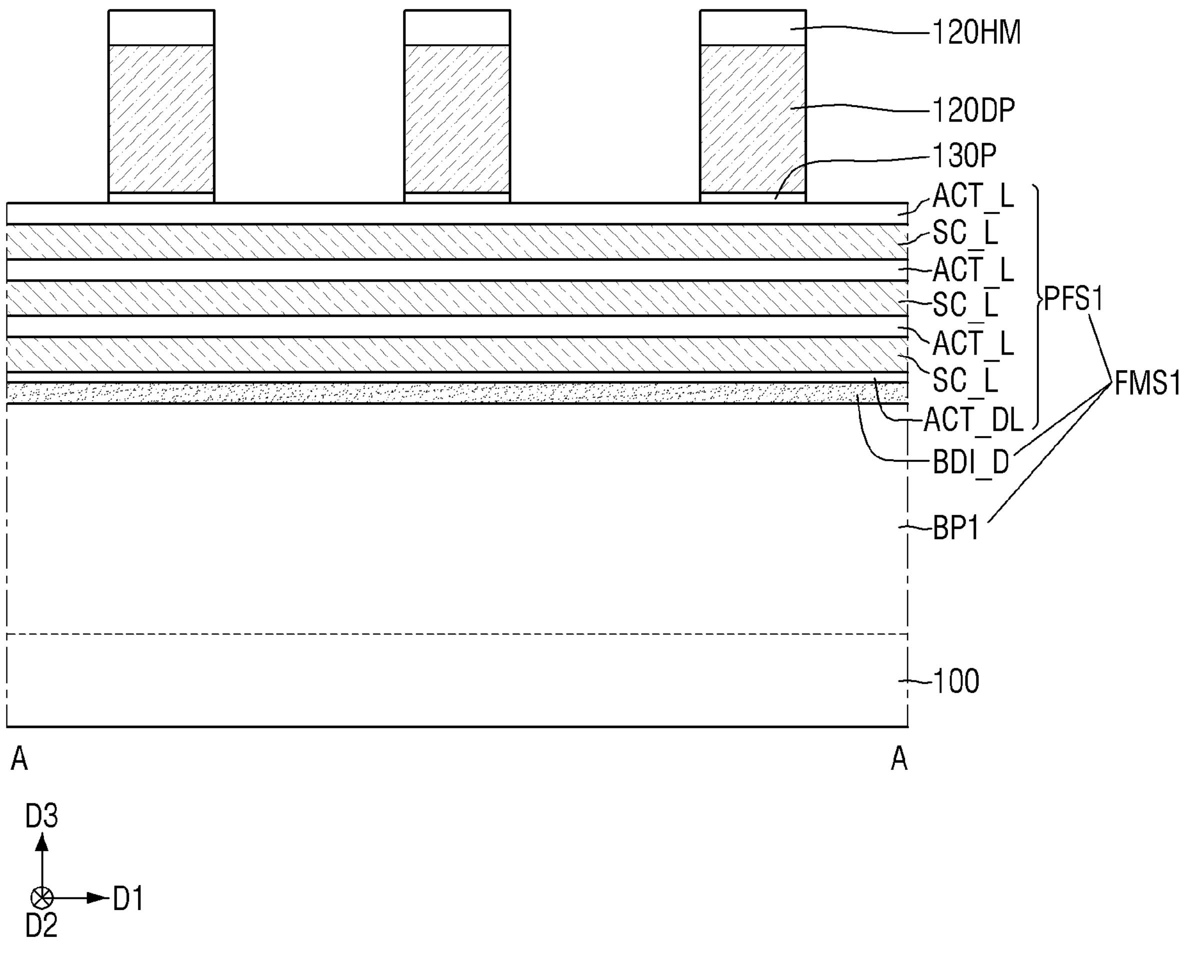
Figure 82:
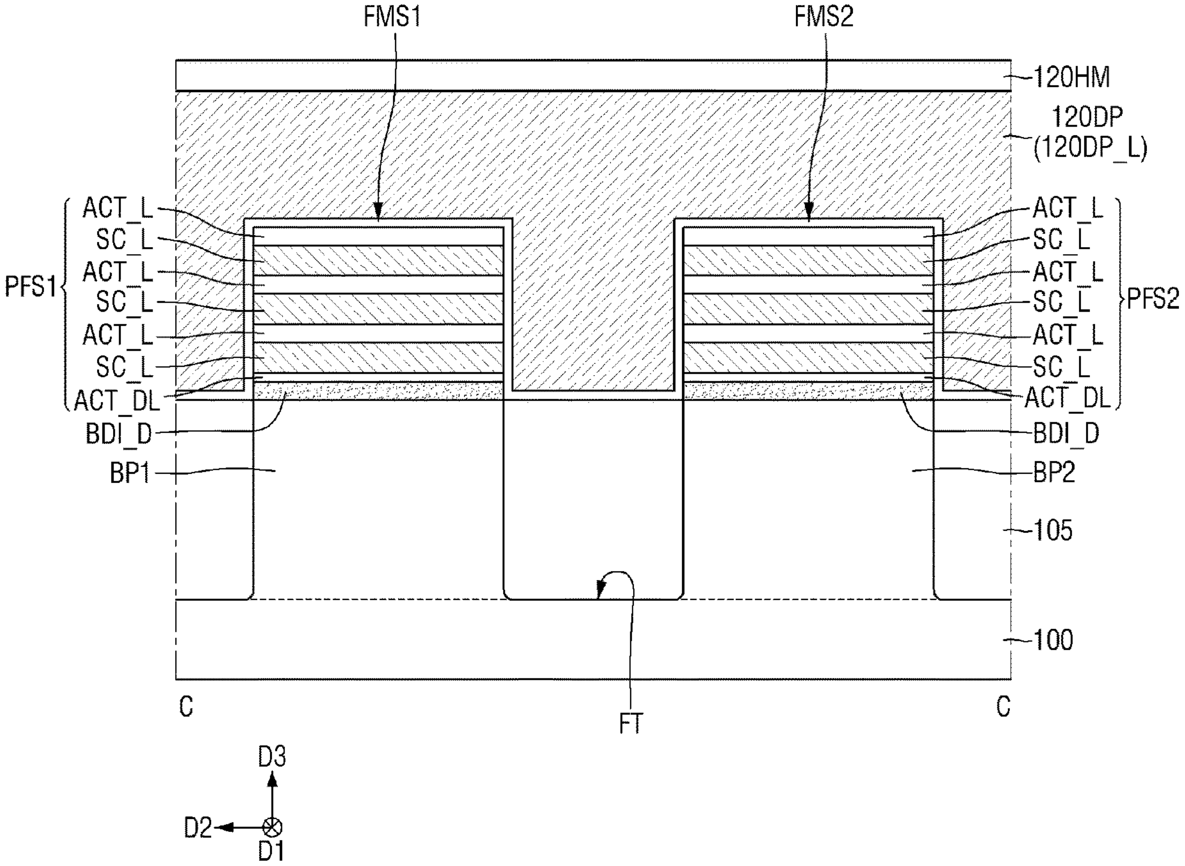
Figure 83:
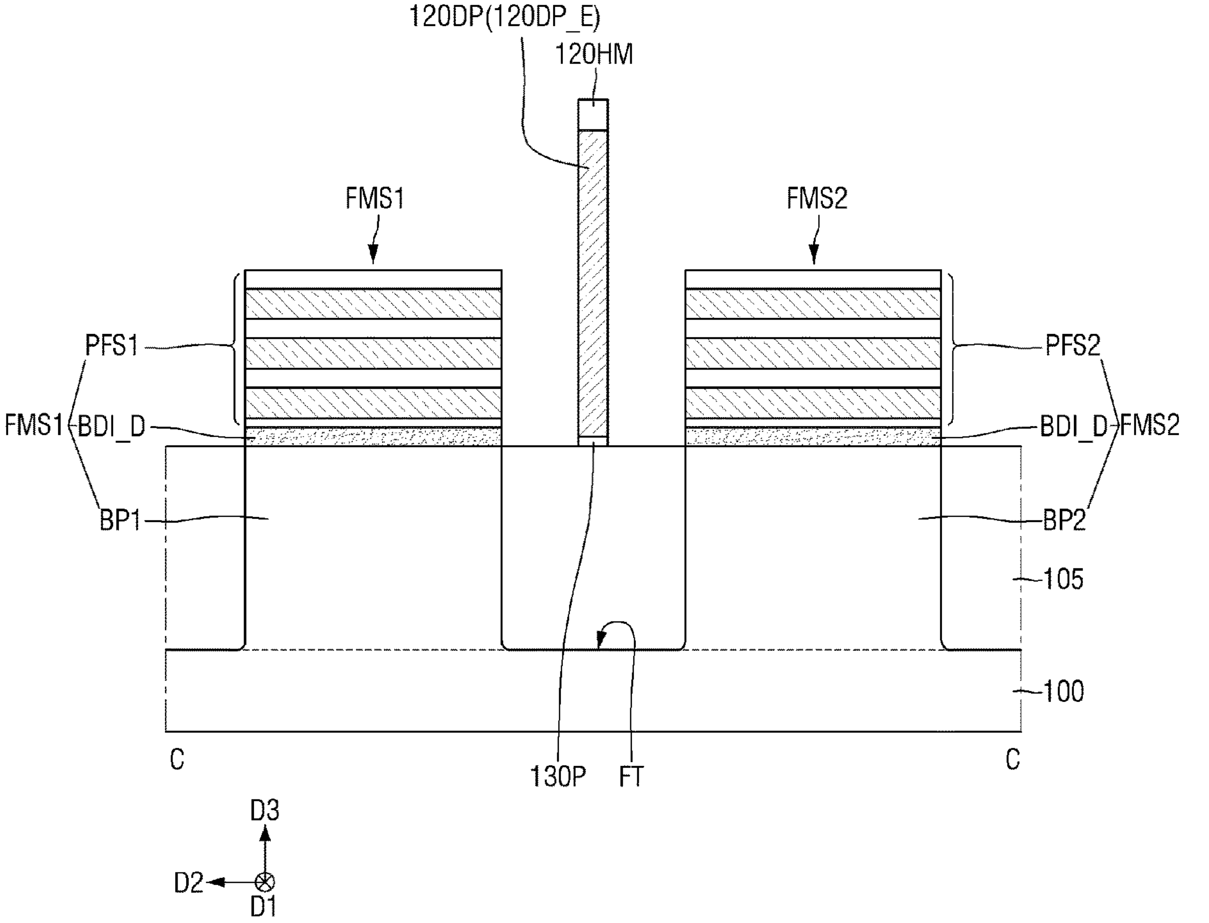

Referring to FIGS. 81 through 83, dummy gate electrodes 120DP may be formed on the first and second mold fin-type patterns FMS1 and FMS2.

Thereafter, the lower buffer patterns BBF may be redisposed with pre-lower insulating patterns BDI_D. Specifically, spaces may be formed between the first lower pattern BP1 and the first pre-pattern structure PFS1 and between the second lower pattern BP2 and the second pre-pattern structure PFS2 by removing the lower buffer patterns BBF. As the lower buffer patterns BBF have etch selectivity toward the pre-sacrificial patterns SC_L and the lower buffer patterns BBF, the lower buffer patterns BBF can be selectively removed. The spaces between the first lower pattern BP1 and the first pre-pattern structure PFS1 and between the second lower pattern BP2 and the second pre-pattern structure PFS2 can be filled with an insulating material. As a result, pre-lower insulating patterns BDI_D may be formed.

Thereafter, the steps depicted in FIGS. 49 through 67 may be performed. During the formation of first and second channel separation structures CCW1 and CCW2, each of the pre-lower insulating patterns BDI_D may be separated into two parts.

Alternatively, the steps depicted in FIGS. 68 through 78 may be performed after the steps depicted in FIGS. 79 and 80.

Although the embodiments of the present disclosure have been described with reference to the accompanying drawings, the present disclosure is not limited to the above embodiments and may be implemented in various different forms. Those of ordinary skill in the technical field to which the present disclosure belongs will be able to understand that the present disclosure may be implemented in other specific forms without changing the technical idea or essential characteristics of the present disclosure. Therefore, it should be understood that the embodiments as described above are not restrictive but illustrative in all respects.

What is claimed is:

1. A semiconductor device, comprising:

a first channel separation structure extending in a first direction;

a second channel separation structure spaced apart from the first channel separation structure in a second direction intersecting the first direction and extending in the first direction;

a plurality of first gate structures spaced apart from each other in the first direction between the first and second channel separation structures, the first gate structures being respectively in contact with the first and second channel separation structures and including respective first gate electrodes and respective first gate insulating films;

first channel patterns including a respective plurality of first sheet patterns, which are spaced apart from each other in a third direction, perpendicular to the first and second directions, and are in contact with the first channel separation structure;

second channel patterns including a respective plurality of second sheet patterns, which are spaced apart from each other in the third direction and are in contact with the second channel separation structure;

first source/drain patterns between the first and second channel separation structures and respective in contact with the first channel patterns and the first channel separation structure;

second source/drain patterns between the first and second channel separation structures and respectively in contact with the second channel patterns and the second channel separation structure; and first gate separation structures between the first source/drain patterns and the second source/drain patterns.

2. The semiconductor device of claim 1, wherein an upper surface of the first channel separation structure is coplanar with upper surfaces of the first gate separation structures.

3. The semiconductor device of claim 2, wherein a first height of the first channel separation structure is different from a second height of the first gate separation structures, and the first and second heights measured in the third direction with respect to a bottom surface of the semiconductor device.

4. The semiconductor device of claim 1, further comprising:

first and second lower patterns extending in the first direction and spaced apart from each other in the second direction, wherein a part of the first channel separation structure is in the first lower pattern, a part of the second channel separation structure is in the second lower pattern, the first channel patterns are on the first lower pattern, and the second channel patterns are on the second lower pattern.

5. The semiconductor device of claim 4, further comprising:

lower insulating patterns between the first lower pattern and the first channel patterns in the third direction and in contact with an upper surface of the first lower pattern.

6. The semiconductor device of claim 4, wherein the respective first gate insulating films are in contact with upper surfaces of the first and second lower patterns.

7. The semiconductor device of claim 1, wherein the first gate separation structures are in contact with the respective first gate electrodes.

8. The semiconductor device of claim 1, wherein the first gate separation structures are in contact with the respective first gate insulating films.

9. The semiconductor device of claim 1, further comprising:

second and third gate structures between two of the plurality of first gate structures, which are adjacent to each other in the first direction, the second and third gate structures being spaced apart from each other in the second direction, wherein the second and third gate structures include respective second gate electrodes and respective second gate insulating films, and the first gate separation structures separate the second and third gate structures in the second direction.

10. The semiconductor device of claim 1, further comprising:

second and third gate structures between the plurality of first gate structures, which are adjacent to each other in the first direction, the second and third gate structures being spaced apart from each other in the second direction; and a second gate separation structure between the second and third gate structures, wherein the second and third gate structures include respective second gate electrodes and respective second gate insulating films, and the second gate separation structure is in contact with the first gate separation structures and the second and third gate structures.

11. The semiconductor device of claim 10, wherein a first width of the first gate separation structures in the second direction is different from a second width of the second gate separation structure in the second direction.

12. The semiconductor device of claim 1, further comprising:

sacrificial semiconductor patterns and sacrificial pattern capping films, wherein each of the sacrificial semiconductor patterns overlaps a respective one of the first source/drain patterns in the third direction, and the sacrificial pattern capping films are between the sacrificial semiconductor patterns and the first source/drain patterns.

13. A semiconductor device, comprising:

a first channel separation structure extending in a first direction;

a second channel separation structure spaced apart from the first channel separation structure in a second direction intersecting the first direction and extending in the first direction;

a plurality of first gate structures spaced apart from each other in the first direction between the first and second channel separation structures, the plurality of first gate structures being in contact with the first and second channel separation structures and including respective first gate electrodes and respective first gate insulating films;

gate capping patterns on the respective first gate electrodes and in contact with the first and second channel separation structures;

gate spacers on sidewalls of the plurality of first gate structures, respectively;

first channel patterns including a respective plurality of first sheet patterns, which are spaced apart from each other in a third direction, perpendicular to the first and second directions, and are in contact with the first channel separation structure;

second channel patterns including a respective plurality of second sheet patterns, which are spaced apart from each other in the third direction and are in contact with the second channel separation structure;

first source/drain patterns between the first and second channel separation structures and respectively in contact with the first channel patterns;

second source/drain patterns between the first and second channel separation structures and respectively in contact with the second channel patterns; and first gate separation structures between the first source/drain patterns and the second source/drain patterns, wherein an upper surface of the first channel separation structure is coplanar with upper surfaces of the first gate separation structures, and an upper surface of the first channel separation structure is coplanar with upper surfaces of the gate capping patterns.

14. The semiconductor device of claim 13, wherein the first gate separation structures are respectively in contact with the plurality of first gate structures.

15. The semiconductor device of claim 13, wherein a first height of the first channel separation structure, relative to a bottom surface of the semiconductor device, is different from a second height of the first gate separation structures, relative to the bottom surface of the semiconductor device.

16. The semiconductor device of claim 13, wherein the first source/drain patterns are respectively in contact with the first channel separation structure, and the second source/drain patterns are respectively in contact with the second channel separation structure.

17. The semiconductor device of claim 13, further comprising:

second and third gate structures between two of the plurality of first gate structures, which are adjacent to each other in the first direction, the second and third gate structures being spaced apart from each other in the second direction, wherein the first gate separation structures are in contact with the second and third gate structures.

18. The semiconductor device of claim 13, further comprising:

second and third gate structures between the plurality of first gate structures, which are adjacent to each other in the first direction, the second and third gate structures being spaced apart from each other in the second direction; and a second gate separation structure between the second and third gate structures in the second direction, wherein the second gate separation structure is in contact with the first gate separation structures and the second and third gate structures.

19. A semiconductor device, comprising:

a first lower pattern extending in a first direction;

a second lower pattern extending in the first direction and spaced apart from the first lower pattern in a second direction intersecting the first direction;

a field insulating film between the first and second lower patterns;

a first channel separation structure on the first lower pattern and extending in the first direction, a part of the first channel separation structure being in the first lower pattern;

a second channel separation structure on the second lower pattern and extending in the first direction, a part of the second channel separation structure being in the second lower pattern;

a plurality of gate structures spaced apart from each other in the first direction between the first and second channel separation structures and in contact with the first and second channel separation structures, the plurality of gate structures including respective gate electrodes and respective gate insulating films;

first channel patterns between the first channel separation structure and the plurality of gate structures and including a respective plurality of first sheet patterns, which are spaced apart from each other in a third direction, perpendicular to the first and second directions, and are in contact with the first channel separation structure;

second channel patterns between the second channel separation structure and the plurality of gate structures and including a respective plurality of second sheet patterns, which are spaced apart from each other in the third direction and are in contact with the second channel separation structure;

first source/drain patterns between the first and second channel separation structures and respectively in contact with the first channel patterns;

second source/drain patterns between the first and second channel separation structures and respectively in contact with the second channel patterns; and gate separation structures between the first source/drain patterns and the second source/drain patterns that face the first source/drain patterns in the second direction, the gate separation structures being in contact with the field insulating film.

20. The semiconductor device of claim 19, wherein the field insulating film has an upper surface, which is in contact with the plurality of gate structures, and a bottom surface, which is opposite to the upper surface in the third direction, and the upper surface of the field insulating film is higher, in the third direction, than a lowermost part of the first channel separation structure with respect to the bottom surface of the field insulating film.

* * * * *